(12) United States Patent
Kim et al.

(10) Patent No.: US 12,048,221 B2
(45) Date of Patent: Jul. 23, 2024

(54) DISPLAY DEVICE AND MANUFACTURING METHOD THEREOF

(71) Applicant: Samsung Display Co., LTD., Yongin-si (KR)

(72) Inventors: Young Gu Kim, Yongin-si (KR); Chang Hee Lee, Yongin-si (KR); Yun Hee Park, Yongin-si (KR); Ji Yun Park, Yongin-si (KR); Bong Sung Seo, Yongin-si (KR); Baek Kyun Jeon, Yongin-si (KR); Kyung Seon Tak, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 391 days.

(21) Appl. No.: 17/567,368

(22) Filed: Jan. 3, 2022

(65) Prior Publication Data

US 2022/0375996 A1 Nov. 24, 2022

(30) Foreign Application Priority Data

May 18, 2021 (KR) .......................... 10-2021-0064382

(51) Int. Cl.
*H10K 59/38* (2023.01)
*H10K 50/858* (2023.01)
(Continued)

(52) U.S. Cl.
CPC ........... *H10K 59/38* (2023.02); *H10K 50/858* (2023.02); *H10K 59/121* (2023.02);
(Continued)

(58) Field of Classification Search
CPC .... H10K 59/38; H10K 50/858; H10K 59/121; H10K 59/122; H10K 50/865;
(Continued)

(56) References Cited

U.S. PATENT DOCUMENTS 8,405,063 B2 3/2013 Kazlas et al.
10,923,538 B2 2/2021 Lee et al.
(Continued)

FOREIGN PATENT DOCUMENTS

KR 10-2020-0003209 1/2020
KR 10-2020-0121430 10/2020

*Primary Examiner* — Bac H Au
(74) *Attorney, Agent, or Firm* — KILE PARK REED & HOUTTEMAN PLLC

(57) ABSTRACT

A display device may include a substrate including a display area and a non-display area; and a plurality of pixels disposed in the display area, the plurality of pixels each including an emission area and a non-emission area. Each of the plurality of pixels may include at least one light emitting element in the emission area; a first pixel electrode and a second pixel electrode electrically connected to the at least one light emitting element; a bank including a first opening corresponding to the emission area; a color conversion layer disposed in the emission area to correspond to the at least one light emitting element; a barrier layer disposed on the bank and the color conversion layer; and a low refractive layer disposed on the barrier layer. The barrier layer may include silicon oxide ($SiO_x$) having cured polysilazane.

20 Claims, 26 Drawing Sheets

(51) Int. Cl.
*H10K 59/121* (2023.01)
*H10K 59/122* (2023.01)
*H10K 71/00* (2023.01)
*H10K 59/12* (2023.01)

(52) U.S. Cl.
CPC ........... *H10K 59/122* (2023.02); *H10K 71/00* (2023.02); *H10K 59/1201* (2023.02)

(58) Field of Classification Search
CPC .. H10K 59/124; H10K 59/126; H10K 50/844; H01L 33/504; H01L 2933/0025; H01L 33/44; H01L 2933/005
See application file for complete search history.

(56) References Cited

U.S. PATENT DOCUMENTS

| | | | |
|---|---|---|---|
| 11,626,575 B2* | 4/2023 | Baek | H10K 50/844 257/40 |
| 2020/0407627 A1 | 12/2020 | Zhou et al. | |
| 2021/0011342 A1 | 1/2021 | Chen et al. | |
| 2023/0041748 A1* | 2/2023 | Tak | H01L 33/24 |
| 2023/0121816 A1* | 4/2023 | Kim | H01L 33/505 257/419 |
| 2023/0155077 A1* | 5/2023 | Park | H01L 25/167 257/318 |
| 2023/0187583 A1* | 6/2023 | Baek | H01L 27/156 257/79 |
| 2023/0255083 A1* | 8/2023 | Jeon | H10K 59/38 257/40 |
| 2023/0335575 A1* | 10/2023 | Lee | H01L 33/24 |

* cited by examiner

DISPLAY DEVICE AND MANUFACTURING METHOD THEREOF

CROSS-REFERENCE TO RELATED APPLICATION(S)

The application claims priority to and the benefit of Korean patent application 10-2021-0064382 under 35 U.S.C. § 119(a), filed on May 18, 2021, in the Korean Intellectual Property Office (KIPO), the entire contents of which are incorporated herein by reference.

BACKGROUND

1. Technical Field

The disclosure generally relates to a display device and a manufacturing method thereof.

2. Related Art

As interest in information displays and demand for portable information media increase, research and commercialization has focused on display devices.

SUMMARY

Embodiments provide a display device capable of improving display quality by improving the reliability of a color conversion layer, and a manufacturing method of the display device.

In accordance with an aspect of the disclosure, there is provided a display device including a substrate including a display area and a non-display area; and a plurality of pixels disposed in the display area, the plurality of pixels each including an emission area and a non-emission area, wherein each of the plurality of pixels may include at least one light emitting element located in the emission area; a first pixel electrode and a second pixel electrode located in at least the emission area, the first pixel electrode and the second pixel electrode being electrically connected to the light emitting element; a bank disposed in the non-emission area, the bank including a first opening corresponding to the emission area; a color conversion layer located above the at least one light emitting element, the color conversion layer being disposed in the emission area to correspond to the at least one light emitting element, the color conversion layer including color conversion particles; a barrier layer disposed on the bank and the color conversion layer; and a low refractive layer disposed on the barrier layer. The barrier layer may include silicon oxide ($SiO_x$) having cured polysilazane.

The barrier layer may be located directly on the color conversion layer in the emission area. The low refractive layer may be located directly on the barrier layer on the color conversion layer in the emission area. The color conversion layer, the barrier layer, and the low refractive layer may be sequentially disposed in the emission area.

The low refractive layer may be disposed on an entire side of the barrier layer in the emission area and the non-emission area.

The low refractive layer may be disposed on the barrier layer of the emission area to correspond to the color conversion layer.

The low refractive layer may compensate for a height difference between the bank and the color conversion layer.

Each of the plurality of pixels may further include a capping layer disposed on an entire side of the low refractive layer. The capping layer and the barrier layer may include a same material.

The capping layer may overlap the low refractive layer and may protect the low refractive layer.

Each of the plurality of pixels may further include a color filter disposed on the capping layer in the emission area to correspond to the color conversion layer.

Each of the barrier layer, the low refractive layer, and the capping layer may be a common layer disposed in the plurality of pixels.

Each of the plurality of pixels may further include a pixel circuit layer located between the substrate and the at least one light emitting element, the pixel circuit layer including at least one transistor and at least one power line, wherein the at least one transistor and the at least one power line are electrically connected to the at least one light emitting element; a first electrode disposed on the pixel circuit layer, the first electrode being electrically connected to the at least one transistor; a second electrode disposed on the pixel circuit layer and spaced from the first electrode, the second electrode being electrically connected to the at least one power line; and an insulating layer disposed on the first and second electrodes, the insulating layer including at least one opened portion.

The first electrode may be electrically connected to the first pixel electrode through an opened portion of the insulating layer, and the second electrode may be electrically connected to the second pixel electrode through another opened portion of the insulating layer.

The bank may include a second opening spaced from the first opening. At least one of the first and second electrodes may include an opened portion in the second opening.

The opened portion of the insulating layer and the another opened portion of the insulating layer may be located in the second opening.

In accordance with another aspect of the disclosure, there is provided a display device including a substrate including a display area and a non-display area; and a plurality of pixels disposed in the display area, the plurality of pixels each including an emission area and a non-emission area, wherein each of the plurality of pixels may include at least one light emitting element located in the emission area, a first pixel electrode and a second pixel electrode, located in at least the emission area, the first pixel electrode and the second pixel electrode being electrically connected to the at least one light emitting element; a bank disposed in the non-emission area, the bank including an opening corresponding to the emission area; a base layer located above the bank and the at least one light emitting element such that a surface of the base layer faces the substrate; a color filter disposed on the surface of the base layer to correspond to the emission area; a first light blocking pattern disposed on the surface of the base layer to correspond to the non-emission area; a low refractive layer provided entirely on the first light blocking pattern and the color filter; a capping layer disposed on the low refractive layer; a second light blocking pattern provided on the capping layer to correspond to the first light blocking pattern; a color conversion layer surrounded by the second light blocking pattern, the color conversion layer being provided on the capping layer to correspond to the at least one light emitting element; and a barrier layer disposed entirely on the color conversion layer and the second light blocking pattern, and wherein the barrier layer includes silicon oxide ($SiO_x$) having cured polysilazane.

The first and second light blocking patterns may correspond to the bank.

In accordance with still another aspect of the disclosure, there is provided a method of manufacturing a display device, the method including providing a substrate having at least one light emitting element disposed in an emission area and a bank including an opening corresponding to the emission area, the bank being disposed in a non-emission area; forming a color conversion layer including color conversion particles above the at least one light emitting element; forming a polysilazane layer on the color conversion layer and the bank; forming a barrier layer by curing the polysilazane layer; forming a low refractive layer on the barrier layer; and forming a capping layer on the low refractive layer.

The color conversion layer, the barrier layer, and the low refractive layer may be formed by continuous inkjet printing.

The barrier layer may include silicon oxide ($SiO_x$).

The method may further include forming a color filter on the capping layer to correspond to the color conversion layer.

The curing of the polysilazane layer may be performed by heat-curing.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
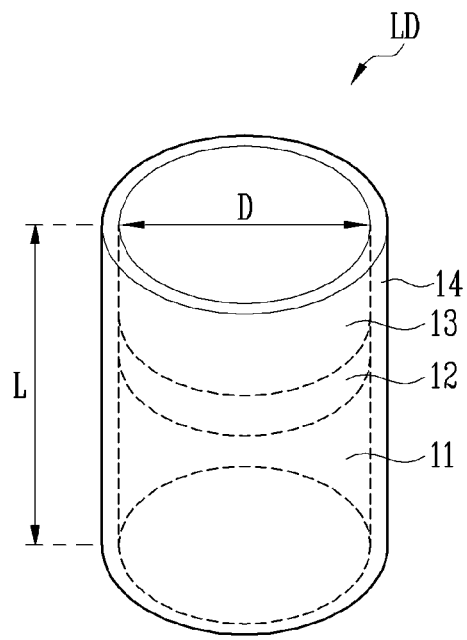
FIGS. 1 and 2 are perspective views schematically illustrating a light emitting element in accordance with an embodiment of the disclosure.

The disclosure may apply various changes and different shape, therefore only illustrate in detail with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first," "second," and the like may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. Also, in this specification, the term "connection" or "coupling" may inclusively mean connection or physical and/or electrical coupling.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure and items required for those skilled in the art to easily understand the content of the disclosure will be described in detail with reference to the accompanying drawings. In the following description, singular forms in the disclosure are intended to include the plural meanings as well, unless the context clearly indicates otherwise.

Figure 2:
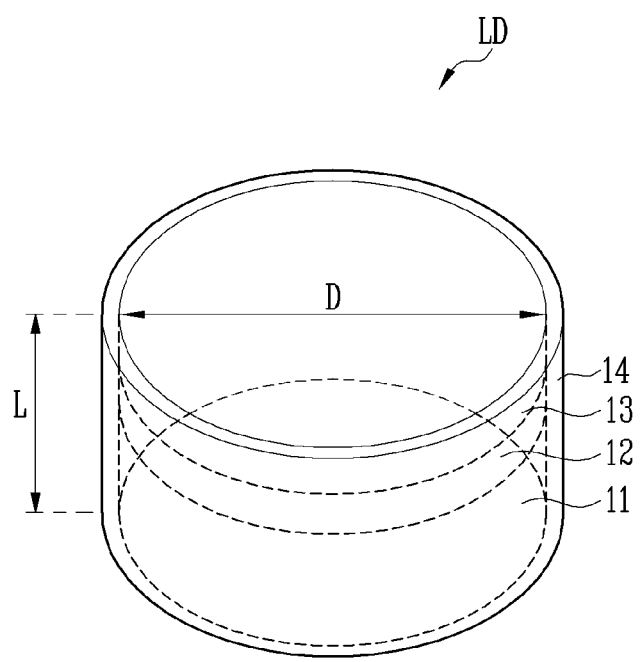
Figure 3:
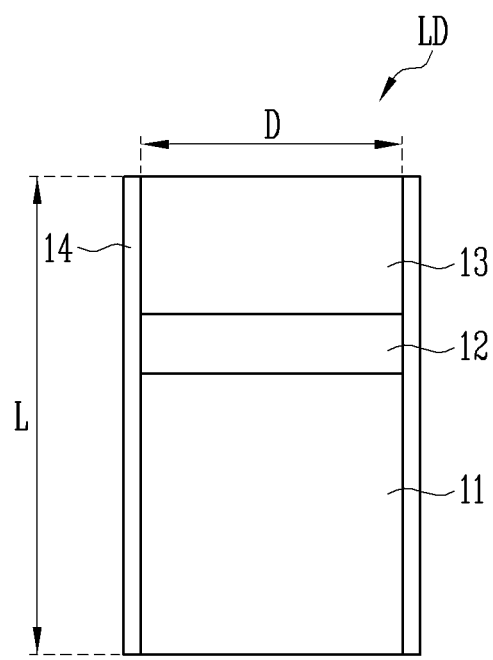
FIG. 3 is a schematic cross-sectional view of the light emitting element shown in FIG. 1.

FIGS. 1 and 2 are perspective views schematically illustrating a light emitting element LD in accordance with an embodiment. FIG. 3 is a schematic cross-sectional view of the light emitting element LD shown in FIG. 1.

In an embodiment, the kind (or type) and/or shape of the light emitting element LD is not limited to the embodiment shown in FIGS. 1 to 3.

Referring to FIGS. 1 to 3, the light emitting element LD may include a first semiconductor layer 11, a second semiconductor layer 13, and an active layer 12 interposed (or disposed) between the first and second semiconductor layers 11 and 13. In an example, the light emitting element LD may be implemented with (or implemented as) a light emitting stack structure (or a light emitting stack pattern) in which the first semiconductor layer 11, the active layer 12, and the second semiconductor layer 13 are sequentially stacked.

The light emitting element LD may extend in a direction. When assuming that an extending direction of the light emitting element LD is a length direction, the light emitting element LD may include one end portion (or lower end portion or first end portion) and the other end portion (or upper end portion or second end) in the length direction. One of the first and second semiconductor layers 11 and 13 may be disposed at the one end portion of the light emitting element LD, and the other of the first and second semiconductor layers 11 and 13 may be disposed at the other end portion of the light emitting element LD. In an example, the first semiconductor layer 11 may be disposed at the one end portion of the light emitting element LD, and the second semiconductor layer 13 may be disposed at the other end portion of the light emitting element LD.

The light emitting element LD may be provided in various shapes. In an example, the light emitting element LD may have a rod-like shape, a bar-like shape, a pillar-like shape (or cylinder-like shape), or the like, which is long in its length direction (or extending direction) (i.e., its aspect ratio is greater than 1) as shown in FIG. 1. In an embodiment, a length L of the light emitting element LD in the length direction may be larger than a diameter D (or a width of a cross-section) of the light emitting element LD. However, the disclosure is not limited thereto. In some embodiments, the light emitting element LD may have a rod-like shape, a bar-like shape, a pillar-like shape, or the like, which is short in its length direction (i.e., its aspect ratio is smaller than 1) as shown in FIG. 2. In some embodiments, the light emitting element LD may have a rod-like shape, a bar-like shape, a pillar-like shape, or the like, of which a length L and a diameter D are the same.

The light emitting element LD may include, for example, a light emitting diode (LED) manufactured small enough to have a diameter D and/or a length L to a degree of nanometer scale to micrometer scale.

In case that the light emitting element LD is long in its length direction (i.e., its aspect ratio is greater than 1), the diameter D of the light emitting element LD may be about 0.5 μm to about 6 μm, and the length L of the light emitting element LD may be about 1 μm to about 10 μm. However, the diameter D and length L of the light emitting element LD are not limited thereto, and the size of the light emitting element LD may be changed according to requirement conditions (or design conditions) of a lighting device or a self-luminous display device, to which the light emitting element LD is applied.

The first semiconductor layer 11 may include, for example, at least one n-type semiconductor layer. For example, the first semiconductor layer 11 may include any semiconductor material among InAlGaN, GaN, AlGaN, InGaN, AlN, and InN, and include an n-type semiconductor layer doped with a first conductive dopant (or n-type dopant) such as Si, Ge, or Sn. However, the material forming (or constituting) the first semiconductor layer 11 is not limited thereto. The first semiconductor layer 11 may be configured with various materials. The first semiconductor layer 11 may include an upper surface contacting (or in contact with) the active layer 12 and a lower surface exposed to the outside in the length direction of the light emitting element LD. The lower surface of the first semiconductor layer 11 may be the one end portion (or lower end portion) of the light emitting element LD.

The active layer 12 is formed on the first semiconductor layer 11 and may be formed in a single or multiple quantum well structure. In an example, in case that the active layer 12 is formed in the multiple quantum well structure, a barrier layer (not shown), a strain reinforcing layer, and a well layer, which constitute a unit, may be periodically and repeatedly stacked in the active layer 12. The strain reinforcing layer may have a lattice constant smaller than that of the barrier layer to further reinforce strain, e.g., compressive strain applied to the well layer. However, the structure of the active layer 12 is not limited to the above-described embodiment.

The active layer 12 may emit light having a wavelength of about 400 nm to about 900 nm and use a double heterostructure. In an embodiment, a clad layer (not shown) doped with a conductive dopant may be formed on the top and/or bottom of the active layer 12 in the length direction of the light emitting element LD. In an example, the clad layer may be formed as an AlGaN layer or InAlGaN layer. In some embodiments, a material such as AlGaN or AlInGaN may be used to form the active layer 12. The active layer 12 may be configured with various materials. The active layer 12 may include a first surface contacting the first semiconductor layer 11 and a second surface contacting the second semiconductor layer 13.

In case that an electric field having a predetermined voltage or more is applied to both end portions of the light emitting element LD, the light emitting element LD emits light as electron-hole pairs are combined in the active layer 12. The light emission of the light emitting element LD is controlled by using such a principle, so that the light emitting element LD may be used as a light source (or light emitting source) for various light emitting devices, including a pixel of a display device.

The second semiconductor layer 13 is formed on the second surface of the active layer 12 and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN and include a p-type semiconductor layer doped with a second conductive dopant (or p-type dopant) such as Mg, Zn, Ca, Sr, or Ba. However, the material forming the second semiconductor layer 13 is not limited thereto. The second semiconductor layer 13 may be configured with various materials. The second semiconductor layer 13 may include a lower surface contacting the second surface of the active layer 12 and an upper surface exposed to the outside in the length direction of the light emitting element LD. The upper surface of the second semiconductor layer 13 may be the second end portion (or upper end portion) of the light emitting element LD.

In an embodiment, the first semiconductor layer 11 and the second semiconductor layer 13 may have different thicknesses in the length direction of the light emitting element LD. In an example, the first semiconductor layer 11 may have a thickness relatively thicker or greater than that of the second semiconductor layer 13 in the length direction of the light emitting element LD. Accordingly, the active layer 12 of the light emitting element LD may be located more adjacent to the upper surface of the second semiconductor layer 13 than the lower surface of the first semiconductor layer 11.

Although FIGS. 1 to 3 illustrate that each of the first semiconductor layer 11 and the second semiconductor layer 13 is configured with a layer, the disclosure is not limited thereto. In an embodiment, each of the first semiconductor layer 11 and the second semiconductor layer 13 may further include at least one layer, e.g., a clad layer and/or a tensile strain barrier reducing (TSBR) layer according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GaInP, p-AlInP, or p-AlGaInP, but the disclosure is not limited thereto.

In some embodiments, the light emitting element LD may further include a contact electrode (not shown) (hereinafter referred to as a "first contact electrode") disposed on the top of the second semiconductor layer 13, in addition to the first semiconductor layer 11, the active layer 12, and the second semiconductor layer 13, which are described above. In some embodiments, the light emitting element LD may further include another contact electrode (not shown) (hereinafter referred to as a "second contact electrode") disposed at one end of the first semiconductor layer 11.

Each of the first and second contact electrodes may be an ohmic contact electrode, but the disclosure is not limited thereto. In some embodiments, each of the first and second contact electrodes may be a Schottky contact electrode. The first and second contact electrodes may include a conductive material. For example, the first and second contact electrodes may include an opaque metal using, one or mixture of chromium (Cr), titanium (Ti), aluminum (Al), gold (Au), nickel (Ni), and an oxide or alloy thereof, but the disclosure is not limited thereto. In some embodiments, the first and second contact electrodes may include a transparent conductive oxide such as indium tin oxide (ITO), indium zinc oxide (IZO), zinc oxide (ZnO), indium gallium zinc oxide (IGZO), or indium tin zinc oxide (ITZO).

Materials respectively included in the first and second contact electrodes may be identical to or different from each other. The first and second contact electrodes may be substantially transparent or translucent. Accordingly, light generated from the light emitting element LD may be emitted to the outside of the light emitting element LD by passing through the first and second contact electrodes. In some embodiments, in case that light generated from the light emitting element LD does not pass through the first and second contact electrodes and is emitted to the outside of the light emitting element LD through an area except both the end portions of the light emitting element LD, the first and second contact electrodes may include an opaque metal.

In an embodiment, the light emitting element LD may further include an insulating film 14 (or insulating film). However, in some embodiments, the insulating film 14 may be omitted and may also be provided to cover only portions of the first semiconductor layer 11, the active layer 12, and the second semiconductor layer 13.

The insulating film 14 may prevent an electrical short circuit which may occur in case that the active layer 12 contacts a conductive material in addition to the first semiconductor layer 11 and the second semiconductor layer 13. The insulating film 14 minimizes a surface defect of the light emitting element LD, thereby improving the lifespan and light emission efficiency of the light emitting element LD. In case that light emitting elements LD are densely disposed, the insulating film 14 may prevent an unwanted short circuit which may occur between the light emitting elements LD. Whether the insulating film 14 is provided is not limited as long as the active layer 12 may be prevented from being short-circuited with an external conductive material.

The insulating film 14 may be provided in a shape entirely surround the outer circumference of a light emitting stack structure including the first semiconductor layer 11, the active layer 12, and the second semiconductor layer 13.

Although a case where the insulating film 14 is provided in a shape entirely surrounding the outer circumference of each of the first semiconductor layer 11, the active layer 12, and the second semiconductor layer 13 in the above-described embodiment, the disclosure is not limited thereto. In some embodiments, in case that the light emitting element LD includes the first contact electrode, the insulating film 14 may entirely surround the outer circumference of each of the first semiconductor layer 11, the active layer 12, the second semiconductor layer 13, and the first contact electrode. In some embodiments, the insulating film 14 may not entirely surround the outer circumference of the first contact electrode, or may surround only a portion of the outer circumference of the first contact electrode and may not surround the other of the outer circumference of the first contact electrode. In some embodiments, in case that the first contact electrode is disposed at the other end portion (e.g., upper end portion) of the light emitting element LD, and the second contact electrode is disposed at one end portion (e.g., lower end portion) of the light emitting element LD, the insulating film 14 may expose at least one area of each of the first and second contact electrodes.

The insulating film 14 may include a transparent insulating material. For example, the insulating film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium dioxide ($TiO_2$), hafnium oxide ($HfO_x$), titanium strontium oxide ($SrTiO_x$), cobalt oxide ($CoxO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($VxO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulating film 14.

The insulating film 14 may be provided in the form of a single layer or be provided in the form of a multi-layer including at least two layers. In an example, in case that the insulating film 14 is formed as a double layer including a first layer and a second layer, which are sequentially stacked, the first layer and the second layer may be made of (or include) different materials (or ingredients) and be formed by different processes. In some embodiments, the first layer and the second layers may be formed of the same material and may be formed by a continuous process.

In some embodiments, the light emitting element LD may be implemented with a light emitting pattern having a core-shell structure. The first semiconductor layer 11 may be located at a core, e.g., in the middle (or center) of the light emitting element LD, the active layer 12 may be provided and/or formed in a shape surrounding the outer circumference of the first semiconductor layer 11, and the second semiconductor layer 13 may be provided and/or formed in a shape surrounding the active layer 12. The light emitting element LD may further include a contact electrode (not shown) surrounding at least one side of the second semiconductor layer 13. In some embodiments, the light emitting element LD may further include an insulating film 14 which is provided on the outer circumference of the light emitting pattern having the core-shell structure and includes a transparent insulating material. The light emitting element LD implemented in the light emitting pattern having the core-shell structure may be manufactured by a growth process.

The above-described light emitting element LD may be used as a light emitting source (or light source) for various display devices. The light emitting element LD may be manufactured through a surface treatment process. For example, in case that light emitting elements LD are mixed in a liquid solution (or solvent) to be supplied to each pixel area (e.g., an emission area of each pixel or an emission area of each sub-pixel), each light emitting element LD may be surface-treated such that the light emitting elements LD are not unequally condensed in the solution but may be equally dispersed in the solution.

A light emitting unit (or light emitting part) (or light emitting device) including the above-described light emitting element LD may be used in various types of devices that require a light source, including a display device. In case that light emitting elements LD are disposed in an emission area of each pixel of a display panel, the light emitting elements LD may be used as a light source of the pixel. However, the application field of the light emitting element LD is not limited to the above-described example. For example, the light emitting element LD may be used for other types of devices that require a light source, such as a lighting device.

Figure 4:
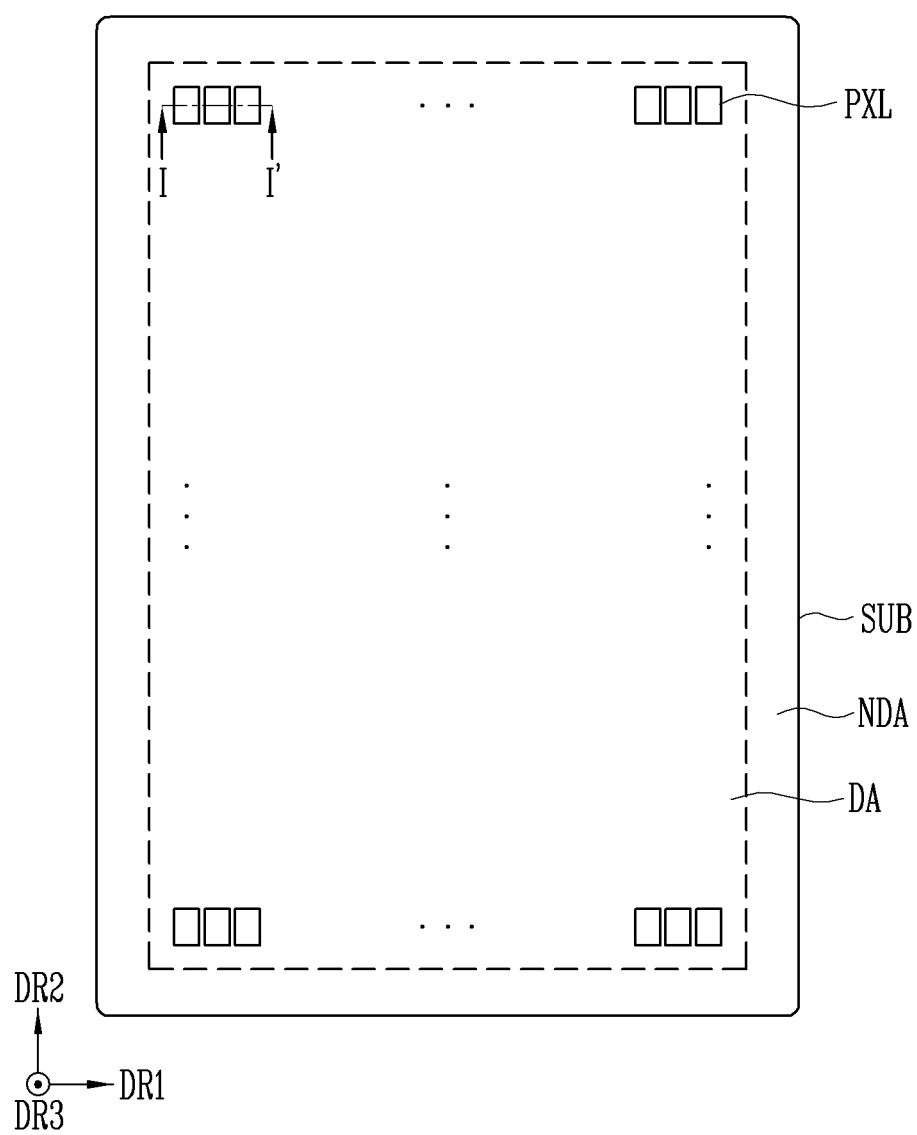
FIG. 4 is a plan view schematically illustrating a display device in accordance with an embodiment of the disclosure.

FIG. 4 is a plan view schematically illustrating a display device in accordance with an embodiment.

For convenience, FIG. 4 illustrates a structure of the display device based on a display area DA in which an image is displayed.

The disclosure may be applied as long as the display device is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

Referring to FIGS. 1 to 4, the display device may include a substrate SUB, pixels PXL which are provided on the substrate SUB and each include at least one light emitting element LD, a driving unit (or driving part) which is provided on the substrate SUB and drives the pixels PXL, and a line unit (or line part)_ which electrically connects the pixels PXL and the driving part.

The display device may be classified into a passive-matrix type display device and an active-matrix type display device according to a method of driving the light emitting element LD. In an example, in case that the display device is implemented as the active-matrix type display device, each of the pixels PXL may include a driving transistor for controlling an amount of current supplied to the light emitting element LD, a switching transistor for transferring a data signal to the driving transistor, and the like.

The display device may be provided in various shapes. In an example, the display device may be provided in a rectangular plate shape having two pairs of sides parallel to each other, but the disclosure is not limited thereto. In case that the display device is provided in the rectangular plate shape, any pair of sides among the two pairs of sides may be longer than the other pair of sides. For convenience, a case where the display device is provided in a rectangular shape having a pair of long sides and a pair of short sides is illustrated. An extending direction of the long sides is represented as a second direction DR2, an extending direction of the short sides is represented as a first direction DR1, and a direction perpendicular to the extending directions of the long sides and the short sides is represented as a third direction DR3. In the display device provided in the rectangular plate shape, a corner portion at which a long side and a short side contact (or meet) each other may have a round shape.

The substrate SUB may include the display area DA and a non-display area NDA.

The display area DA may be an area in which the pixels PXL for displaying an image are provided. The non-display area NDA may be an area in which the driving part for driving the pixels PXL and a portion of the line part which electrically connects the pixels PXL and the driving part are provided.

The non-display area DA may be located adjacent to the display area DA. The non-display area NDA may be provided at at least one side of the display area DA. For example, the non-display area NDA may surround the circumference (or edge) of the display area DA. The non-display area NDA may be provided with the line part electrically connected to the pixels PXL and the driving part which is electrically connected to the line part and drives the pixels PXL.

The line part may electrically connect the driving part and the pixels PXL. The line part may include a fan-out line which provides a signal to each pixel PXL and is electrically connected to signal lines, e.g., a scan line, a data line, an emission control line, and the like, which are electrically connected to each pixel PXL. In some embodiments, the line part may include a fan-out line electrically connected to signal lines, e.g., a control line, a sensing line, and the like, which are electrically connected to each pixel PXL so as to compensate for a change in an electrical characteristic of each pixel PXL in real time. Additionally, the line part may include a fan-output line which provides a predetermined voltage to each pixel PXL and is electrically connected to power lines electrically connected to each pixel PXL.

The substrate SUB may include a transparent insulating material to enable light to be transmitted therethrough. The substrate SUB may be a rigid substrate or a flexible substrate.

An area on the substrate SUB may be provided as the display area DA such that the pixels PXL are disposed therein, and the other area on the substrate SUB may be provided as the non-display area NDA. In an example, the substrate SUB may include the display area DA including pixel areas in which the respective pixels PXL are disposed, and the non-display area NDA disposed at the periphery of the display area DA (or adjacent to the display area DA).

Each of the pixels PXL may be provided in the display area DA on the substrate SUB. In an embodiment, the pixels PXL may be arranged in a stripe arrangement structure in the display area DA, but the disclosure is not limited thereto.

Each pixel PXL may include at least one light emitting element LD driven by a corresponding scan signal and a corresponding data signal. The light emitting element LD may have a size small to a degree of micrometer scale or nanometer scale and be electrically connected in parallel to light emitting elements disposed adjacent thereto. However, the disclosure is not limited thereto. The light emitting element LD may form a light source of each pixel PXL.

Each pixel PXL may include at least one light source, e.g., the light emitting element LD shown in FIGS. 1 to 3, which is driven by a signal (e.g., a scan signal, a data signal, and the like) and/or a power source (e.g., a first driving power source a second driving power source, and the like). However, in the embodiment of the disclosure, the kind of the light emitting element LD which may be used as the light source of the pixel PXL is not limited thereto. In an example, each pixel PXL may include a light emitting element configured as an organic light emitting diode. The organic light emitting diode may have a form in which an anode, a hole transport layer, an organic emitting layer, an electron transport layer, and a cathode are sequentially stacked, but the disclosure is not limited thereto.

The driving part provides a signal and a power source to each pixel PXL through the line part. Accordingly, the driving part may control the driving of the pixel PXL.

Figure 5:
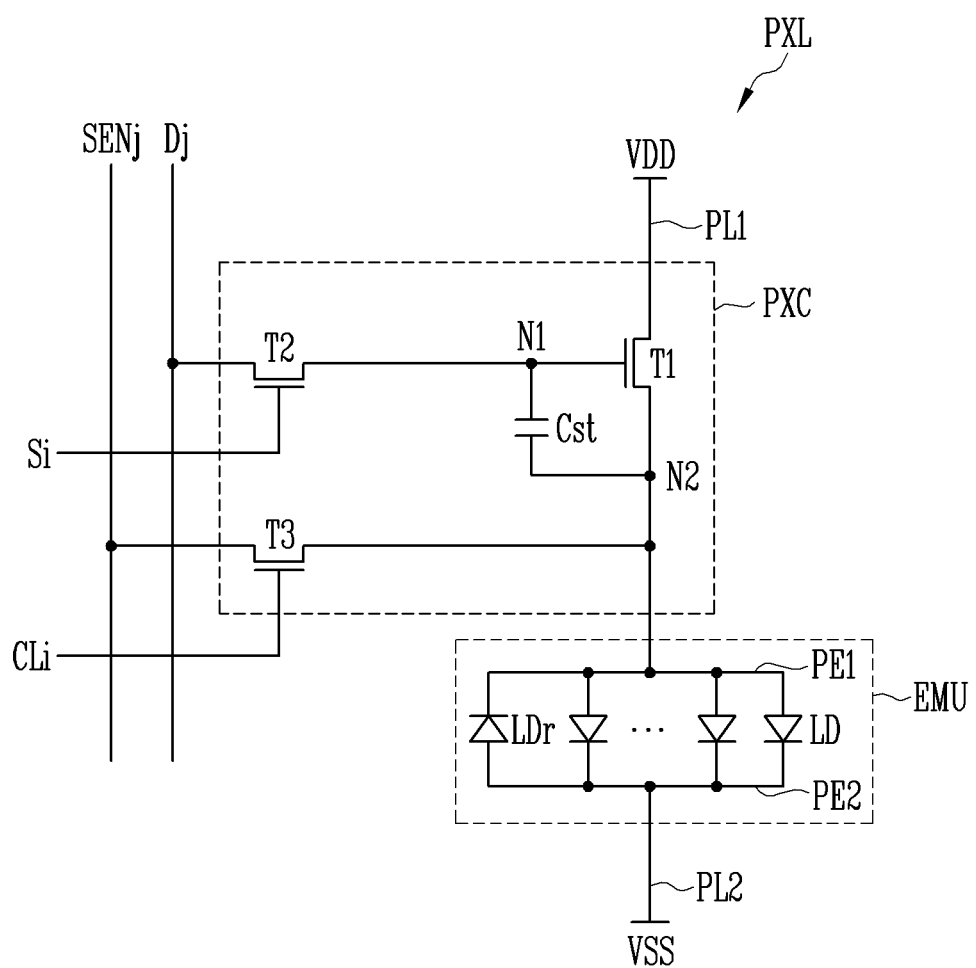
FIGS. 5 and 6 are schematic diagram of an equivalent circuit illustrating various embodiments of an electrical connection relationship between components included in a pixel shown in FIG. 4.
Figure 6:
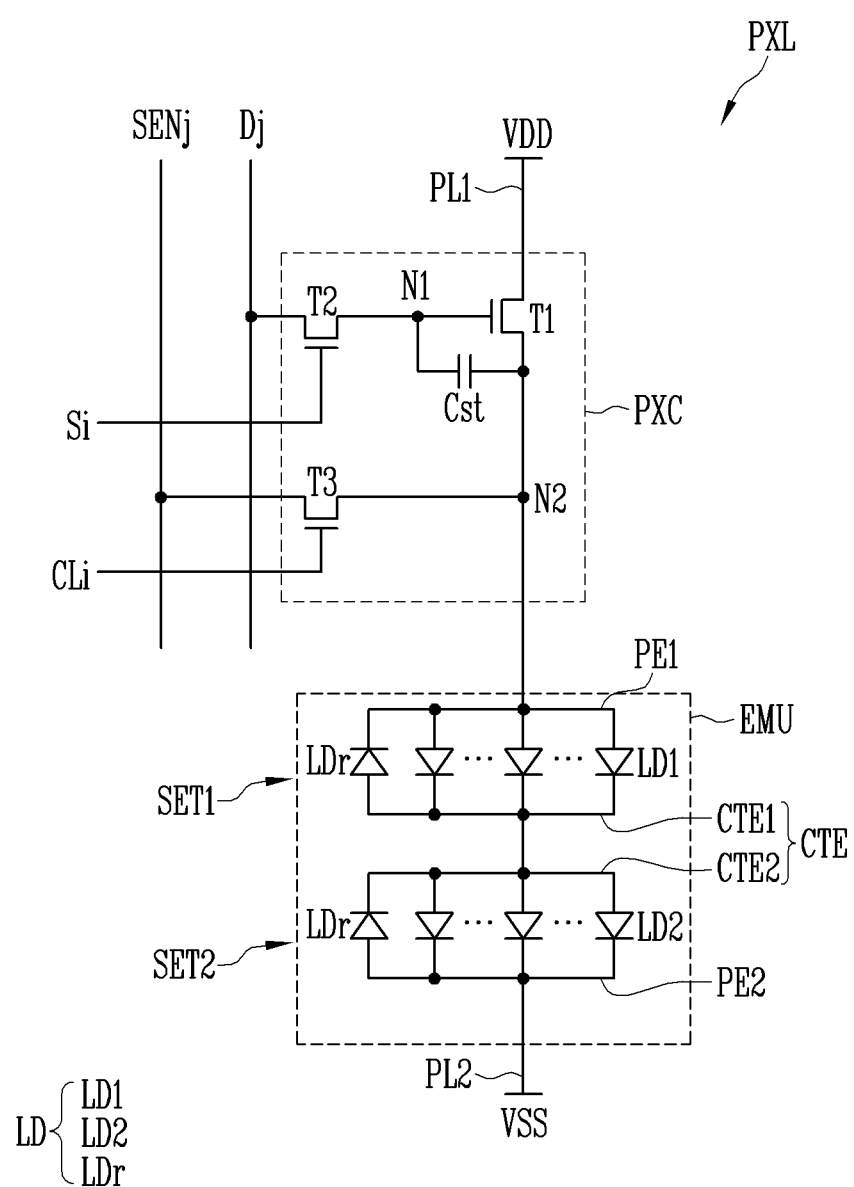

FIGS. 5 and 6 are schematic diagrams of equivalent circuits illustrating various embodiments of an electrical connection relationship between components included in the pixel PXL shown in FIG. 4.

For example, FIGS. 5 and 6 illustrate various embodiments of an electrical connection relationship between components included in the pixel PXL applicable to an active-matrix type display device. However, the kinds of the components included in the pixel PXL applicable to embodiments of the disclosure are not limited thereto.

In FIGS. 5 and 6, the pixel PXL comprehensively includes not only components included in the pixel PXL shown in FIG. 4 but also an area in which the components are provided (or located).

Referring to FIGS. 1 to 6, the pixel PXL may include a light emitting part EMU which generates light with a luminance corresponding to a data signal. The pixel PXL may selectively further include a pixel circuit PXC for driving the light emitting part EMU.

In some embodiments, the light emitting part EMU may include light emitting elements LD electrically connected in parallel between a first power line PL1 electrically connected to a first driving power source VDD to be applied with a voltage of the first driving power source VDD, and a second power line PL2 electrically connected to a second driving power source VSS to be applied with a voltage of the second driving power source VSS. For example, the light emitting part EMU may include a first pixel electrode PE1 electrically connected to the first driving power source VDD via the pixel circuit PXC and the first power line PL1, a second pixel electrode PE2 electrically connected to the second driving power source VSS through the second power line PL2, and light emitting elements LD electrically connected in parallel in the same direction between the first and second pixel electrodes PE1 and PE2. In an embodiment, the first pixel electrode PE1 may be an anode, and the second pixel electrode PE2 may be a cathode.

Each of the light emitting elements LD included in the light emitting part EMU may include one end portion (or first end portion) electrically connected to the first driving power source VDD through the first pixel electrode PE1 and the other end portion (or second end) electrically connected to the second driving power source VSS through the second pixel electrode PE2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set to be equal to or higher than a threshold voltage of the light emitting elements LD during an emission period of the pixel PXL.

As described above, the light emitting elements LD electrically connected in parallel in the same direction (e.g., a forward direction) between the first pixel electrode PE1 and the second pixel electrode PE2, to which voltages having difference potentials are supplied, may form effective light sources, respectively.

Each of the light emitting elements LD of the light emitting part EMU may emit light with a luminance corresponding to a driving current supplied through a corresponding pixel circuit PXC. For example, the pixel circuit PXC may supply, to the light emitting part EMU, a driving current corresponding to a grayscale value of corresponding frame data during each frame period. The driving current supplied to the light emitting part EMU may be divided and flow through each of the light emitting elements LD. Accordingly, the light emitting unit EMU may emit light with a luminance corresponding to the driving current while each light emitting element LD is emitting light with a luminance corresponding to a current flowing therethrough.

An embodiment in which both the end portions of the light emitting elements LD are electrically connected to each other in the same direction between the first and second driving power sources VDD and VSS has been described, but the disclosure is not limited thereto. In some embodiments, the light emitting part EMU may further include at least one ineffective light source, e.g., a reverse light emitting element LDr, in addition to the light emitting elements LD forming the respective effective light sources. The reverse light emitting element LDr is electrically connected in parallel together with the light emitting elements LD forming the effective light sources between the first and second pixel electrodes PE1 and PE2, and may be electrically connected between the first and second pixel electrodes PE1 and PE2 in a direction opposite to that in which the light emitting elements LD are connected. Although a predetermined driving voltage (e.g., a forward driving voltage) is applied between the first and second pixel electrodes PE1 and PE2, the reverse light emitting element LDr maintains an inactivated state, and accordingly, no current substantially flows through the reverse light emitting element LDr.

The pixel circuit PXC may be electrically connected to a scan line Si and a data line Dj of the pixel PXL. The pixel circuit PXC may be electrically connected to a control line CLi and a sensing line SENj of the pixel PXL. In an example, in case that the pixel PXL may be disposed on an i-th row and a j-th column of the display area DA, the pixel circuit PXC of the pixel PXL may be electrically connected to an i-th scan line Si, a j-th data line Dj, an i-th control line CLi, and a j-th sensing line SENj of the display area DA.

The pixel circuit PXC may include first to third transistors T1 to T3 and a storage capacitor Cst.

The first transistor T1 is a driving transistor for controlling a driving current applied to the light emitting part EMU, and may be electrically connected between the first driving power source VDD and the light emitting part EMU. A first terminal of the first transistor T1 may be electrically connected (or coupled) to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of driving current applied to the light emitting part EMU through the second node N2 from the first driving power source VDD according to a voltage applied to the first node N1. In an embodiment, the first terminal of the first transistor T1 may be a drain electrode, and the second terminal of the first transistor T1 may be a source electrode. However, the disclosure is not limited thereto. In some embodiments, the first terminal may be the source electrode, and the second terminal may be the drain electrode.

The second transistor T2 is a switching transistor which selects a pixel PXL in response to a scan signal and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 are different terminals. For example, in case that the first terminal is a drain electrode, the second terminal may be a source electrode.

In case that a scan having a gate-on voltage (e.g., a high-level voltage) is supplied from the scan line Si, the second transistor T2 may be turned on to electrically connect the data line Dj and the first node N1 to each other. The first node N1 is a point at which the second terminal of the second transistor T2 and the gate electrode of the first transistor T1 are electrically connected to each other, and the second transistor T2 may transfer a data signal to the gate electrode of the first transistor T1.

The third transistor T3 may electrically connect the first transistor T1 to the sensing line SENj to acquire a sensing signal through the sensing line SENj and may detect a characteristic of the pixel PXL, including a threshold voltage of the first transistor T1, or the like, by using the sensing signal. Information on the characteristic of the pixel PXL may be used to convert image data such that a characteristic deviation between pixels PXL may be compensated for. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. The first terminal of the third transistor T3 may be electrically connected to an initialization power source. The third transistor T3 is an initialization transistor capable of initializing the second node N2. In case that a sensing control signal is supplied from the control line CLi, the third transistor T3 may be turned on to transfer a voltage of the initialization power source to the second node N2. Accordingly, a second storage electrode of the storage capacitor Cst, which is electrically connected to the second node N2, may be initialized.

A first storage electrode of the storage capacitor Cst may be electrically connected to the first node N1, and the second storage electrode of the storage capacitor Cst may be electrically connected to the second node N2. The storage capacitor Cst charges a data voltage corresponding to the data signal supplied to the first node N1 during a frame period. Accordingly, the storage capacitor Cst may store a voltage corresponding to the difference between a voltage of the gate electrode of the first transistor T1 and a voltage of the second node N2.

Although an embodiment in which the light emitting elements LD constituting the light emitting part EMU are all electrically connected in parallel has been illustrated in FIG. 5, the disclosure is not limited thereto. In some embodiments, the light emitting part EMU may be configured to include at least one serial stage (or stage) including light emitting elements LD electrically connected in parallel to each other. For example, the light emitting part EMU may be configured in a series-parallel hybrid structure as shown in FIG. 6.

Referring to FIG. 6, the light emitting part EMU may include first and second serial stages SET1 and SET2 sequentially electrically connected between the first and second driving power sources VDD and VSS. Each of the first and second serial stages SET1 and SET2 may include two electrodes PE1 and CTE1 or CTE2 and PE2 constituting an electrode pair of the corresponding serial stage, and light emitting elements LD electrically connected in parallel in the same direction between the two electrodes PE1 and CTE1 or CTE2 and PE2.

The first serial stage SET1 (or first stage) includes the first pixel electrode PE1 and a first intermediate electrode CTE1, and may include at least one first light emitting element LD1 electrically connected between the first pixel electrode PE1 and the first intermediate electrode CTE1. The first serial stage SET1 may include a reverse light emitting element LDr electrically connected in a direction opposite to that in which the first light emitting element LD1 is connected between the first pixel electrode PE1 and the first intermediate electrode CTE1.

The second serial stage SET2 (or second stage) includes a second intermediate electrode CTE2 and the second pixel electrode PE2, and may include at least one second light emitting element LD2 electrically connected between the second intermediate electrode CTE2 and the second pixel electrode PE2. The second serial stage SET2 may include a reverse light emitting element LDr electrically connected in a direction opposite to that in which the second light emitting element LD2 is connected between the second intermediate electrode CTE2 and the second pixel electrode PE2.

The first intermediate electrode CTE1 and the second intermediate electrode CTE2 may be electrically and/or physically connected to each other. The first intermediate electrode CTE1 and the second intermediate electrode CTE2 may constitute an intermediate electrode CTE which electrically connects the first serial stage SET1 and the second serial stage SET2, which are consecutive.

In the above-described embodiment, the first pixel electrode PE1 of the first serial stage SET1 may be an anode of each pixel PXL, and the second pixel electrode PE2 of the second serial stage SET2 may be a cathode of the corresponding pixel PXL.

As described above, the light emitting part EMU of the pixel PXL, which includes the serial stages (or first and second serial stages) SET1 and SET2 (or the light emitting elements LD) electrically connected in the series-parallel hybrid structure, may easily control driving current/voltage conditions to be suitable for specifications of a product to which the light emitting part EMU is applied.

The light emitting part EMU of the pixel PXL, which includes the first and second serial stages SET1 and SET2 (or the light emitting elements LD) electrically connected in the series-parallel hybrid structure, may decrease a driving current, as compared with a light emitting part having a structure in which light emitting elements LD are electrically connected only in parallel. The light emitting part EMU of the pixel PXL, which includes the first and second serial stages SET1 and SET2 electrically connected in the series-parallel hybrid structure, may decrease a driving voltage applied to both ends of the light emitting part EMU, as compared with a light emitting part having a structure in which the same number of light emitting elements LD are electrically connected only in series. Further, the light emitting part EMU of the pixel PXL, which includes the first and second serial stages SET1 and SET2 (or the light emitting elements LD) electrically connected in the series-parallel hybrid structure, may include a larger number of light emitting elements LD between the same numbers of electrodes PE, CTE1, CTE2, and PE2, as compared with a light emitting part having a structure in which serial stages (or stages) are electrically connected in series. Thus, the light emission efficiency of the light emitting element LD may be improved, and the ratio of light emitting elements LD which do not emit light because of a failure may be relatively decreased even in case that the failure occurs in a specific serial stage (or stage). Accordingly, the deterioration of the light emission efficiency of light emitting elements LD may be reduced.

Although an embodiment in which the first to third transistors T1, T2, and T3 included in the pixel circuit PXC are N-type transistors is illustrated in FIGS. 5 and 6, the disclosure is not limited thereto. For example, at least one of the first to third transistors T1, T2, and T3 may be replaced with a P-type transistor. Although an embodiment in which the light emitting part EMU is electrically connected between the pixel circuit PXC and the second driving power source VSS is illustrated in FIGS. 5 and 6, the light emitting part EMU may be electrically connected between the first driving power source VDD and the pixel circuit PXC.

The structure of the pixel circuit PXC may be variously modified and embodied. In an example, the pixel circuit PXC may additionally further include at least one transistor element such as a transistor element for initializing the first node N1 and/or a transistor element for controlling an emission time of the light emitting elements LD, or other circuit elements such as a boosting capacitor for boosting the voltage of the first node N1.

The structure of a pixel PXL applicable to the disclosure is not limited to the embodiments shown in FIGS. 5 and 6, and the corresponding pixel PXL may have various structures. For example, each pixel PXL may be configured in a passive type light emitting display device, etc. In this case, the pixel circuit PXC may be omitted, and both end portions of the light emitting element LD included in the light emitting part EMU may be directly electrically connected to the scan line Si, the data line Dj, the first power line PL1 to which the first driving power source VDD is applied, the second power line PL2 to which the second driving power source VSS is applied, and/or a control line.

FIGS. 5 and 6 illustrate that the light emitting element LD forming the light source of the pixel PXL includes micro inorganic light emitting diodes which are small to a degree of micrometer scale or nanometer scale and are manufactured in a structure in which a nitride-based semiconductor is grown. However, the disclosure is not limited thereto. In some embodiments, the light emitting element LD of the pixel PXL may include an organic light emitting diode.

Figure 7:
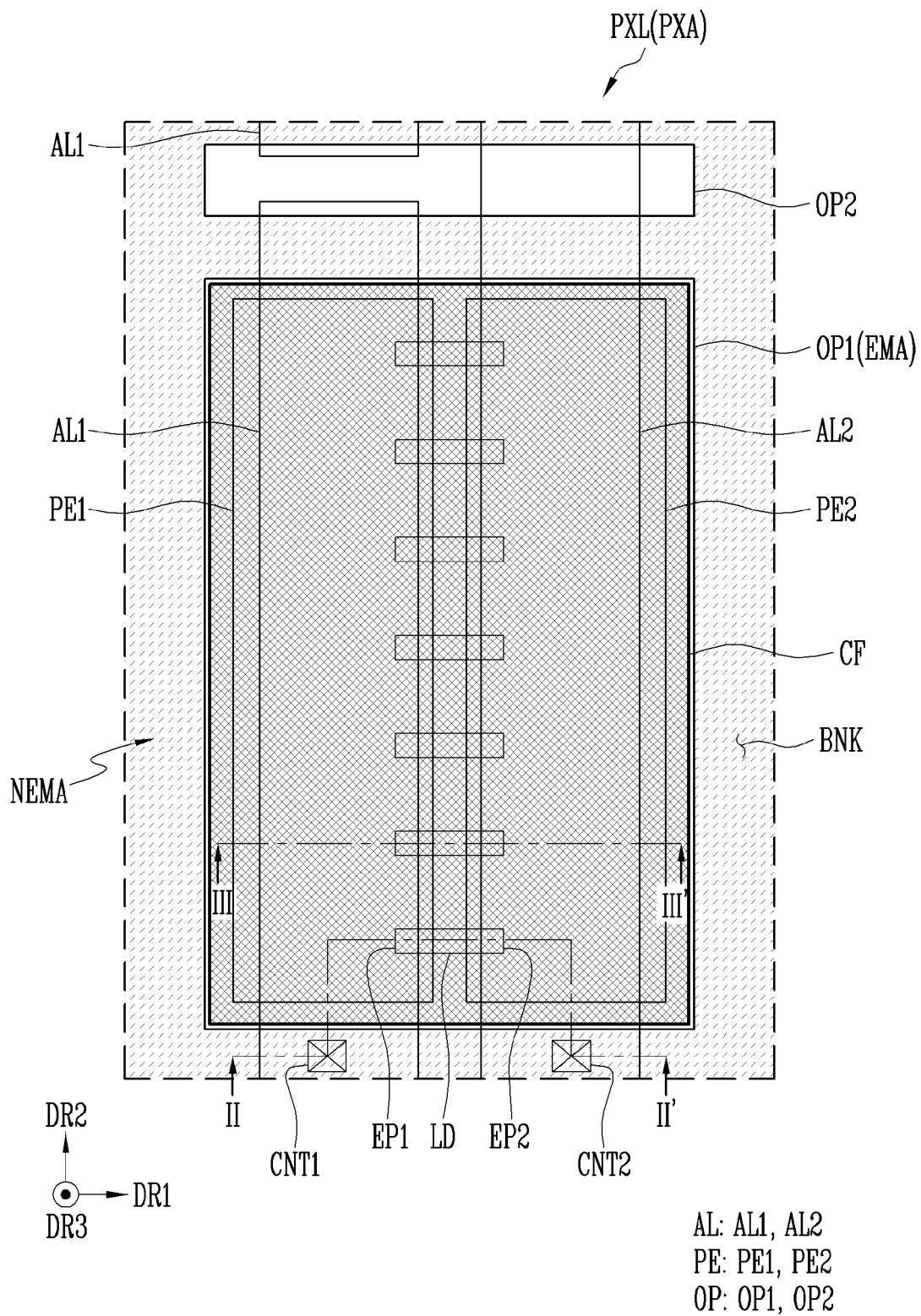
FIG. 7 is a plan view schematically illustrating the pixel shown in FIG. 4.

FIG. 7 is a plan view schematically illustrating the pixel PXL shown in FIG. 4.

In FIG. 7, illustration of transistors electrically connected to light emitting elements LD and signal lines electrically connected to the transistors will be omitted for convenience.

In an embodiment, for convenience of description, a lateral direction (or horizontal direction) on a plane (or in a plan view) is represented as a first direction DR1, a longitudinal direction (or vertical direction) on a plane is represented as a second direction DR2, and a thickness direction of a substrate SUB on a section (or a cross-sectional view) is represented as a third direction DR3. The first to third directions DR1, DR2, and DR3 may mean directions respectively indicated by the first to third directions DR1, DR2, and DR3.

Referring to FIGS. 4 to 7, the pixel PXL may be located in a pixel area PXA arranged (or provided) on the substrate SUB. The pixel area PXA may include an emission area EMA and a non-emission area NEMA.

The pixel PXL may include a bank BNK located in the non-emission period NEMA and a color filter CF located in the emission area EMA.

The bank BNK is structure which defines (or partitions) a pixel area PXA (or emission area EMA) of each of the pixel PXL and adjacent pixels PXL adjacent thereto, and may be, for example, a pixel defining layer.

In an embodiment, the bank BNK may be a pixel defining layer or a dam structure, which defines each emission area EMA to which light emitting elements LD are to be supplied, in a process of supplying (or inputting) the light emitting elements LD to the pixel PXL. In an example, the emission area EMA of the pixel PXL is partitioned by the bank BNK, so that a mixed liquor (e.g., ink) including a desired amount and/or a desired kind of light emitting elements LD may be supplied (or input) to the emission area EMA. The bank BNK may be a pixel defining layer which finally defines each emission area EMA to which a color conversion layer (not shown) is to be supplied, in a process of supplying the color conversion layer to the pixel PXL.

The bank BNK includes at least one light blocking material and/or at least one reflective material (or scattering material) to prevent a light leakage defect in which light (or beam) is leaked between the pixel PXL and pixels PXL adjacent thereto. In some embodiments, the bank BNK may include a transparent material (or substance). In an example, the transparent material may include polyamides resin, polyimides resin, etc., but the disclosure is not limited thereto. In an embodiment, a reflective material layer may be separately provided and/or formed on the bank BNK so as to further improve the efficiency of light emitted from the pixel PXL.

The bank BNK may include at least one opening OP exposing components located thereunder in the pixel area PXA. In an example, the bank BNK may include a first opening OP1 and a second OP2, which expose the components located under the bank BNK. In an embodiment, the emission area EMA of the pixel PXL and the first opening OP1 of the bank BNK may correspond to each other.

In the pixel area PXA, the second opening OP2 is located to be spaced from the first opening OP1 and may be located adjacent to a side, e.g., an upper side of the pixel area PXA. In an embodiment, the second opening OP2 may be an electrode separation area in which at least one alignment electrode AL (or electrode) is separated from at least one alignment electrode AL provided in pixels PXL adjacent to the pixel PXL in the second direction DR2.

The color filter CF may be located above light emitting elements LD to correspond to the emission area EMA of the pixel PXL. The color filter CF may allow light advancing toward the color filter CF to be selectively transmitted therethrough. The color filter CF may include a red color filter, a green color filter, or a blue color filter. In an example, in case that the pixel PXL shown in FIG. 7 is a red pixel, the color filter CF may include the red color filter. In case that the pixel PXL is a green pixel, the color filter CF may include the green color filter. In case that the pixel PXL is a blue pixel, the color filter CF may include the blue color filter. The color filter CF may be located in the emission area EMA of the pixel PXL, corresponding to the first opening OP1.

The pixel PXL may include pixel electrodes PE provided in at least the emission area EMA, light emitting elements LD electrically connected to the pixel electrodes PE, and alignment electrodes AL provided at positions corresponding to the pixel electrodes PE. In an example, the pixel PXL may include first and second pixel electrodes PE1 and PE2, light emitting elements LD, and first and second alignment electrodes AL1 and AL2. The number, shape, size, and arrangement structure of each of the pixel electrodes PE and/or the alignment electrodes AL may be variously changed according to the structure of the pixel PXL (particularly, the light emitting part EMU).

In an embodiment, the alignment electrodes AL, the light emitting elements LD, and the pixel electrodes PE may be sequentially provided with respect to a surface of the substrate SUB on which the pixel PXL is provided, but the disclosure is not limited thereto. In some embodiments, the positions and formation order of electrode patterns constituting the pixel PXL (or the light emitting part) may be variously changed. A stacking structure of the pixel PXL will be described below with reference to FIGS. 8 to 10.

The alignment electrodes AL may include the first alignment electrode AL1 (or first electrode) and the second alignment electrode AL2 (or second electrode), which are arranged to be spaced from each other in the first direction DR1.

At least one of the first and second alignment electrodes AL1 and AL2 may be separated from another electrode (e.g., an alignment electrode AL provided in each of adjacent pixels PXL adjacent to each other in the second direction DR2) in the second opening OP2 (or the electrode separation area) after the light emitting elements LD are supplied and aligned in the pixel area PXA in a manufacturing process of the display device. In an example, one end (or first end) of the first alignment electrode AL1 may be separated from a first alignment electrode AL1 of a pixel PXL located at an upper side of the corresponding pixel PXL in the second direction DR2 in the second opening OP2.

The first alignment electrode AL1 may be electrically connected to the first transistor T1 described with reference to FIGS. 5 and 6 through a first contact part CNT1, and the second alignment electrode AL2 may be electrically connected to the second driving power source VSS (or the second power line PL2) described with reference to FIGS. 5 and 6 through a second contact part CNT2.

The first contact part CNT1 may be formed by removing a portion of at least one insulating layer located between the first alignment electrode AL1 and the first transistor T1, and the second contact part CNT2 may be formed by removing a portion of at least one insulating layer located between the second alignment electrode AL2 and the second power line PL2. The first contact part CNT1 and the second contact part CNT2 may be located in the non-emission area NEMA to overlap the bank BNK. However, the disclosure is not limited thereto. In some embodiments, the first and second contact parts CNT1 and CNT2 may be located in the second opening OP2 as the electrode separation area or be located in the emission area EMA.

Each of the first alignment electrode AL1 and the second alignment electrode AL2 may receive a signal (or an alignment signal) transferred from an alignment pad (not shown) located in the non-display area NDA in a process of aligning the light emitting elements LD. For example, the first alignment electrode AL1 may receive a first alignment signal (or first alignment voltage) transferred from a first alignment pad, and the second alignment electrode AL2 may receive a second alignment signal (or second alignment voltage) transferred from a second alignment pad. The above-described first and second alignment signals may be signals having a voltage difference and/or a phase difference to a degree to which the light emitting elements LD may be aligned between the first and second alignment electrodes AL1 and AL2. At least one of the first and second alignment signals may be an AC signal, but the disclosure is not limited thereto.

Each alignment electrode AL may be provided in a bar-like shape having a constant width in the second direction DR2, but the disclosure is not limited thereto. In some embodiments, each alignment electrode AL may have or may not have a bending part in the non-emission area NEMA and/or the second opening OP2 as the electrode separation area. The shape and/or the size of each alignment electrode AL in the other area except the emission area EMA is not particularly limited, and may be variously changed.

At least two to a few tens of light emitting elements LD may be aligned and/or provided in the pixel area PXA, but the number of the light emitting elements LD is not limited thereto. In some embodiments, the number of light emitting elements LD aligned and/or provided in the emission area EMA (or the pixel area PXA) may be variously changed.

The light emitting elements LD may be disposed between the first alignment electrode AL1 and the second alignment electrode AL2. Each of the light emitting elements LD may be the light emitting element LD described with reference to FIGS. 1 and 3. Each of the light emitting elements LD may include a first end portion EP1 (or one end portion) and a second end portion EP2 (or the other end portion), which are located at both ends of the light emitting element LD in a length direction thereof. In an embodiment, the second semiconductor layer 13 including a p-type semiconductor layer may be located at the first end portion EP1, and the first semiconductor layer 11 including an n-type semiconductor layer may be located at the second end portion EP2. The light emitting elements LD may be electrically connected in parallel to each other between the first alignment electrode AL1 and the second alignment electrode AL2.

Each of the light emitting elements LD may emit any of colored light and/or white light. Each of the light emitting elements LD may be aligned between the first alignment electrode AL1 and the second alignment electrode AL2 such that the length direction thereof is parallel to the first direction DR1. In some embodiments, at least some of the light emitting elements may be aligned between the first alignment electrode AL1 and the second alignment electrode AL2 not to be completely parallel to the first direction DR1. In an example, some light emitting elements LD may be aligned between the first alignment electrode AL1 and the second alignment electrode AL2 to be inclined with respect to the first direction DR1. The light emitting elements LD may be provided in a form in which the light emitting elements LD are sprayed or dispersed in a solution, to be input (or supplied) to the pixel area PXA (or the emission area EMA).

The light emitting elements LD may be input (or supplied) to the pixel area PXA (or the emission area EMA) by an inkjet printing process, a slit coating process, or various processes. In an example, the light emitting elements LD may be mixed with a volatile solvent, to be input (or supplied) to the pixel area PXA by an inkjet printing process or a slit coating process. In case that a corresponding alignment signal is applied to each of the first alignment electrode AL1 and the second alignment electrode AL2, an electric field may be formed between the first alignment electrode AL1 and the second alignment electrode AL2. Therefore, the light emitting elements LD may be aligned between the first alignment electrode AL1 and the second alignment electrode AL2. After the light emitting elements LD are aligned, the solvent may be volatilized or be removed by another process, so that the light emitting elements LD may be stably aligned between the first alignment electrode AL1 and the second alignment electrode AL2.

The pixel electrodes PE may be provided in at least the emission area EMA, and each of the pixel electrodes PE may be provided at a position corresponding to at least one alignment electrode AL and at least one light emitting element LD. For example, each pixel electrode PE may be formed on each alignment electrode AL and corresponding light emitting elements LD to overlap the alignment electrode AL and the corresponding light emitting element LD. Therefore, the pixel electrode PE may be electrically connected to at least the light emitting elements LD.

The first pixel electrode PE1 may be formed on the first alignment electrode AL1 and the first end portion EP1 of each of the light emitting elements LD to be electrically connected to the first end portion EP1 of each of the light emitting elements LD. The first pixel electrode PE1 may be electrically and/or physically connected to the first alignment electrode AL1 exposed by removing a portion of at least one insulating layer located between the first pixel electrode PE1 and the first alignment electrode AL1 in at least the emission area EMA, while directly contacting the first alignment electrode AL1. Although it has been described that a connection point (or contact point) of the first pixel electrode PE1 and the first alignment electrode AL1 is located in the emission area EMA, the disclosure is not limited thereto. In some embodiments, the connection point (or contact point) of the first pixel electrode PE1 and the first alignment electrode AL1 may be located in the non-emission area NEMA, e.g., the second opening OP2 as the electrode separation area. An embodiment in which the connection point (or contact point) of the first pixel electrode PE1 and the first alignment electrode AL1 is located in the second opening OP2 will be described below with reference to FIGS. 15 to 17.

The first pixel electrode PE1 may have a bar-like shape extending in the second direction DR2, but the disclosure is not limited thereto. In some embodiments, the shape of the first pixel electrode PE1 may be variously changed within a range in which the first pixel electrode PE1 is electrically and/or physically stably connected to the first end portion EP1 of each of the light emitting elements LD. The shape of the first pixel electrode PE1 may be variously changed by considering a connection relationship between the first pixel electrode PE1 and the first alignment electrode AL1 disposed on the bottom thereof.

The second pixel electrode PE2 may be formed on the second alignment electrode AL2 and the second end portion EP2 of each of the light emitting elements LD to be electrically connected to the second end portion EP2 of each of the light emitting elements LD. The second pixel electrode PE2 may be electrically and/or physically connected to the second alignment electrode AL2 exposed by removing a portion of at least one insulating layer located between the second pixel electrode PE2 and the second alignment electrode AL2 in at least the light emitting area EMA, while contacting the second alignment electrode AL2. A connection point (or contact point) of the second pixel electrode PE2 and the second alignment electrode AL2 may be located in the emission area EMA or the non-emission area NEMA.

The second pixel electrode PE2 may have a bar-like shape extending in the second direction DR2, but the disclosure is not limited thereto. In some embodiments, the shape of the second pixel electrode PE2 may be variously changed within a range in which the second pixel electrode PE2 is electrically and/or physically stably connected to the second end portion EP2 of each of the light emitting elements LD. The shape of the second pixel electrode PE2 may be variously changed by considering a connection relationship between the second pixel electrode PE2 and the second alignment electrode AL2 disposed on the bottom thereof.

Hereinafter, a stacking structure of the pixel PXL in accordance with the above-described embodiment will be mainly described with reference to FIGS. 8 to 10.

Figure 8:
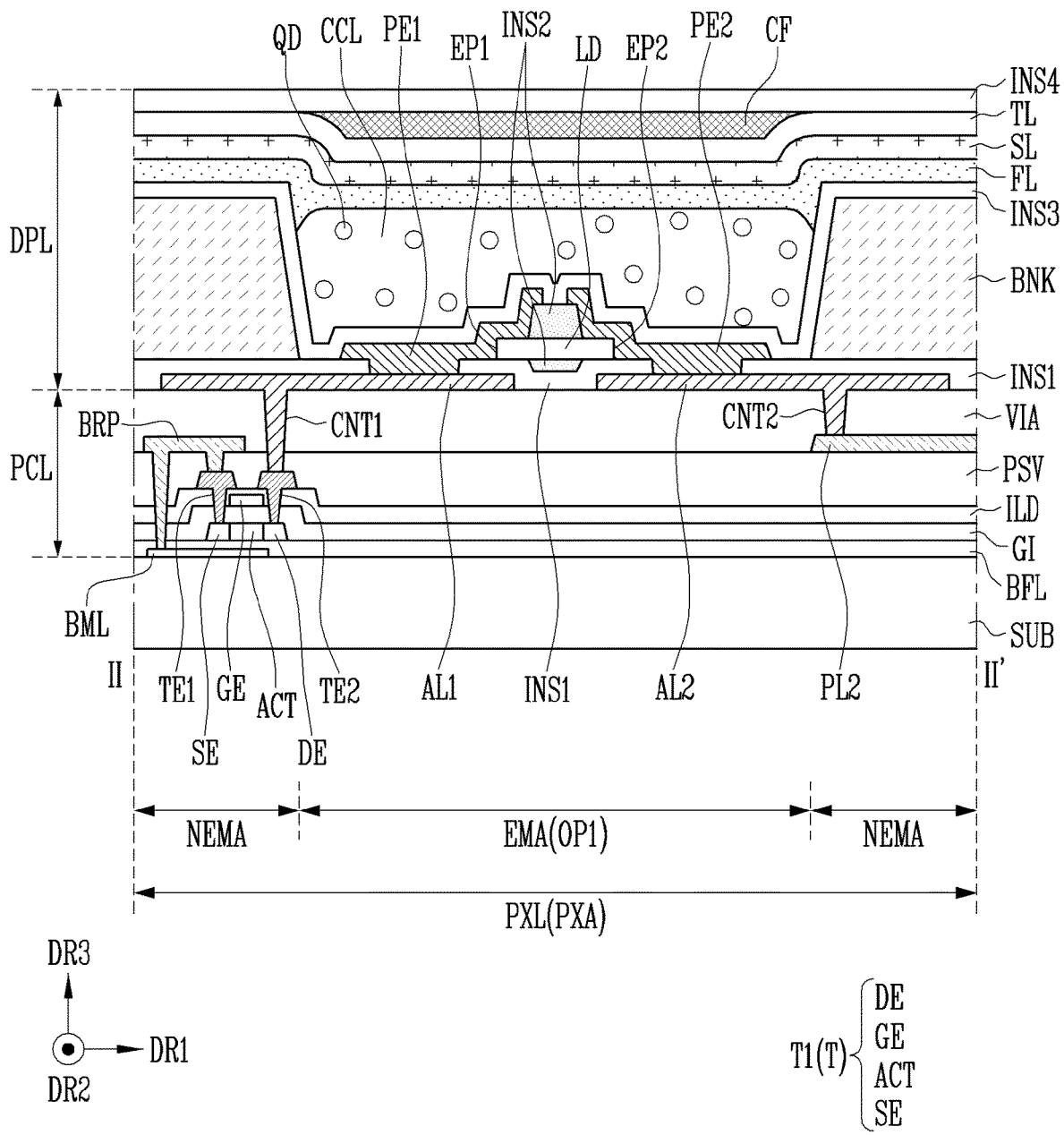
FIG. 8 is a schematic cross-sectional view taken along line II-II' shown in FIG. 7.

FIG. 8 is a schematic cross-sectional view taken along line II-II' shown in FIG. 7. FIG. 9 is a schematic cross-sectional view taken along line III-III' shown in FIG. 7. FIG. 10 illustrates another embodiment of a low refractive layer SL shown in FIG. 8, and is a schematic cross-sectional view corresponding to line II-II' shown in FIG. 7.

In an embodiment of the disclosure, the phrase "being formed and/or provided in the same layer" may mean being formed by the same process, and the phrase "being formed and/or provided in different layers" may mean being formed by different processes.

Figure 10:
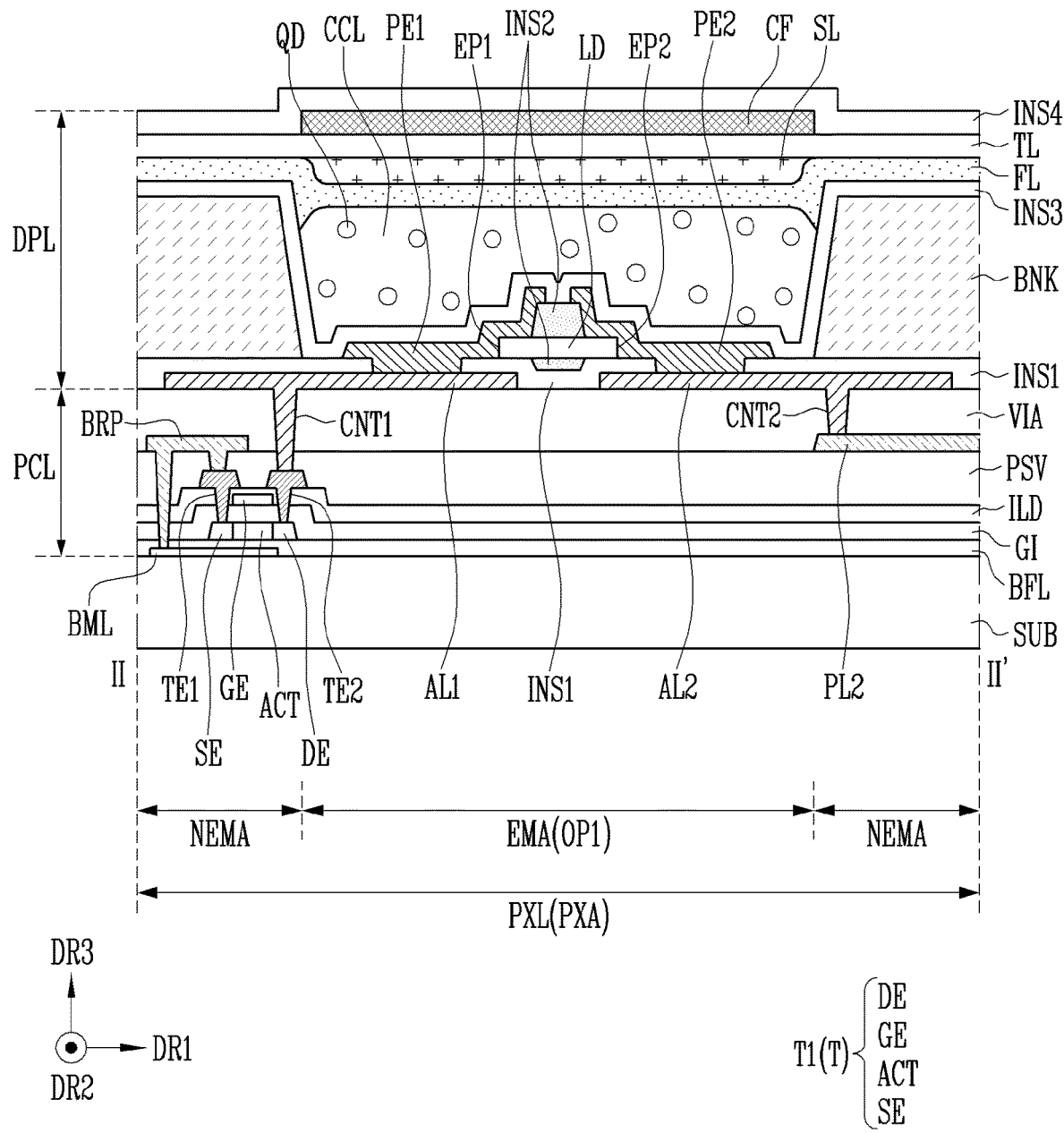
FIG. 10 schematically illustrates another embodiment of a low refractive layer shown in FIG. 8, and is a cross-sectional view corresponding to the line II-II' shown in FIG. 7.

Embodiments shown in FIGS. 8 and 10 represent different embodiments in relation to the arrangement of a low refractive layer SL. For example, an embodiment in which the low refractive layer SL is disposed entirely in the pixel area PXA is illustrated in FIG. 8, and an embodiment in which the low refractive layer SL is disposed only a portion of the pixel area PXA, e.g., the emission area EMA, is illustrated in FIG. 10.

Figure 9:
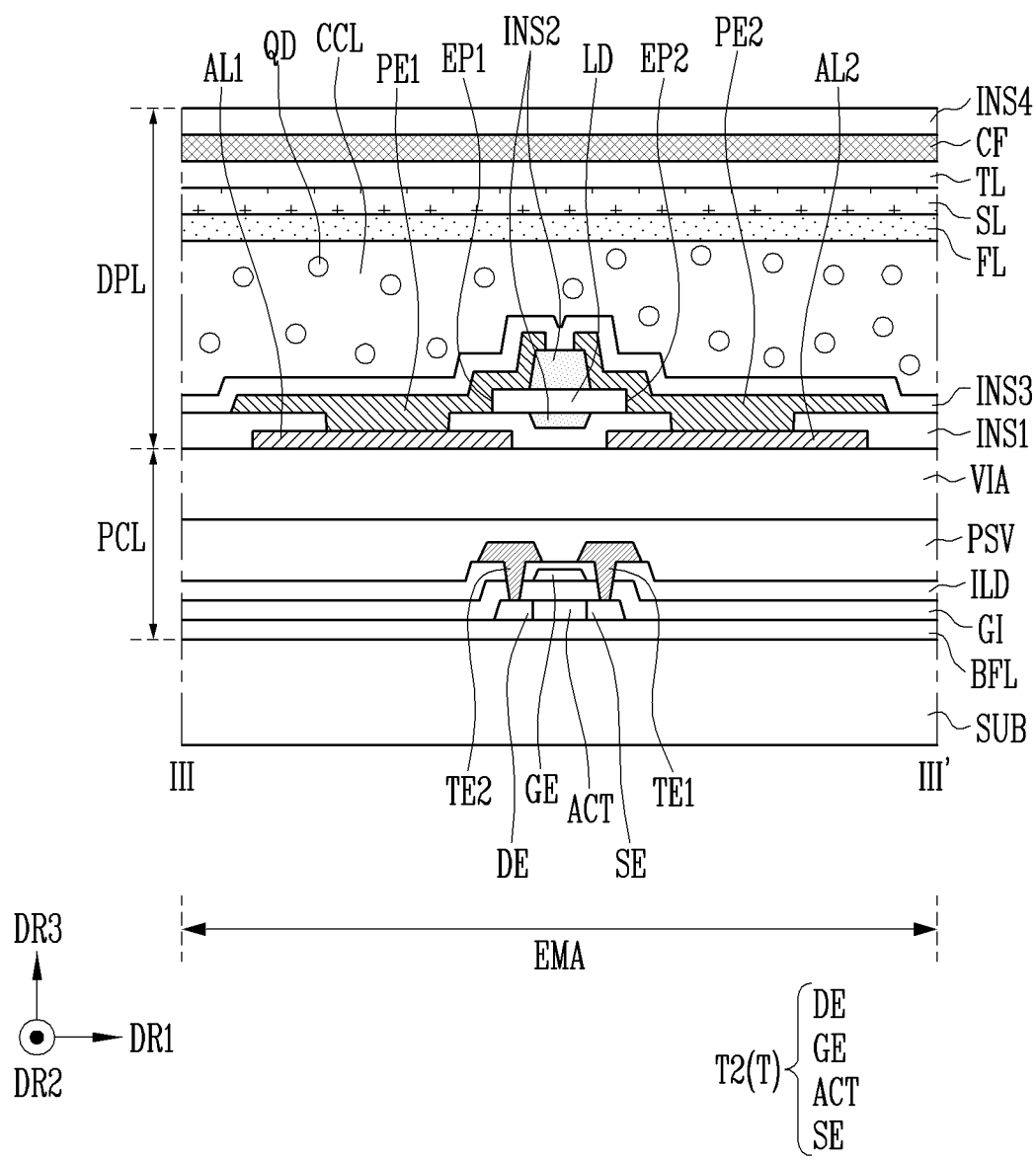
FIG. 9 is a schematic cross-sectional view taken along line III-III' shown in FIG. 7.

In FIGS. 8 to 10, a pixel PXL is simplified and illustrated, such as that each electrode is illustrated as an electrode having a signal layer (or single film) and each insulating layer is illustrated as an insulating layer provided as a single layer (or single film), but the disclosure is not limited thereto.

Also, in FIGS. 8 to 10, a lateral direction (or horizontal direction) on a section is represented as a first direction DR1, a longitudinal direction (or vertical direction) on a plane is represented as a second direction DR2, and a thickness direction of a substrate SUB on a section is represented as a third direction DR3. The first to third directions DR1, DR2, and DR3 may mean directions respectively indicated by the first to third directions DR1, DR2, and DR3.

Referring to FIGS. 4 to 10, the pixel PXL may include the substrate SUB, a pixel circuit layer PCL, and a display element layer DPL. The pixel circuit layer PCL and the display element layer DPL may be disposed on one surface (or first surface) of the substrate SUB to overlap each other. In an example, the display area DA of the substrate SUB may include the pixel circuit layer PCL disposed on the one surface of the substrate SUB and the display element layer DPL disposed on the pixel circuit layer PCL. However, mutual positions of the pixel circuit layer PCL and the display element layer DPL on the substrate SUB may be changed in some embodiments. In case that the pixel circuit layer PCL and the display element layer DPL overlap each other in layers separate from each other, each layout space for forming the pixel circuit PXC and the light emitting part EMU may be sufficiently secured on a plane. Accordingly, a display device having high resolution and high definition may be easily implemented.

The substrate SUB may include a transparent insulating material to enable light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Circuit elements (e.g., transistors T) constituting a pixel circuit PXC of a corresponding pixel PXL and signal lines electrically connected to the circuit elements may be disposed in each pixel area PXA of the pixel circuit layer PCL. An alignment electrode AL, light emitting elements LD, and a pixel electrode PE, which constitute a light emitting part EMU of a corresponding pixel PXL, may be disposed in each pixel area PXA of the display element layer DPL.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a via layer VIA, and a passivation layer PSV, which are sequentially stacked in the third direction DR3.

The buffer layer BFL may prevent an impurity from being diffused into a transistor T included in the pixel circuit PXC. The buffer layer BFL may be an inorganic insulating layer including an inorganic material. The buffer layer BFL may include, for example, at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided in (or as) a single layer, but be provided in a multi-layer including at least two layers. In case that the buffer layer BFL is provided in the multi-layer, the layers may be formed of the same material or be formed of different materials. The buffer layer BFL may be omitted according to the material and process conditions of the substrate SUB.

The pixel circuit PXC may include a first transistor T1 (or driving transistor) and a second transistor T2 (or switching transistor) electrically connected to the first transistor T1. However, the disclosure is not limited thereto, and the pixel circuit PXC may further include circuit elements for performing other functions in addition to the first transistor T1 and the second transistor T1. In the following embodiment, the first transistor T1 and the second transistor T2 may be collectively referred to as a transistor T or transistors T.

Each of the transistors T may include a semiconductor pattern and a gate electrode GE overlapping a portion of the semiconductor pattern. The semiconductor pattern may include an active pattern ACT, a first contact region SE, and a second contact region DE. The first contact region SE may be a source region, and the second contact region DE may be a drain region.

The gate electrode GE may be formed in a single layer including one selected from the group consisting of copper (Cu), molybdenum (Mo), tungsten (W), aluminum neodymium (AlNd), titanium (Ti), aluminum (Al), silver (Ag), and any alloy thereof, or a mixture thereof, or be formed in a double- or multi-layered structure including molybdenum (Mo), titanium (Ti), copper (Cu), aluminum (Al), or silver (Ag), which is a low-resistance material so as to decrease wiring resistance.

The gate insulating layer GI may be provided and/or formed entirely on the semiconductor pattern and the buffer layer BFL. The gate insulating layer GI may be an inorganic insulating layer including an inorganic material. In an example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited to the above-described embodiments. In some embodiments, the gate insulating layer GI may be an organic insulating layer including an organic material. The gate insulating layer GI may be provided as a single layer, but be provided as a multi-layer including at least two layers.

Each of the active pattern ACT, the first contact region SE, and the second contact region DE may be a semiconductor pattern made of poly-silicon, amorphous silicon, oxide semiconductor, etc. Each of the active pattern ACT, the first contact region SE, and the second contact region DE may be formed as a semiconductor layer doped or undoped with an impurity. In an embodiment, each of the first contact region SE and the second contact region DE may be formed as a semiconductor layer doped with the impurity, and the active pattern ACT may be formed of a semiconductor layer undoped with the impurity. The impurity may include, for example, an n-type impurity, but the disclosure is not limited thereto.

The active pattern ACT is a region overlapping a gate electrode GE of a corresponding transistor T, and may be a channel region. In an example, an active pattern ACT of the first transistor T1 may form a channel region of the first transistor T1 while overlapping a gate electrode GE of the first transistor T1, and an active pattern ACT of the second transistor T2 may form a channel region of the second transistor T2 while overlapping a gate electrode of the second transistor T2.

A first contact region SE of the first transistor T1 may be connected to (or contact) a first end of the active pattern ACT of the corresponding transistor T. The first contact region SE of the first transistor T1 may be electrically connected to a bridge pattern BRP through a first connection member TE1.

The first connection member TE1 may be provided and/or formed on the interlayer insulating layer ILD. One end (or first end) of the first connection member TE1 may be electrically and/or physically connected to the first contact region SE of the first transistor T1 through a contact hole sequentially penetrating the interlayer insulating layer ILD and the gate insulating layer GI. In addition, the other end (or second end) of the first connection member TE1 may be electrically and/or physically connected to the bridge patter BRP through a contact hole penetrating the passivation layer PSV located on the interlayer insulating layer ILD. The first connection member TE1 and the gate electrode GE may include the same material, or the first connection member TE1 may include at least one material selected from the materials that may be used to form the gate electrode GE.

The interlayer insulating layer ILD may be provided and/or formed entirely on the gate electrode GE and the gate insulating layer GI. The interlayer insulating layer ILD and the gate insulating layer GI may include the same material, or the interlayer insulating layer ILD may include at least one material selected from the materials that may be used to form the gate insulating layer GI.

The bridge pattern BRP may be provided and/or formed on the passivation layer PSV. One end (or first end) of the bridge pattern BRP may be electrically connected to the first contact region SE of the first transistor T1 through the first connection member TE1. In addition, the other end (or second end) of the bridge pattern BRP may be electrically and/or physically connected to a bottom metal layer BML through a contact hole sequentially penetrating the passivation layer PSV, the interlayer insulating layer ILD, the gate insulating layer GI, and the buffer layer BFL. The bottom metal layer BML and the first contact region SE of the first transistor T1 may be electrically connected through the bridge pattern BRP and the first connection member TE1.

The bottom metal layer BML may be a first conductive layer among conductive layers provided on the substrate SUB. In an example, the bottom metal layer BML may be a first conductive layer located between the substrate SUB and the buffer layer BFL. The bottom metal layer may be electrically connected to the first transistor T1 to widen the driving range of a predetermined voltage supplied to the gate electrode GE of the first transistor T1. In an example, the bottom metal layer BML may be electrically connected to the first contact region SE of the first transistor T1 to stabilize the channel region of the first transistor T1. Since the bottom metal layer BML is electrically connected to the first contact region SE of the first transistor T1, floating of the bottom metal layer BML may be prevented.

A second contact region DE of the first transistor T1 may be connected to (or contact) a second end of the active pattern ACT of the corresponding transistor T. The second contact region DE of the first transistor T1 may be electrically connected to (or contact) a second connection member TE2.

The second connection member TE2 may be provided and/or formed on the interlayer insulating layer ILD. One end (or first end) of the second connection member TE2 may be electrically and/or physically connected to the second contact region DE of the first transistor T1 through a contact hole sequentially penetrating the interlayer insulating layer ILD and the gate insulating layer GI. The other end (or second end) of the second connection member TE2 may be electrically and/or physically connected to a first alignment electrode AL1 of the display element layer DPL through a first contact part CNT1 sequentially penetrating the via layer VIA and the passivation layer PSV. In an embodiment, the second connection member TE2 may be a medium for electrically connecting the first transistor T1 of the pixel circuit layer PCL to the first alignment electrode AL1 of the display element layer DPL.

A first contact region SE of the second transistor T2 may be connected to (or contact) one end (or first end) of the active pattern ACT of the corresponding transistor T. Although not directly shown in the drawings, the first contact region SE of the second transistor T2 may be electrically connected to the gate electrode GE of the first transistor T1. In an example, the first contact region SE of the second transistor T2 may be electrically connected to the gate electrode GE of the first transistor T1 through another first connection member TE1. The another first connection member TE1 may be provided and/or formed on the interlayer insulating layer ILD.

A second contact region DE of the second transistor T2 may be connected to (or contact) the other end of the active pattern ACT of the corresponding transistor T. Although not directly shown in the drawings, the second contact region DE of the second transistor T2 may be electrically connected to a data line Dj. For example, the second contact region DE of the second transistor T2 may be electrically connected to the data line Dj through another second connection member TE2. The another second connection member TE2 may be provided and/or formed on the interlayer insulating layer ILD.

The interlayer insulating layer ILD may be provided and/or formed over the above-described first and second transistors T1 and T2.

In the above-described embodiment, a case where each of the transistors T is a thin film transistors having a top gate structure has been described as an example. However, the disclosure is not limited thereto, and the structure of the transistors T may be variously modified.

The passivation layer PSV may be provided and/or formed over the transistors T and the first and second connection members TE1 and TE2.

The passivation layer PSV (or protective layer) may be provided and/or formed entirely on the first and second connection members TE1 and TE2 and the interlayer insulating layer ILD. The passivation layer PSV may be an inorganic insulating layer including an inorganic material or an organic insulating layer including an organic material. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, polyphenylene ethers resin, polyphenylene sulfides resin, and benzocyclobutenes resin.

In some embodiments, the passivation layer PSV and the interlayer insulating layer ILD may include the same material, but the disclosure is not limited thereto. The passivation layer PSV may be provided as a single layer, but be provided as a multi-layer including at least two layers.

The pixel circuit layer PCL may include a power line provided and/or formed on the passivation layer PSV. In an example, the power line may include a second power line PL2. The second power line PL2 and the bridge pattern BRP may be provided in the same layer. The voltage of the second driving power source VSS may be applied to the second power line PL2. Although not directly shown in FIGS. 8 to 10, the pixel circuit layer PCL may further include the first power line PL1 described with reference to FIGS. 5 and 6. The first power line PL1 and the second power line PL2 may be provided in the same or different layers. In the above-described embodiment, it has been described that the second power line PL2 is provided and/or formed on the passivation layer PSV, but the disclosure is not limited thereto. In some embodiments, the second power line PL2 may be provided on an insulating layer on which any conductive layer among conductive layers provided in the pixel circuit layer PCL is located. For example, the position of the second power line PL2 in the pixel circuit layer PCL may be variously changed.

Each of the first power line PL1 and the second power line PL2 may include a conductive material (or substance). In an example, each of the first power line PL1 and the second power line PL2 may be formed as a single layer (or single film) including at least one selected from the group consisting of copper (Cu), molybdenum (Mo), tungsten (W), aluminum neodymium (AlNd), titanium (Ti), aluminum (Al), silver (Ag), and any alloy thereof, or a mixture thereof, or be formed in a structure having a double layer (or double film) or a multi-layer (or multi-film), including molybdenum (Mo), titanium (Ti), copper (Cu), aluminum (Al) or silver (Ag), which is a low-resistance material so as to decrease wiring resistance. In an example, each of the first power line PL1 and the second power line PL2 may be configured as a double layer in which titanium (Ti)/copper (Cu) are sequentially stacked.

The first power line PL1 may be electrically connected to a component of the display element layer DPL, and the second power line PL2 may be electrically connected to another component of the display element layer DPL.

The via layer VIA may be provided and/or formed over the bridge pattern BRP and the second power line PL2.

The via layer VIA may be provided in a form including an organic insulating layer, an inorganic insulating layer, or an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). For example, the organic insulating layer may include at least one of polyacrylates resin, epoxy resin, phenolic resin, polyamides resin, polyimides resin, unsaturated polyesters resin, polyphenylene ethers resin, polyphenylene sulfides resin, and benzocyclobutenes resin.

The via layer VIA may include a first contact part CNT1 corresponding to the first contact part CNT1 of the passivation layer PSV, which exposes the second connection member TE2 electrically connected to the first transistor T1, and a second contact part CNT2 exposing the second power line PL2.

The display element layer DPL may be disposed on the via layer VIA.

The display element layer DPL may include alignment electrodes AL, a bank BNK, light emitting elements LD, pixel electrodes PE, a color conversion layer CCL, a barrier layer FL, a low refractive layer SL, and a capping layer TL. The display element layer DPL may include at least one insulating layer located between the above-described components. In an example, the display element layer DPL may include a first insulating layer INS1, a second insulating layer INS2, a third insulating layer INS3, and a fourth insulating layer INS4.

The alignment electrodes AL may be provided and/or formed on the via layer VIA. The alignment electrodes AL may be disposed on the same plane and have the same thickness in the third direction DR3. In an example, the first alignment electrode AL1 and a second alignment electrode AL2 may be provided on the via layer VIA and have the same thickness in the third direction DR3. The alignment electrodes AL may be simultaneously formed by the same process.

The alignment electrodes AL may be made of (or include) a material having a constant (or uniform) reflexibility so as to allow light emitted from the light emitting elements LD to advance in an image display direction of the display device. In an example, the alignment electrodes AL may be made of a conductive material (or substance). The conductive material may include an opaque metal advantageous in reflecting light emitted from the light emitting elements LD in the image display direction of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes AL is not limited to the above-described embodiment. In some embodiments, the alignment electrodes AL may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as (poly(3,4-ethylenedioxythiophene) (PEDOT), and the like. In case that the alignment electrodes AL include the transparent conductive material (or substance), a separate conductive layer may be additionally included, which is made of an opaque metal for reflecting light emitted from the light emitting elements LD in the image display direction of the display device. However, the material of the alignment electrodes AL is not limited to the above-described materials.

Each of the alignment electrodes AL may be provided and/or formed as a single layer, but the disclosure is not limited thereto. In some embodiments, each of the alignment electrodes AL may be provided and/or formed as a multi-layer in which two or more materials among metals, alloys, conductive oxides, and conductive polymers are stacked. Each of the alignment electrodes AL may be provided as a multi-layer including at least two layers so as to minimize distortion caused by a signal delay in case that a signal (or voltage) is transferred to both end portions EP1 and EP2 of each of the light emitting elements LD. In an example, each of the alignment electrodes AL may be provided as a multi-layer which selectively further include at least one of at least one reflective electrode layer, at least one transparent electrode layer disposed on the top and/or bottom of the reflective electrode layer, and at least one conductive capping layer covering the top of the reflective electrode layer and/or the transparent electrode layer.

As described above, in case that the alignment electrodes AL are made of a conductive material having a constant reflexibility, light emitted from both the end portions, e.g., the first and second end portions EP1 and EP2 of each of the light emitting elements LD may further advance in the image display direction (or front direction) of the display device.

The first alignment electrode AL1 may be electrically connected to the first transistor T1 of the pixel circuit layer PCL through the first contact part CNT1, and the second alignment electrode AL2 may be electrically connected to the second power line PL2 of the pixel circuit layer PCL through the second contact part CNT2.

The first insulating layer INS1 may be provided and/or formed on the alignment electrodes AL.

The first insulating layer INS1 may be partially opened to expose components located on the bottom thereof in at least the emission area EMA. In an example, the first insulating layer INS1 may be partially opened such that an area of the first insulating layer INS1 is removed in the emission area EMA to expose a portion of the first alignment electrode AL1, and another area of the first insulating layer INS1 is removed in the emission area EMA to expose a portion of the second alignment electrode AL2.

The first insulating layer INS1 may include an inorganic insulating layer made of an inorganic material or an organic insulating layer made of an organic material. The first insulating layer INS1 may be configured as an inorganic insulating layer advantageous in protecting the light emitting elements LD from the pixel circuit layer PCL of each pixel PXL. In an example, the first insulating layer INS1 may include at least one of silicon oxide ($SiO_x$), silicon nitride ($SiN_x$), silicon oxynitride ($SiO_xN_y$), and metal oxide such as aluminum oxide ($AlO_x$), but the disclosure is not limited thereto. In some embodiments, the first insulating layer INS1 may be configured as an organic insulating layer advantageous in planarizing a supporting surface of the light emitting elements LD.

The first insulating layer INS1 may be provided as a single layer or a multi-layer. In case that the first insulating layer INS1 is provided as the multi-layer, the first insulating layer INS1 may be provided in a distributed Bragg reflector (DBR) structure in which first and second layers having different refractive indices, each of which is configured as an inorganic layer, are alternately stacked.

The bank BNK may be provided and/or formed on the first insulating layer INS1.

The bank BNK may be formed between other pixels PXL to surround an emission area EMA of a pixel PXL. Therefore, the bank BNK may form a pixel defining layer partitioning the emission area EMA of the corresponding pixel PXL. The bank BNK may function (or serve) as a dam structure which prevents a solution in which light emitting elements LD are mixed from being introduced into an emission area EMA of an adjacent pixel PXL or controls a constant amount of solution to be supplied to each emission area EMA, in a process of supplying the light emitting elements LD to the emission area EMA. The bank BNK may serve as a dam structure which prevents the color conversion layer CCL from being introduced into an emission area EMA of an adjacent pixel PXL or controls a constant amount of the color conversion layer CCL to be supplied to each emission area EMA, in a process of supplying the color conversion layer CCL.

Light emitting elements LD may be supplied and aligned in an emission area EMA of a pixel PXL, in which the first insulating layer INS1 is formed. In an example, the light emitting elements LD are supplied (or input) to the emission area EMA by an inkjet processor the like, and may be aligned between the alignment electrodes AL by a signal (or an alignment signal) applied to each of the alignment electrodes AL.

The second insulating layer INS2 may be provided and/or formed on each of the light emitting elements LD in the emission area EMA. The second insulating layer INS2 may be provided and/or formed on the light emitting elements LD to partially cover an outer circumferential surface (or surface) of each of the light emitting elements LD, thereby exposing the first end portion EP1 and the second end portion EP2 of each of the light emitting elements LD to the outside.

The second insulating layer INS2 may be configured as a single layer or a multi-layer, and include an inorganic insulating layer including at least one inorganic material or an organic insulating layer including at least one organic material. The second insulating layer INS2 may include an inorganic insulating layer advantageous in protecting the active layer 12 (see FIG. 1) of each of the light emitting elements LD from external oxygen, moisture, and the like. However, the disclosure is not limited thereto. The second insulating layer INS2 may be configured as an organic insulating layer including an organic material according to design conditions of the display device to which the light emitting elements LD are applied. After alignment of light emitting elements LD in the pixel area PXA (or the emission area EMA) of the pixel PXL is completed, the second insulating layer INS2 is formed on the light emitting elements LD, so that the light emitting elements LD may be prevented from being separated from positions at which the light emitting elements LD are aligned.

In case that an empty gap (or space) is present between the first insulating layer INS1 and the light emitting elements LD before the second insulating layer INS2 is formed, the empty gap may be filled with the second insulating layer INS2 in a process of forming the second insulating layer INS2. The second insulating layer INS2 may be configured as an organic insulating layer advantageous in filling the empty gap between the first insulating layer INS1 and the light emitting elements LD. However, the disclosure is not necessarily limited thereto.

The pixel electrodes PE may be disposed on the light emitting elements LD, the second insulating layer INS2 on the light emitting elements LD, and the first insulating layer INS1 on the alignment electrodes AL in at least the emission area EMA.

A first pixel electrode PE1 in at least the emission area EMA may disposed on the first end portion EP1 of the light emitting element LD, the second insulating layer INS2 on the light emitting element LD, and the first insulating layer INS1 on the first alignment electrode AL1. The first pixel electrode PE1 may be electrically connected to the first alignment electrode AL1 exposed by the partially opened first insulating layer INS1 while directly contacting the first alignment electrode AL1.

A second pixel electrode PE2 in at least the emission area EMA may be disposed on the second end portion EP2 of the light emitting element LD, the second insulating layer INS2 on the light emitting element LD, and the first insulating layer INS1 on the second alignment electrode AL2. The second pixel electrode PE2 may be electrically connected to the second alignment electrode AL2 exposed by the partially opened first insulating layer INS1 while directly contacting the second alignment electrode AL2.

The first pixel electrode PE1 and the second pixel electrode PE2 may be disposed on the second insulating layer INS2 on the light emitting elements LD to be spaced from each other.

The first pixel electrode PE1 and the second pixel electrode PE2 may be made of various transparent conductive materials so as to allow light which is emitted from each of the light emitting elements LD and then reflected by the first and second alignment electrodes AL1 and AL2 to advance in the image display direction of the display device without loss. In an example, the first pixel electrode PE1 and the second pixel electrode PE2 may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and may be substantially transparent or translucent to satisfy a predetermined transmittance (or transmittancy). However, the materials of the first pixel electrode PE1 and the second pixel electrode PE2 are not limited to the above-described embodiment. In some embodiments, the first pixel electrode PE1 and the second pixel electrode PE2 may be made of various opaque conductive materials. The first pixel electrode PE1 and the second pixel electrode PE2 may be formed as a single layer or a multi-layer.

In an embodiment, the first pixel electrode PE1 and the second pixel electrode PE2 may be provided in the same layer. The first pixel electrode PE1 and the second pixel electrode PE2 may be formed by a same process. However, the disclosure is not limited thereto. In some embodiments, the first pixel electrode PE1 and the second pixel electrode PE2 may be formed by different processes to be provided in different layers. This will be described below with reference to FIG. 14.

The third insulating layer INS3 may be provided and/or formed over the first pixel electrode PE1 and the second pixel electrode PE2. The third insulating layer INS3 may be an inorganic insulating layer including an inorganic material or an organic insulating layer including an organic material. In an example, the third insulating layer INS3 may have a structure in which at least one inorganic insulating layer and at least one organic insulating layer are alternately stacked. The third insulating layer INS3 may entirely cover the display element layer DPL to block moisture, humidity or the like from being introduced into the display element layer DPL including the light emitting elements LD from the outside.

The color conversion layer CCL may be provided and/or formed on the third insulating layer INS3 in at least the emission area EMA.

The color conversion layer CCL may be located over the light emitting elements LD in the emission area EMA of the pixel PXL, which is surrounded by the bank BNK. The color conversion layer CCL may include color conversion particles QD corresponding to a specific color. In an example, the color conversion layer CCL may include color conversion particles QD for converting light of a first color, which is emitted from light emitting elements LD, into light of a second color (or specific color). In case that the pixel PXL is a red pixel (or red sub-pixel), the color conversion layer CCL may include color conversion particles QD of a red quantum dot, which convert light of a first color, which is emitted from the light emitting elements LD, into light of a second color, e.g., light of red. In case that the pixel PXL is a green pixel (or green sub-pixel), the color conversion layer CCL may include color conversion particles QD of a green quantum dot, which convert light of a first color, which is emitted from the light emitting elements LD, into light of a second color, e.g., light of green. In case that the pixel PXL is a blue pixel (or blue sub-pixel), the color conversion layer CCL may include color conversion particles QD of a blue quantum dot, which convert light of a first color, which is emitted from the light emitting elements LD, into light of a second color, e.g., light of blue. In some embodiments, in case that the pixel PXL is the blue pixel (or blue sub-pixel), a light scattering layer including light scattering particles may be provided instead of the color conversion layer CCL including the color conversion particles QD. In an example, in case that the light emitting elements LD emit blue series light, the pixel PXL may include a light scattering layer including light scattering particles. The above-described light scattering layer may be omitted in some embodiments. In some embodiments, in case that the pixel PXL is the blue pixel (or blue sub-pixel), transparent polymer may be provided instead of the color conversion layer CCL.

The barrier layer (or first layer) FL may be provided and/or formed on the color conversion layer CCL and the bank BNK.

The barrier layer FL is provided entirely in the pixel area PXA of the pixel PXL, and may be directly disposed on the bank BNK and the color conversion layer CCL. The barrier layer FL may include silicon oxide ($SiO_x$). In an example, the barrier layer FL made of silicon oxide may be formed by applying (or coating) a solvent, in which polysilazane is dispersed, onto the color conversion layer CCL by an inkjet printing process and curing the applied solvent. The polysilazane may be inorganic polysilazane (perhydropolysilazane (PHPS)), but the disclosure is not necessarily limited thereto. The inorganic polysilazane is an inorganic polymer which does not include carbon but is composed of only Si—N and Si—N to use "—($SiH_2$—NH)—" as a recurring unit. Since the inorganic polysilazane has an excellent reactivity with moisture and oxygen in air, the inorganic polysilazane may form a high-hardness silicon oxide layer while releasing NH and H molecules at high temperatures.

Since the barrier layer FL formed by curing the polysilazane is excellent in adhesiveness, chemical resistance, moisture tolerance, and the like, the barrier layer FL more stably protects the color conversion layer CCL located on the bottom thereof from external moisture and humidity, as compared with a barrier layer formed by the chemical vapor deposition (CVD), thereby improving the reliability of the color conversion layer CCL. Accordingly, the barrier layer FL prevents degradation of the color conversion layer CCL or allows occurrence of the degradation to be delayed as late as possible, thus improving the luminance of the pixel PXL, thereby improving the display quality of the display device.

Figure 19:
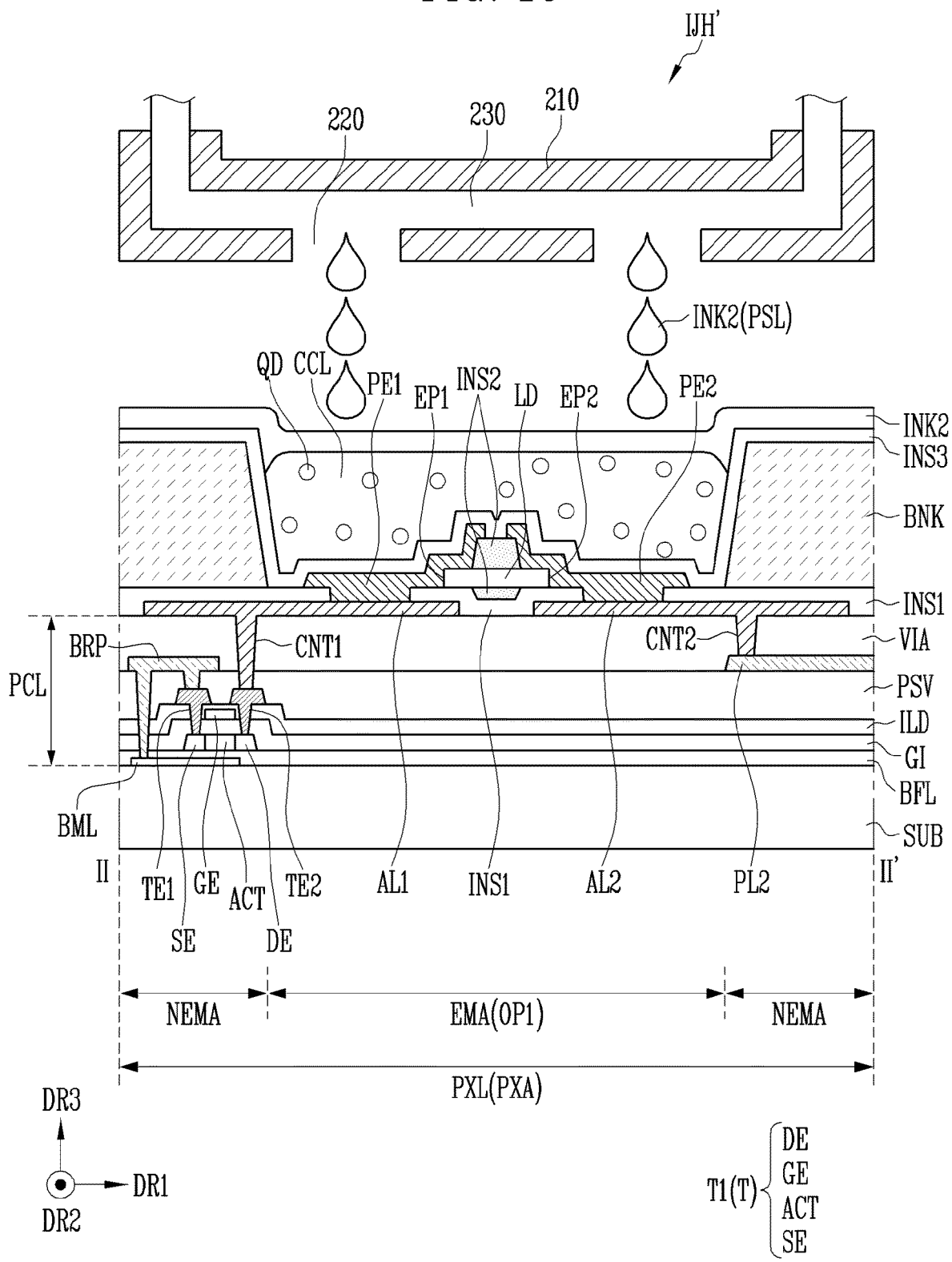
Figure 20:
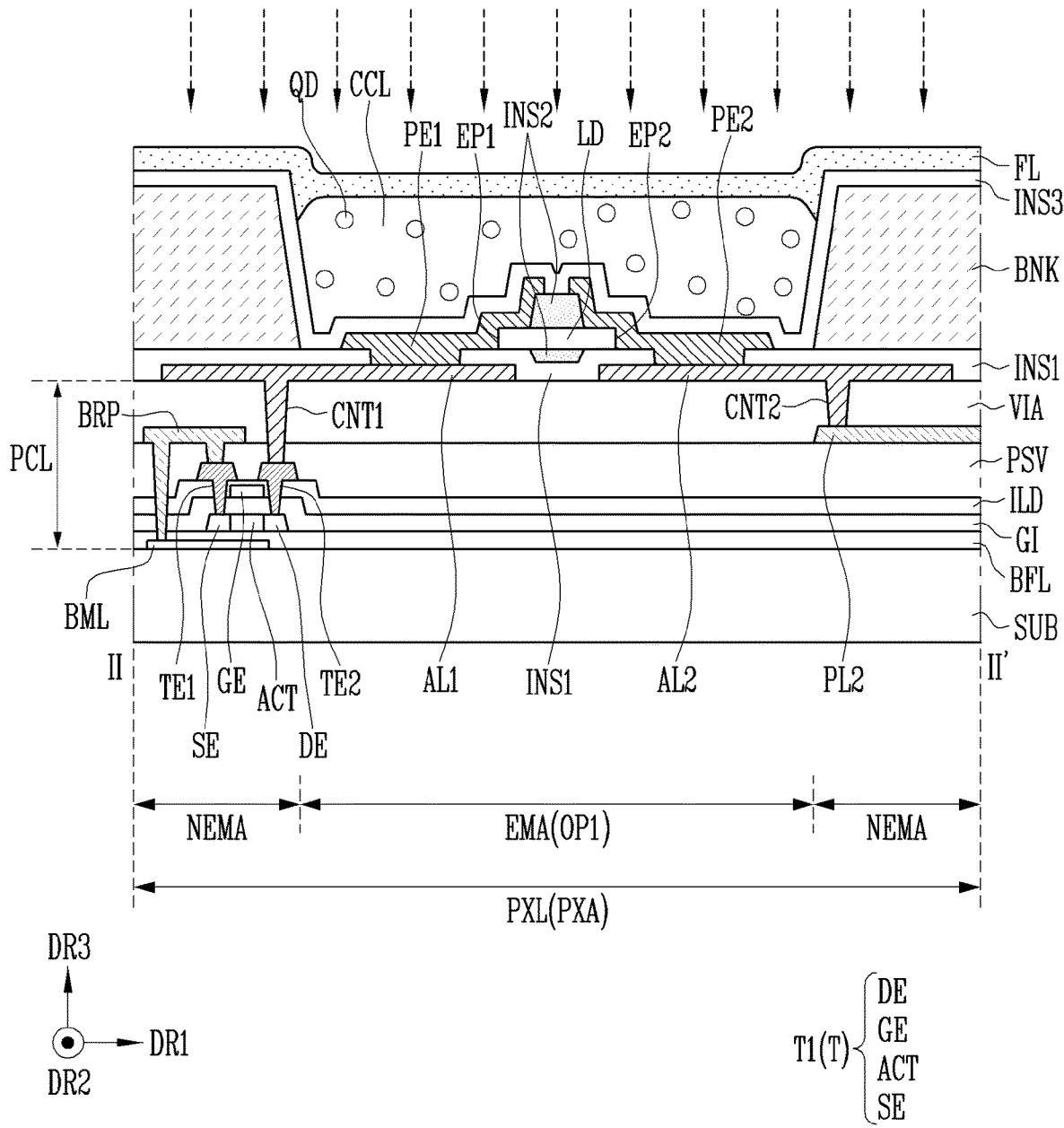
Figure 21:
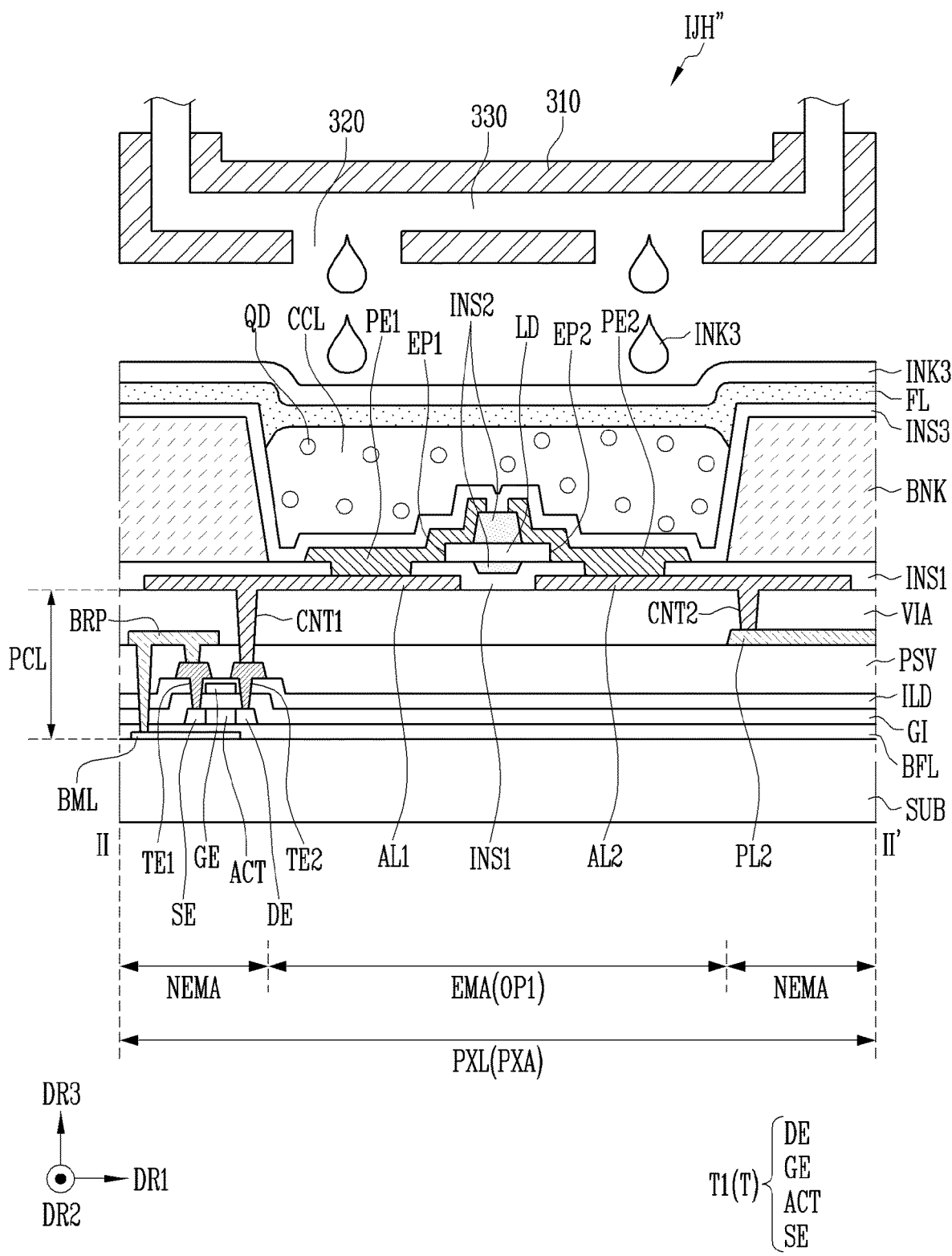
Figure 22:
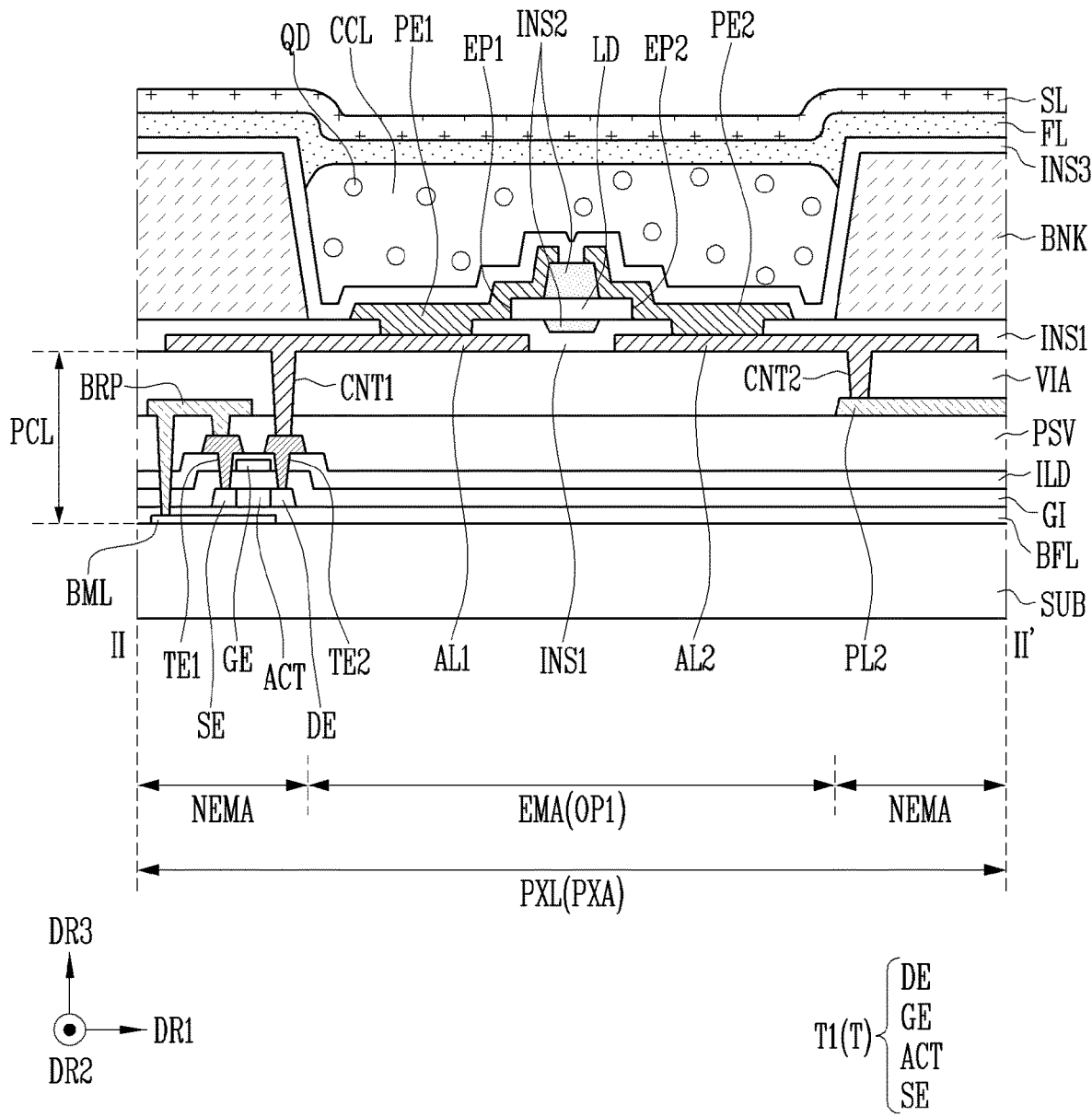
Figure 23:
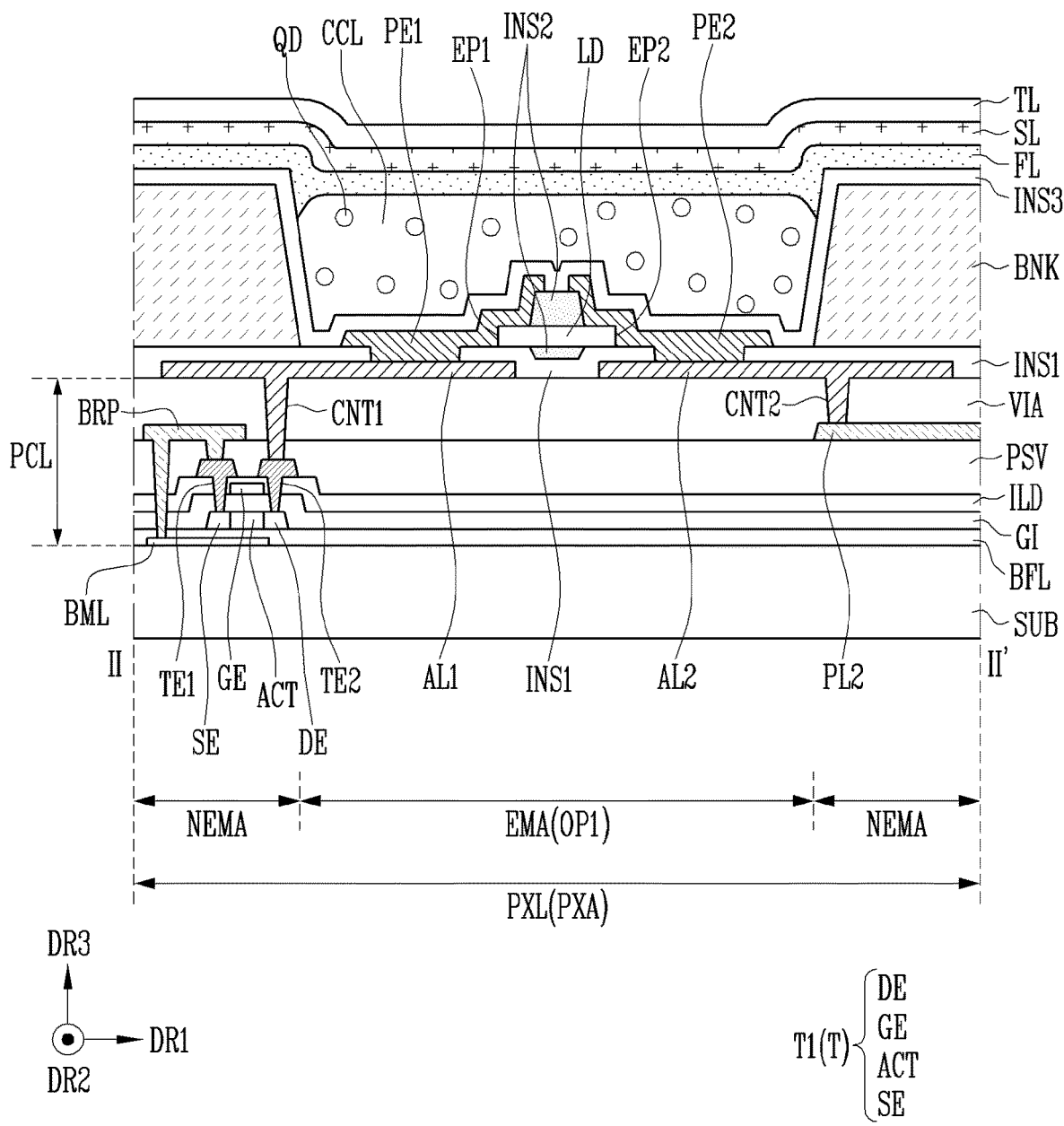
Figure 24:
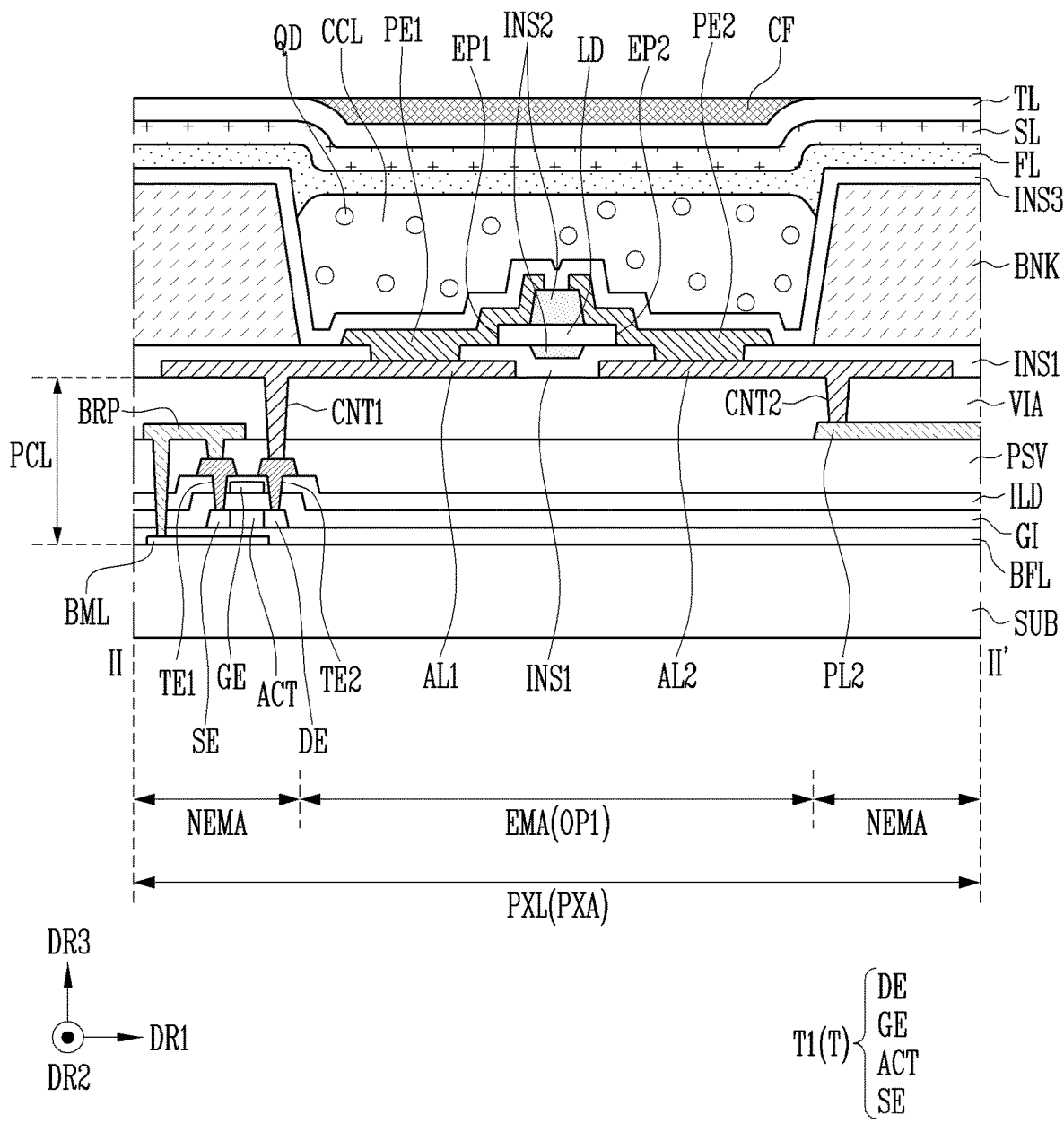

A method of forming the barrier layer FL will be described below with reference to FIGS. 19 and 20.

The low refractive layer SL (or low refractive index layer) may be provided and/or formed on the barrier layer FL.

The low refractive layer (or second layer) SL may change a path of lost light among lights (or beams) emitted from the color conversion layer CCL in the front direction (or the image display direction of the display direction), using a refractive index difference, thereby improving the luminance of light emission in the front direction. The low refractive layer SL may recycle blue series light which does not react with the color conversion layer CCL so that the light of bluish color may react with the color conversion layer CCL, thereby increasing the luminance of light emitted from the color conversion layer CCL.

The low refractive layer SL may include resin and hollow particles dispersed in the resin and have a refractive index ranging from about 1.1 to about 1.3. The hollow particles may mean particles in a form in which an empty space is present at the surface and/or the inside of an organic or inorganic particle. The hollow particles may be hollow silica particles. The "hollow silica particles" are silica particles derived from a silicide or an organic silicide, and may mean particles in a form in which an empty space is present at the surface and/or the inside of the silica particle. In some embodiments, the low refractive layer SL may include an anti-reflection film including layers in which materials having different refractive indices are alternately stacked. Each layer may be configured as an organic insulating layer including an organic material, but the disclosure is not limited thereto. In some embodiments, the layer may be configured as an inorganic insulating layer including an inorganic material.

The low refractive layer SL may be provided entirely in the pixel area PXA of the pixel PXL. The low refractive layer SL may have a thickness of about 0.1 µm to about 5.0 µm. In an example, the low refractive layer SL may have a thickness of about 0.5 µm to about 2.5 µm.

In an embodiment, the low refractive layer SL may be disposed entirely on the barrier layer FL or may be disposed on an entire side of the barrier layer FL, but the disclosure is not limited thereto. In some embodiments, the low refractive layer SL may be disposed on only the barrier layer FL located in the emission area EMA as shown in FIG. 10. In an example, the low refractive layer SL may be disposed on the barrier layer FL located on the top of the color conversion layer CCL to overlap (or correspond to) the color conversion layer CCL. In case that the low refractive layer SL is disposed on only the barrier layer FL located in the emission area EMA, the low refractive layer SL may be used as a step difference compensation part for compensating for a step difference (or height difference) between the bank BNK and the color conversion layer CCL. In case that a step difference occurs between the bank BNK and the color conversion layer CCL, a thickness difference occurs between a color filter CF to be formed by a subsequent process and a color filter CF of each of adjacent pixels PXL, and therefore, a color balance difference between pixels PXL may occur. In addition, a problem may occur in that the adhesion between components, e.g., the capping layer TL and the fourth insulating layer INS4 to be formed in a subsequent process, is deteriorated at a step different portion between the bank BNK and the color conversion layer CCL. Accordingly, in an embodiment, the low refractive layer SL is disposed on only the barrier layer FL located in the emission area EMA, so that the step difference between the bank BNK and the color conversion layer CCL may be reduced or minimized, thereby solving the above-described problem. In case that the low refractive layer SL is disposed in only the emission area EMA of the pixel PXL, the amount of material used for the low refractive layer SL is reduced as compared with when the low refractive layer SL is disposed entirely in the pixel area PXA of the pixel PXL, so that the manufacturing cost of the display device may be reduced.

The capping layer (or third layer) TL may be provided and/or formed on the above-described low refractive layer SL.

The capping layer TL may include at least one of silicon nitride ($SiN_x$), silicon oxide ($SiO_x$), silicon oxynitride ($SiO_xN_y$), and metal oxide such as aluminum oxide ($AlO_x$). In an example, the capping layer TL may include silicon oxide formed on the low refractive layer SL by using chemical vapor deposition (CVD), but the disclosure is not limited thereto. In some embodiments, the capping layer TL may include silicon oxide formed by applying a solvent in which polysilazane is dispersed onto the low refractive layer SL through an inkjet printing process and then curing the applied solvent, similarly or identically to the barrier layer FL. The capping layer TL may be used as another barrier layer which entirely covers the low refractive layer SL, thereby blocking moisture, humidity or the like from being introduced into the low refractive layer SL from the outside. In an embodiment, the capping layer TL may be provided entirely in the pixel area PXA of the pixel PXL.

The color filter CF may be provided and/or formed on the capping layer TL.

The color filter CF may include a color filter material which allows light of a second color (or light of a specific color) converted in the color conversion layer CCL of the pixel PXL to be selectively transmitted therethrough. In case that the pixel PXL is a red pixel (or red sub-pixel), the color filter may include a red color filter. In case that the pixel PXL is a green pixel (or green sub-pixel), the color filter may include a green color filter. In case that the pixel PXL is a blue pixel (or blue sub-pixel), the color filter may include a blue color filter. The color filter CF may be provided in the emission area EMA of a pixel PXL to correspond to (or overlap) the color conversion layer CCL of the corresponding pixel PXL.

The fourth insulating layer INS4 may be provided and/or formed entirely on the color filter CF and the capping layer TL.

The fourth insulating layer INS4 may be a planarization layer which reduces a step difference generated by components disposed on the bottom thereof. The fourth insulating layer INS4 may be provided as a single layer, but be provided as a multi-layer including a double layer. The fourth insulating layer INS4 may be configured as a single layer including at least one organic layer or at least one inorganic layer or as a double layer in which at least one organic layer and at least one inorganic layer are stacked so as to cover color filters CF. The fourth insulating layer INS4 is located on the color filter CF and covers (or overlaps) the color filter CF, so that the color filter CF may be protected from external moisture, humidity or the like.

In an embodiment, the color conversion layer CCL may be formed over the light emitting elements LD in the emission area EMA of the pixel PXL by the inkjet printing process, the barrier layer FL may be formed on the color conversion layer CCL and the bank layer BNK by the inkjet printing process, and the low refractive layer SL may be formed on the barrier layer FL by the inkjet printing process. For example, in the above-described embodiment, the color conversion layer CCL, the barrier layer FL, and the low refractive layer SL are formed by the continuous inkjet printing process in the same apparatus, so that product production time may be reduced, and product production efficiency may be improved.

Further, in the above-described embodiment, the barrier layer FL including the silicon oxide formed by curing polysilazane is directly disposed on the color conversion layer CCL, so that the color conversion layer CCL may be protected from external moisture, humidity or the like, thereby improving the reliability of the color conversion layer CCL. Accordingly, the luminance of the pixel PXL is improved by preventing degradation of the color conversion layer CCL, so that the display quality of the display device may be improved.

Figure 11:
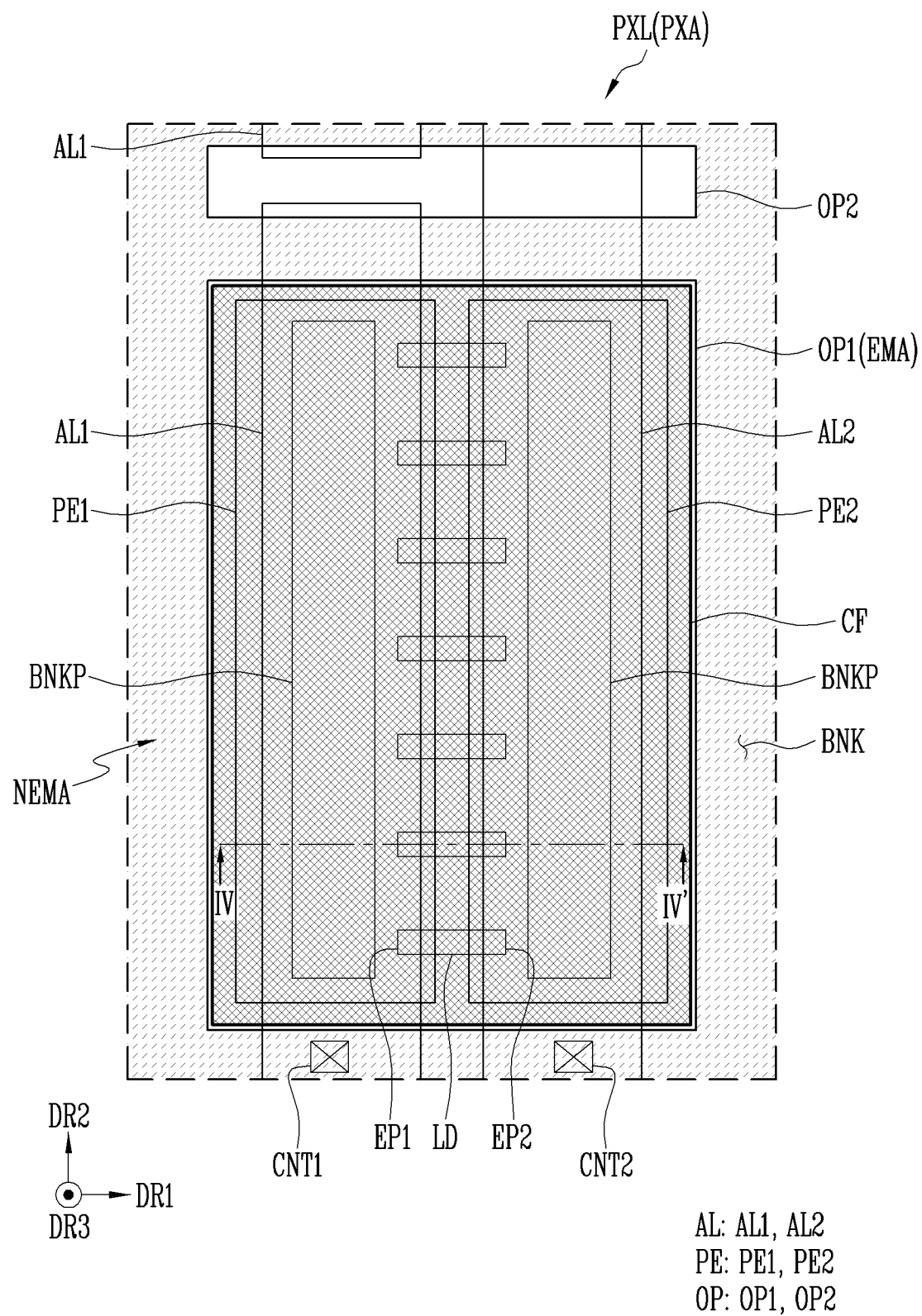
FIG. 11 is a plan view schematically illustrating a pixel in accordance with another embodiment of the disclosure.
Figure 12:
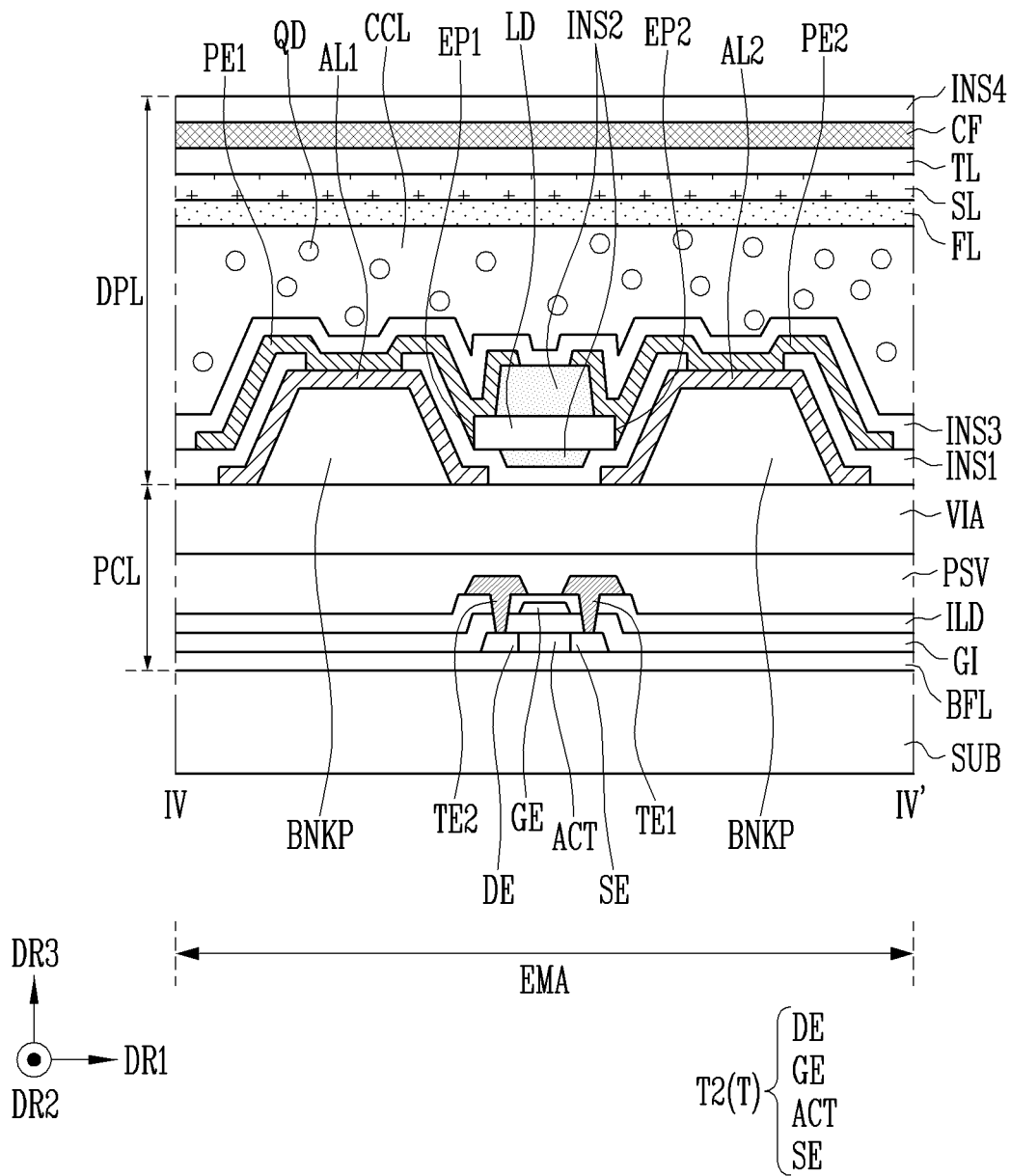
FIGS. 12 to 14 are schematic cross-sectional views taken along line IV-IV' shown in FIG. 11.
Figure 13:
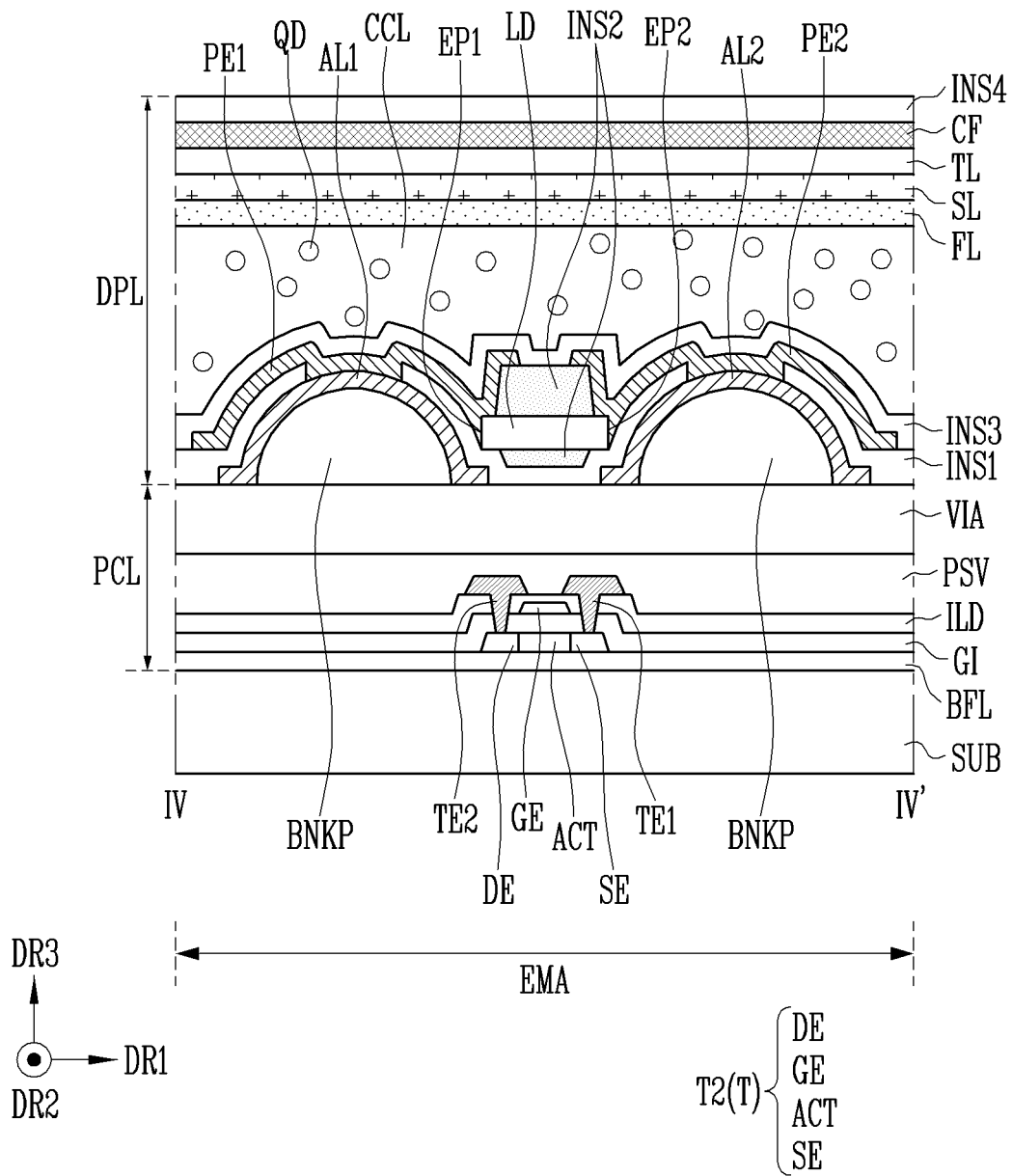
Figure 14:
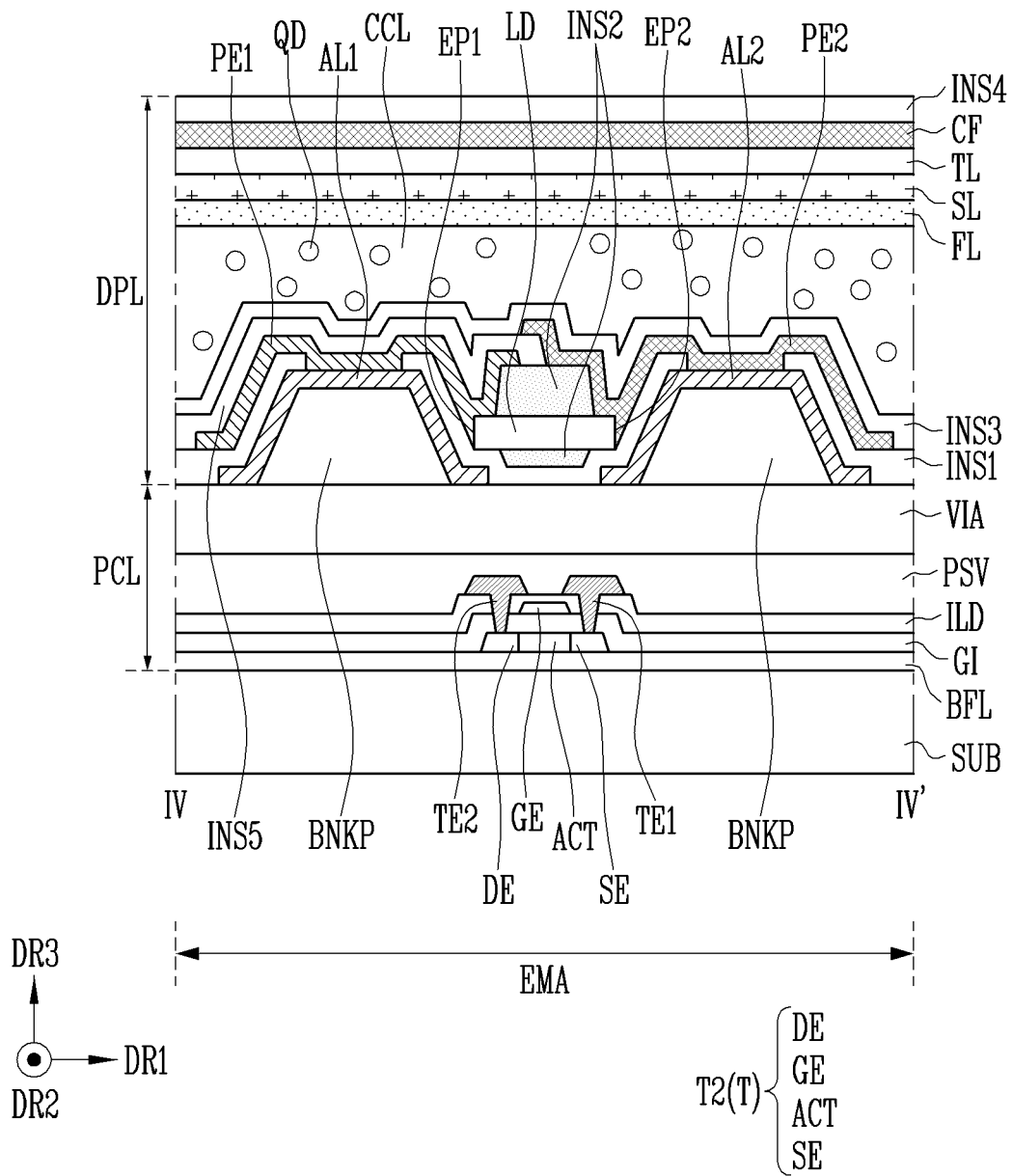

FIG. 11 is a plan view schematically illustrating a pixel PXL in accordance with another embodiment. FIGS. 12 to 14 are schematic cross-sectional views taken along line IV-IV' shown in FIG. 11.

The pixel PXL shown in FIGS. 11 to 14 may have a configuration different from the pixel PXL shown in FIGS. 7 to 10 at least in that bank patterns BNKP are respectively disposed between a via layer VIA and alignment electrodes AL.

Accordingly, in relation to the pixel PXL shown in FIGS. 11 to 14, portions different from those of the above-described embodiment will be mainly described to avoid redundancy.

Referring to FIGS. 11 to 14, the bank patterns BNKP may be respectively located between the alignment electrodes AL and the via layer VIA. In an example, the bank pattern patterns BNKP may be respectively located between a first alignment electrode AL1 and the via layer VIA and between a second alignment electrode AL2 and the via layer VIA.

The bank pattern BNKP may be provided in at least an emission area EMA and extend in the second direction DR2 in the emission area EMA. The bank pattern BNKP (also referred to as a "wall pattern," "protrusion pattern," "supporting pattern," or "pattern") may have a bar-like shape having a constant width in a direction in which the bank pattern BNKP extends in the emission area EMA.

The bank pattern BNKP may be a supporting member which supports each of the first and second alignment electrodes AL1 and AL2 to change the surface profile (or shape) of each of the first and second alignment electrodes AL1 and AL2 so as to guide light emitted from light emitting elements LD in the third direction DR3 (or the image display direction of the display device).

The bank pattern BNKP may be an inorganic insulating layer including an inorganic material or an organic insulating layer including an organic material. In some embodiments, the bank pattern BNKP may include a single organic insulating layer and/or a single inorganic insulating layer, but the disclosure is not limited thereto. In some embodiments, the bank pattern BNKP may be provided in the form of a multi-layer in which at least one organic insulating layer and at least one inorganic insulating layer are stacked. However, the material of the bank pattern BNKP is not limited to the above-described embodiment. In some embodiments, the bank pattern BNKP may include a conductive material.

The bank pattern BNKP may have a section having a trapezoidal shape, a width of which becomes narrower toward the top thereof in the third direction DR3 from a surface (e.g., an upper surface) of the via layer VIA, but the disclosure is not limited thereto. In some embodiments, the bank pattern BNKP may include a curved surface having a section of a semi-elliptical shape, a semicircular shape (or hemispherical shape), or the like, a width of which becomes narrower toward the top thereof in the third direction DR3 from the surface of the via layer VIA as shown in FIG. 13. In a cross-sectional view, the shape of the bank pattern BNKP is not limited to the above-described embodiments, and may be variously changed within a range in which the efficiency of light emitted from each of the light emitting elements LD may be improved.

As the bank pattern BNKP is provided on the bottom of one area of each of the first and second alignment electrodes AL1 and AL2 in the emission area EMA, one area of each of the first and second alignment electrodes AL1 and AL2 may protrude in an upper direction of the pixel PXL in an area in which the bank pattern BNKP is formed. Accordingly, a wall structure may be formed at the periphery of the light emitting elements LD. For example, the wall structure may be formed in the emission area EMA to face first and second end portions EP1 and EP2 of the light emitting elements LD.

Each of the first and second alignment electrodes AL1 and AL2 may be provided and/or formed on a corresponding bank pattern BNKP. Each of the first and second alignment electrodes AL1 and AL2 may have a surface profile corresponding to the shape of a bank pattern BNKP disposed on the bottom thereof. Accordingly, light emitted from the light emitting elements LD is reflected by each of the first and second alignment electrodes AL1 and AL2 to further advance in the third direction DR3 (or the image display direction of the display device). The bank pattern BNKP and each of the first and second alignment electrodes AL1 and AL2 may be used as a reflection member which guides light emitted from the light emitting element LD in a desired direction, thereby improving the light efficiency of the display device. Accordingly, the light emission efficiency of the light emitting elements LD may be further improved.

A first pixel electrode PE1 and a second pixel electrode PE2 may be disposed to be spaced from each other in the first direction DR1. In an example, the first pixel electrode PE1 and the second pixel electrode PE2 may be disposed on a second insulating layer INS2 on the light emitting elements LD to be spaced from each other. The first pixel electrode PE1 and the second pixel electrode PE2 may be provided in the same layer and be formed by a same process. However, the disclosure is not limited thereto. In some embodiments, the first and second pixel electrodes PE1 and PE2 may be provided in different layers and be formed by different processes. As shown in FIG. 14, a fifth insulating layer INS5 (or another insulating layer) may be provided and/or formed between the first pixel electrode PE1 and the second pixel electrode PE2. The fifth insulating layer INS5 may be provided on the first pixel electrode PE1 to cover the first pixel electrode PE1 (or to allow the first pixel electrode PE1 not to be exposed to the outside), thereby preventing corrosion of the first pixel electrode PE1. The fifth insulating layer INS5 may include an inorganic insulating layer made of an inorganic material or an organic insulating layer made of an organic material. In an example, the fifth insulating layer INS5 may include at least one of silicon nitride ($SiN_x$), silicon oxide ($SiO_x$), silicon oxynitride ($SiO_xN_y$), and metal oxide such as aluminum oxide ($AlO_x$), but the disclosure is not limited thereto. The fifth insulating layer INS5 may be formed as a single layer or a multi-layer.

In an embodiment, in case that electrical connection between a pixel electrode PE and an alignment electrode AL is made in the emission area EMA (e.g., in case that the first pixel electrode PE1 and the first alignment electrode AL1 are electrically connected to each other in the emission area EMA and the second pixel electrode PE2 and the second alignment electrode AL2 are electrically connected to each other in the emission area EMA), a first insulating layer INS located between the first pixel electrode PE1 and the first alignment electrode AL1 and between the second pixel electrode PE2 and the second alignment electrode AL2 may be partially opened in the emission area EMA. The first pixel electrode PE1 and the first alignment electrode AL1 may be electrically and/or physically connected to each other by the first insulating layer INS1 partially opened in the emission area EMA, and the second pixel electrode PE2 and the second alignment electrode AL2 may be electrically and/or physically connected to each other by the first insulating layer INS1.

A third insulating layer INS3 may be provided and/or formed over the first and second pixel electrodes PE1 and PE2.

A color conversion layer CCL including color conversion particles QD may be located on the third insulating layer INS3 in at least the emission area EMA. A barrier layer FL including silicon oxide formed by curing polysilazane may be located on the color conversion layer CCL. A low refractive layer SL may be located on the barrier layer FL. A capping layer TL may be located on the low refractive layer SL. A color filter CF may be located on the capping layer TL to correspond to (or overlap) the color conversion layer CCL in at least the emission area EMA. A fourth insulating layer INS4 may be formed on the color filter CF.

Figure 15:
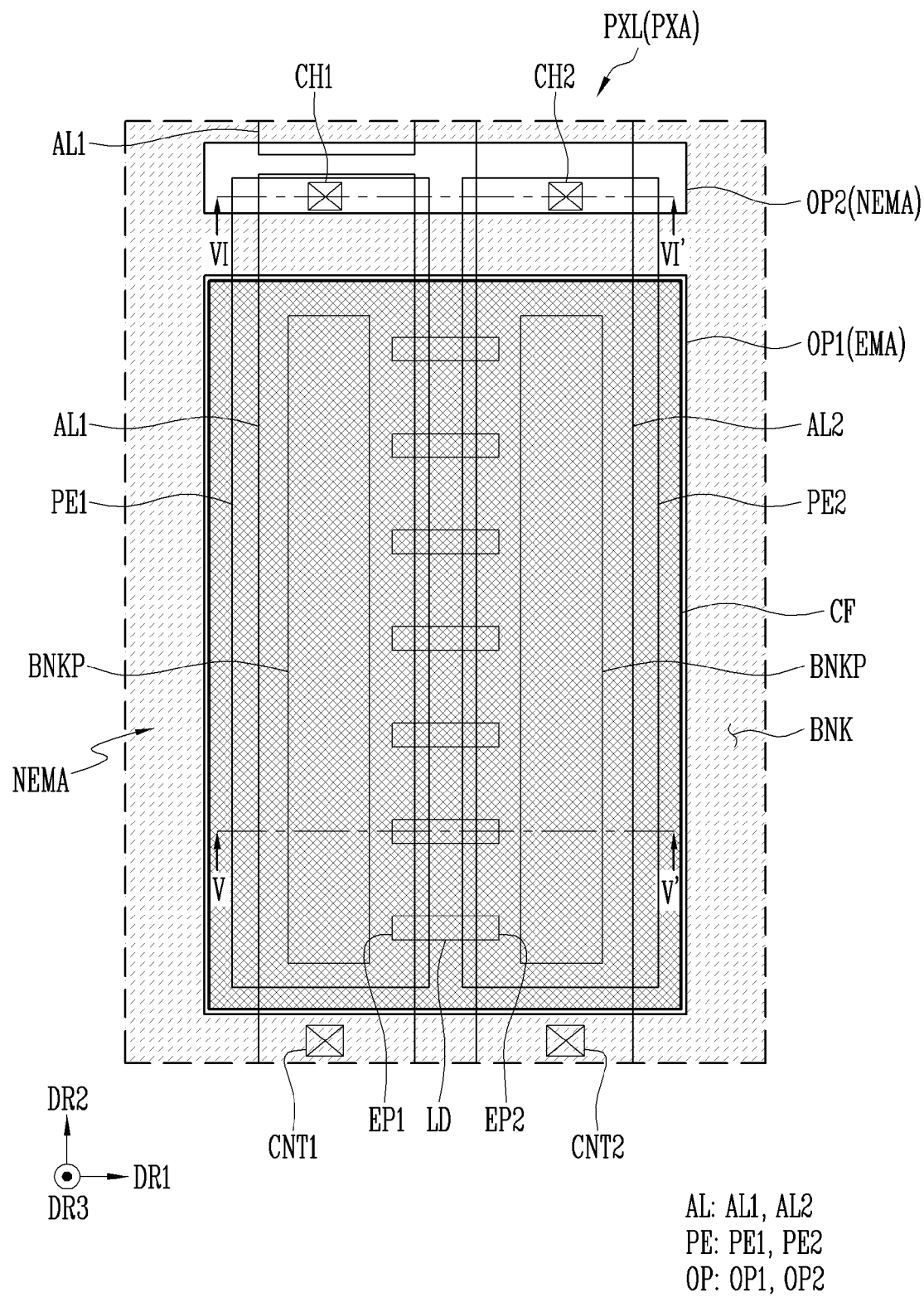
FIG. 15 is a plan view schematically illustrating a pixel in accordance with still another embodiment of the disclosure.
Figure 16:
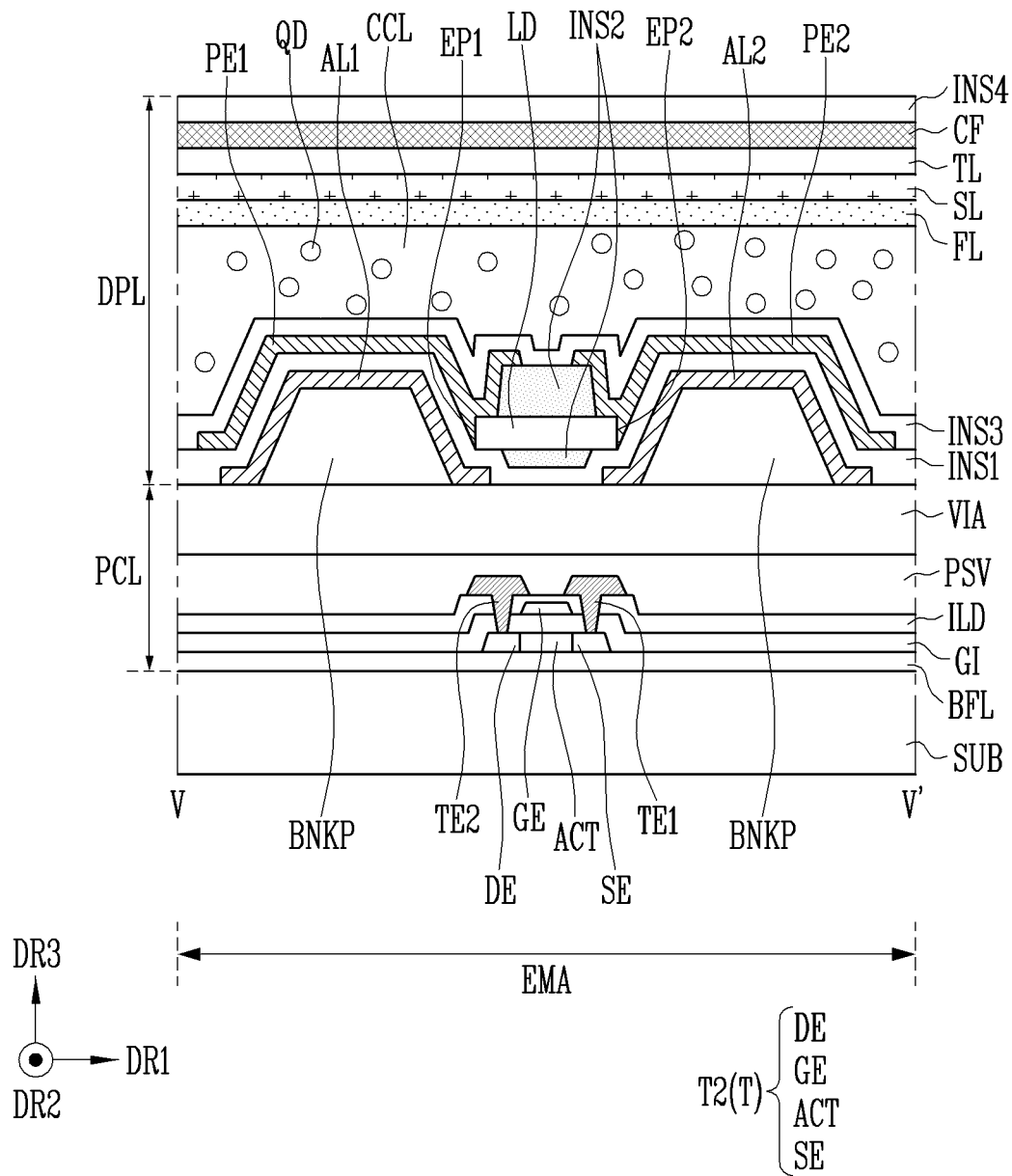
FIG. 16 is a schematic cross-sectional view taken along line V-V' shown in FIG. 15.
Figure 17:
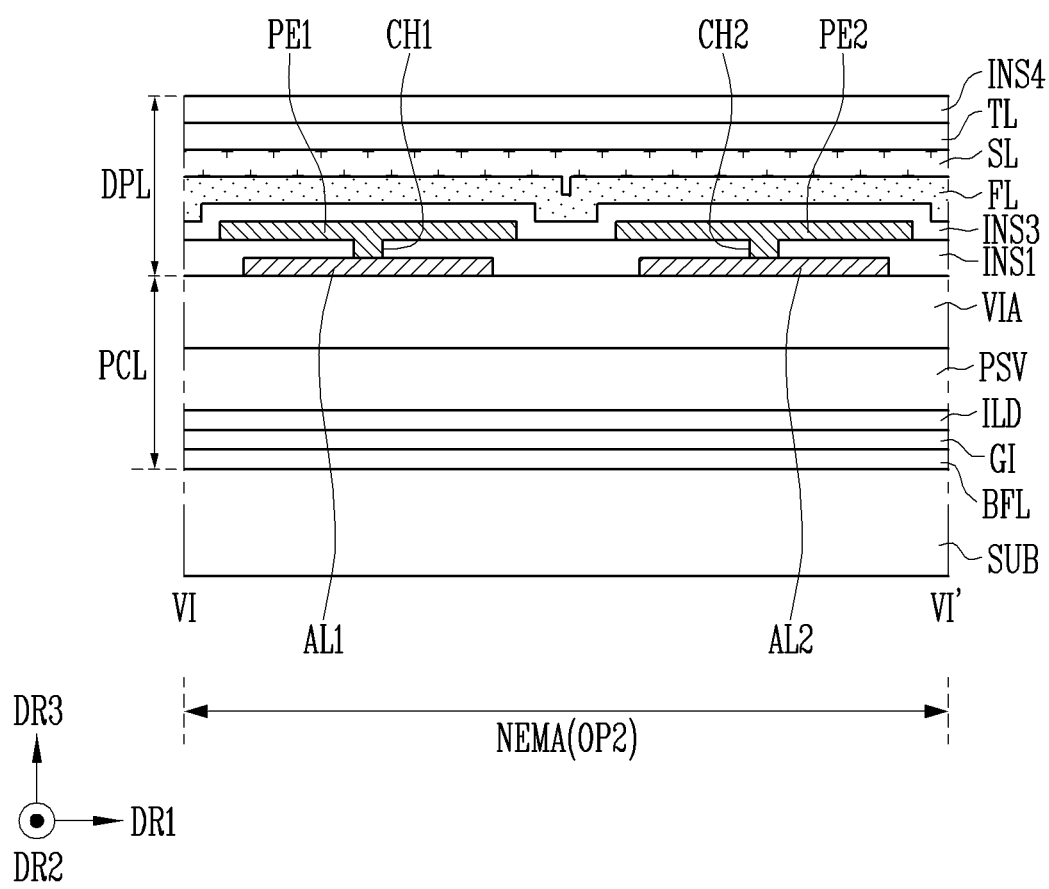
FIG. 17 is a schematic cross-sectional view taken along line VI-VI' shown in FIG. 15.
Figure 18:
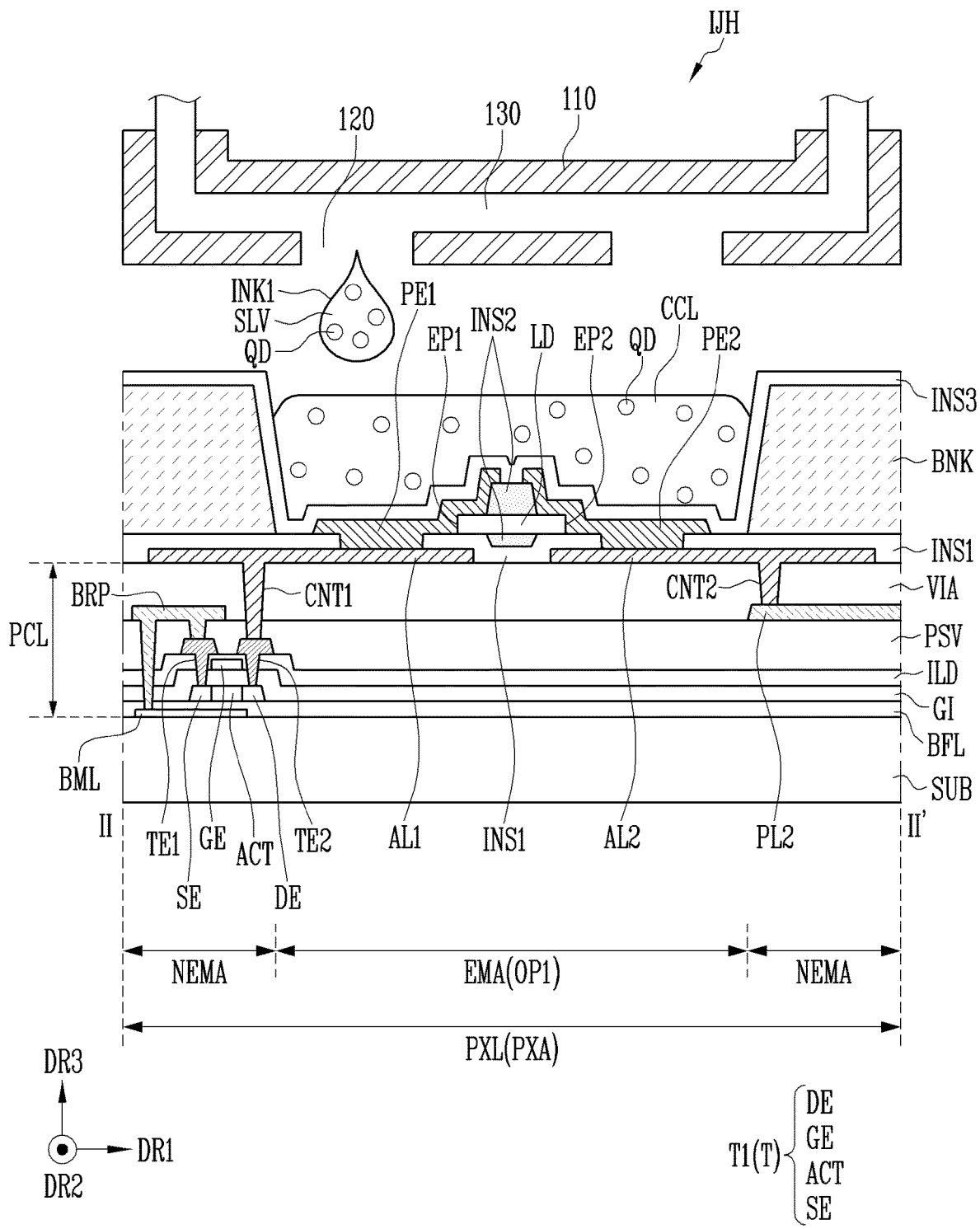
FIGS. 18 to 24 are cross-sectional views schematically illustrating a manufacturing method of a display device in accordance with an embodiment of the disclosure.

FIG. 15 is a plan view schematically illustrating a pixel PXL in accordance with still another embodiment. FIG. 16 is a schematic cross-sectional view taken along line V-V' shown in FIG. 15. FIG. 17 is a schematic cross-sectional view taken along line VI-VI' shown in FIG. 15.

The pixel PXL shown in FIGS. 15 to 17 may have a configuration different from the pixel PXL shown in FIGS. 7 to 10 at least in that electrical connection between a pixel electrode PE and an alignment electrode AL is made in a second opening OP2 of a bank BNK.

Accordingly, in relation to the pixel PXL shown in FIGS. 15 to 17, portions different from those of the above-described embodiment will be mainly described to avoid redundancy.

Referring to FIGS. 15 to 17, the pixel electrode PE and the alignment electrode AL may be electrically connected to each other in a non-emission area NEMA of the pixel PXL. In an example, a first pixel electrode PE1 and a first alignment electrode AL1 may be electrically and/or physically connected to each other through a first contact hole CH1 in a second opening OP2 (or an electrode separation area) of a bank BNK included in the non-emission area NEMA. A second pixel electrode PE2 and a second alignment electrode AL2 may be electrically and/or physically connected to each other through a second contact hole CH2 in the second opening OP2.

The first and second contact holes CH1 and CH2 may be located in the second opening OP2 as the electrode separation area and be formed by removing a portion of at least one insulating layer, which is located between the alignment electrode AL and the pixel electrode PE. In an example, the first contact hole CH1 may be located in the second opening OP2 and be formed by removing a portion of a first insulating layer, which is located between the first alignment electrode AL1 and the first pixel electrode PE1. The first contact hole CH1 may expose an area of the first alignment electrode AL1 in at least the non-emission area NEMA. The second contact hole CH2 may be located in the second opening OP2 and be formed by removing a portion of the first insulating layer INS1, which is located between the second alignment electrode AL2 and the second pixel electrode PE2. The second contact hole CH2 may expose an area of the second alignment electrode AL2 in at least the non-emission area NEMA.

In case that electrical connection between the first pixel electrode PE1 and the first alignment electrode AL1 and electrical connection between the second pixel electrode PE2 and the second alignment electrode AL2 are made in the second opening OP2 as the electrode separation area (e.g., in case that the first pixel electrode PE1 and the first alignment electrode AL1 are electrically connected to each other in the non-emission area NEMA, and the second pixel electrode PE2 and the second alignment electrode AL2 are electrically connected to each other in the non-emission area NEMA), the first insulating layer INS1 located between the first pixel electrode PE1 and the first alignment electrode AL1 and between the second pixel electrode PE2 and the second alignment electrode AL2 may not be opened in at least an emission area EMA as shown in FIG. 16. Accordingly, the first and second alignment electrodes AL1 and AL2 may be completely covered by the first insulating layer INS1 in at least the emission area EMA.

FIGS. 18 to 24 are cross-sectional views schematically illustrating a manufacturing method of a display device in accordance with an embodiment of the disclosure.

In this specification, it is described that some manufacturing steps of the display device are sequentially performed according to the sectional views. However, it will be apparent that each step of the sectional views may be changed without departing from the scope of the disclosure. For example, the order of the steps may be changed, some steps may be omitted, or another step may be further included between the steps.

In relation to FIGS. 18 to 24, portions different from those of the above-described embodiment will be mainly described to avoid redundancy.

Referring to FIGS. 7 to 10 and 18, a first ink INK1 is supplied (or input) onto a third insulating layer INS3 located in an emission area EMA of a pixel PXL defined by a bank BNK through an inkjet printing process. For example, an inkjet head unit (or inkjet head part) IJH may be disposed such that a nozzle 120 is appropriately located above a substrate SUB including a pixel circuit layer PCL, an alignment electrode AL, a first insulating layer INS1, the bank BNK, a light emitting element LD, a second insulating layer INS2, a pixel electrode PE, and the third insulating layer INS3.

The inkjet head part IJH may include a print head 110 and at least one nozzle 120 located at a bottom surface of the print head 110. The print head 110 may have a shape extending in a direction, but the disclosure is not limited thereto. The print head 110 may include an inner tube 130 formed in an extending direction. The nozzle 120 may be connected to the inner tube 130 of the print head 110. The first ink INK1 including a solvent SLV and color conversion particles QD included (or dispersed) in the solvent SLV may be supplied to the inner tube 130. The ink INK1 may flow along the inner tube 130 and then be supplied to the emission area EMA defined by the bank BNK through the nozzle 120. The first ink INK1 may be supplied onto the third insulating layer INS3 located in the emission area EMA through the nozzle 120. For convenience, a case where the first ink INK1 is supplied to the emission area EMA through a nozzle 120 has been illustrated in FIG. 18. However, the disclosure is not limited thereto, and the first ink INK1 may also be supplied to the emission area EMA through a nozzle 120 adjacent to the nozzle 120. An amount of the ink INK1 supplied may be adjusted according to a signal applied to the nozzle 120.

After the first ink INK1 is supplied onto the third insulating layer INS3 in the emission area EMA of the pixel PXL through the nozzle 120, a color conversion layer CCL including color conversion particles QD is formed by curing the first ink INK1. The color conversion layer CCL may be located on the insulating layer INS3 to correspond to light emitting elements LD in at least the emission area EMA.

Referring to FIGS. 7 to 10, 18, and 19, a second ink INK2 is applied onto the color conversion layer CCL and the bank BNK by the inkjet printing process. For example, another inkjet head part IJH' may be disposed such that nozzles 220 are located at a predetermined distance above the bank BNK located in the non-emission area NEMA of the pixel PXL and the color conversion layer CCL located in the emission area EMA of the pixel PXL, thereby applying (or coating) the second ink INK2 onto the bank BNK and the color conversion layer CCL. The inkjet head part IJH' may include a print head 210 and at least one nozzle 220 located at a bottom surface of the print head 210. The nozzle 220 may be electrically connected to an inner tube 230 of the print head 210. The second ink INK2 may be supplied to the inner tube 230. The second ink INK2 may flow along the inner tube 230 and be applied onto the bank BNK and the color conversion layer CCL through the nozzle 220. In an embodiment, the second ink INK2 may be a polysilazane layer PSL including a solvent and polysilazane dispersed in the solvent. The polysilazane may be inorganic polysilazane, and toluene, benzene, tetrahydrofuran, hexane, xylene or the like may be used as the solvent. However, the disclosure is not limited thereto.

The above-described polysilazane layer PSL may be applied (or formed) onto the bank BNK and the color conversion layer CCL by the inkjet printing process. An amount of the second ink INK2 supplied may be adjusted according to a signal applied to the nozzle 220. In some embodiments, the polysilazane layer PSL may be formed on the bank BNK and the color conversion layer CCL by slit coating, spin coating, or the like.

Referring to FIGS. 7 to 10 and 18 to 20, subsequently, a barrier layer FL is formed by curing the polysilazane layer PSL. The polysilazane layer PSL may be cured by various processes including heat-curing (or baking process), steam processing, and the like. Hereinafter, heat-curing of the polysilazane layer PSL will be mainly described.

As the heat-curing is performed by applying heat to the polysilazane layer PSL, the Si—H and Si—N coupling of the polysilazane layer PSL is changed to the Si—O coupling, and therefore, the barrier layer FL made of silicon oxide ($SiO_x$) may be formed. The conversion rate and conversion speed, at which the polysilazane layer PSL is converted into the barrier layer FL, may be changed according to processing conditions (temperature, humidity, etc.).

In case that the polysilazane layer PSL is heat-cured, the heat-curing of the polysilazane layer PSL may be performed by primary heat-curing and secondary heat-curing. The primary heat-curing (or pre-baking) may be performed under a condition of about 100° C. and remove a solvent included in the polysilazane layer PSL. The secondary heat-curing may be performed at a heating temperature of about 180° C. to about 200° C. for a heating time of about 30 minutes. The secondary heat-curing may remove the solvent remaining in the polysilazane layer PSL and increase a curing index at which the Si—H and Si—N coupling of the polysilazane layer PSL is changed to the Si—O coupling.

The barrier layer FL formed on the bank BNK and the color conversion layer CCL by the above-described process may have a thickness of about 50 nm to about 5 μm, but the disclosure is not limited thereto.

Next, referring to FIGS. 7 to 10 and 18 to 21, a third ink INK3 is applied onto the barrier layer FL by the inkjet printing process. For example, still another inkjet head part IJH" may be disposed such that nozzles 320 are located at a predetermined distance above the barrier layer FL formed entirely in a pixel area PXA of the pixel PXL, thereby applying (or coating) the third ink INK3 onto the barrier layer FL. The inkjet head part IJH" may include a print head 310 and at least one nozzle 320 located at a bottom surface of the print head 310. The nozzle 320 may be connected to an inner tube 330 of the print head 310. The third ink INK3 may be supplied to the inner tube 330. The third ink INK3 may flow along the inner tube 330 and then be applied onto the barrier layer FL through the nozzle 320. In an embodiment, the third ink INK32 may include a solid and a solvent. The solid may include resin and hollow silica particles.

The above-described third ink INK3 may be applied onto the barrier layer FL by the inkjet printing process. An amount of the third ink INK3 supplied may be adjusted according to a signal applied to the nozzle 320.

Referring to FIGS. 7 to 10 and 18 to 22, subsequently, a low refractive layer SL is formed by curing the third ink INK3. The low refractive layer SL may be cured by various processes including heat-curing or steam processing, and the like. The low refractive layer SL may be provided entirely on the barrier layer FL throughout the pixel area PXA of the pixel PXL, but the disclosure is not limited thereto. In some embodiments, in case that the third ink INK3 is applied onto only the barrier layer FL located in the emission area EMA of the pixel PXL in the above-described inkjet printing process, the low refractive layer SL may be provided in the emission area EMA to correspond to (or overlap) the color conversion layer CCL.

The low refractive layer SL formed on the barrier layer FL by the above-described process may have a thickness of about 0.1 μm to about 5 μm, but the disclosure is not limited thereto.

Referring to FIGS. 7 to 10 and 18 to 23, a capping layer TL is formed on the low refractive layer SL. In an embodiment, the capping layer TL may be provided entirely on the low refractive layer SL by using chemical vapor deposition (CVD). The capping layer TL may be an inorganic insulating layer including an inorganic material. In an example, the capping layer TL may include at least one of silicon nitride ($SiN_x$), silicon oxide ($SiO_x$), silicon oxynitride ($SiO_xN_y$), and metal oxide such as aluminum oxide ($AlO_x$).

In some embodiments, similar to the barrier layer FL, the capping layer TL may include silicon oxide formed by applying a solvent in which polysilazane is dispersed onto the low refractive layer SL by the inkjet printing process and then curing the applied solvent.

Referring to FIGS. 7 to 10 and 18 to 24, a color filter CF is formed on the capping layer TL. The color filter CF may be formed by a photolithography process using a mask and be formed on the capping layer TL located in an emission area EMA of a pixel PXL to correspond to (or overlap) a color conversion layer CCL of the corresponding pixel PXL.

In the display device formed by the above-described manufacturing method, the color conversion layer CCL, the barrier layer FL, and the low refractive layer SL are formed by the continuous inkjet printing process, so that efficient space arrangement according to the same apparatus is possible. Thus, process time may be reduced, thereby improving product production efficiency. Further, the barrier layer FL including the silicon oxide formed by curing polysilazane is directly disposed on the color conversion layer CCL, so that the color conversion layer CCL may be protected from external moisture, humidity or the like, thereby improving the reliability of the color conversion layer CCL.

Figure 25:
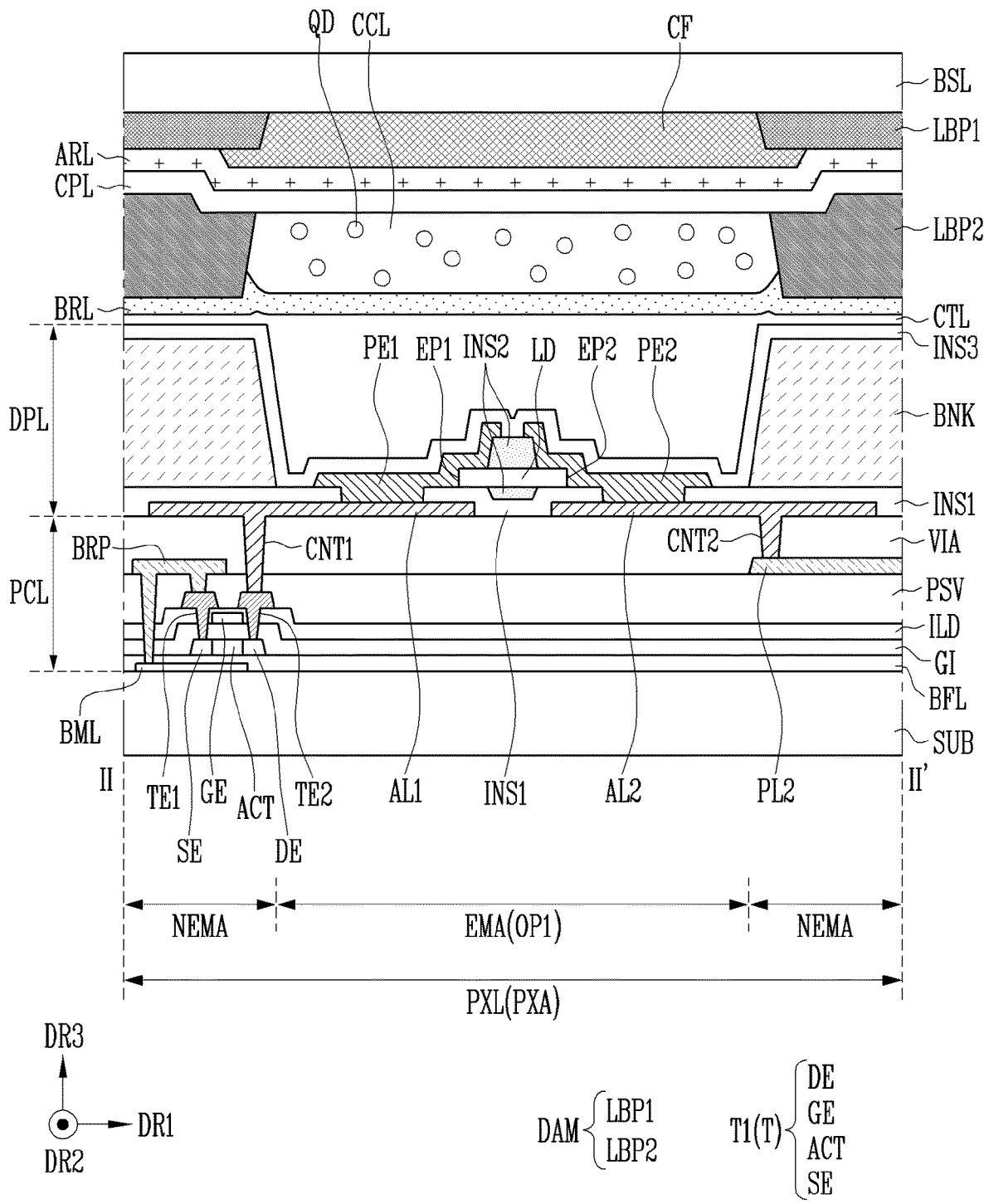
FIG. 25 schematically illustrates a pixel in accordance with an embodiment of the disclosure, and is a cross-sectional view corresponding to the line II-II' shown in FIG. 7.

FIG. 25 schematically illustrates a pixel PXL in accordance with an embodiment, and is a schematic cross-sectional view corresponding to line II-II' shown in FIG. 7.

The pixel PXL shown in FIG. 25 may have a configuration different from the pixel shown in FIG. 8 at least in that an intermediate layer CTL and an upper substrate are disposed on a third insulating layer INS3 of a display element layer DPL. Accordingly, in FIG. 25, portions different from those of the above-described embodiment will be mainly described to avoid redundancy. Portions not particularly described in the embodiment shown in FIG. 25 may follow those of the above-described embodiment. Identical reference numerals refer to identical components, and similar reference numerals refer to similar components.

Referring to FIGS. 7 and 25, the upper substrate may be disposed on the third insulating layer INS3 of the display element layer DPL.

The upper substrate may be provided on the display element layer DPL to cover (or overlap) a display area (see the display area DA shown in FIG. 4) in which the pixel PXL is disposed. The upper substrate may be used as an encapsulation substrate and/or a window member.

The intermediate layer CTL may be provided and/or formed between the upper substrate and the display element layer DPL.

The intermediate layer CTL may be a transparent adhesive layer (or a transparent cohesive layer), e.g., an optically clear adhesive for reinforcing adhesion between the display element layer DPL and the upper substrate, but the disclosure is not limited thereto. In some embodiments, the intermediate layer CTL may be a refractive index conversion layer for converting the refractive index of light which is emitted from the light emitting elements LD and then advances toward the upper substrate, thereby improving the light emission luminance of the pixel PXL.

The upper substrate may include a base layer BSL, a first light blocking pattern LBP1, a color filter CF, a low refractive layer ARL, a capping layer CPL, a second light blocking pattern LBP2, a color conversion layer CCL, and a barrier layer BRL.

The base layer BSL may be a rigid substrate or a flexible substrate, and the material or property of the base layer BSL is not particularly limited. The base layer BSL and the substrate SUB may be made of (or include) the same material or different materials.

The first light blocking pattern LBP1 may be disposed on a surface of the base layer BSL to face the bank BNK. In an example, the first blocking pattern LBP1 may be disposed on the surface of the base layer BSL located in the non-emission area NEMA to correspond to (or overlap) the bank BNK. The first light blocking pattern LBP1 may prevent a light leakage defect in which light (or beam) is leaked between the emission area EMA of the pixel PXL and an emission area of an adjacent pixel (not shown). To this end, the first light blocking pattern LBP1 may include a light blocking material. In an example, the first light blocking pattern LBP1 may be a black matrix pattern made of a light blocking material, etc.

The first light blocking pattern LBP1 may be provided in the form of a multi-layer in which at least two color filters which allow lights of different colors to be selectively transmitted therethrough among a red color filter, a green color filter, and a blue color filter overlap each other. In an example, the first light blocking pattern LBP1 may be provided in a form include a red color filter, a green color filter overlapping the red color filter while being located on the red color filter, and a blue color filter overlapping the green color filter while being located on the green color filter. For example, the first light blocking pattern LBP1 may be provided in the form of a structure in which a red color filter, a green color filter, and a blue color filter are sequentially stacked. The red color filter, the green color filter, and the blue color filter, which are sequentially stacked in the non-emission area NEMA of the corresponding pixel PXL, may be used as the first light blocking pattern LBP1 which blocks transmission of light.

The color filter CF may be disposed on one surface of the base layer BSL to face the light emitting element LD. In an example, the color filter CF may be disposed on the one surface of the base layer BSL located in the emission area EMA to correspond to (or overlap) the light emitting element LD. The color filter CF may allow light of a specific color to be selectively transmitted therethrough.

The low refractive layer ARL may be provided and/or formed on the color filter CF and the first light blocking pattern LBP1. In an embodiment, the low refractive layer ARL and the low refractive layer SL described with reference to FIGS. 8 to 10 may be the same component.

The low refractive layer ARL may be an anti-reflection film for minimizing reflection of light incident onto a display surface of the display device. In an embodiment, the low refractive layer ARL may be formed on the first light blocking pattern LBP1 and the color filter CF by an inkjet printing process.

The capping layer CPL may be provided and/or formed on the low refractive layer ARL. In an embodiment, the capping layer CPL and the capping layer TL described with reference to FIGS. 8 to 10 may be the same component.

The capping layer CPL may entirely cover the low refractive layer ARL and block moisture, humidity, and the like from being introduced into the low refractive layer ARL from the outside, thereby protecting the low refractive layer ARL. The capping layer CPL may include at least one of silicon nitride ($SiN_x$), silicon oxide ($SiO_x$), silicon oxynitride ($SiO_xN_y$), and metal oxide such as aluminum oxide ($AlO_x$). In an example, the capping layer CPL may include silicon oxide formed on the low refractive layer ARL by using chemical vapor deposition (CVD). In some embodiments, the capping layer CPL may include silicon oxide formed by applying a solvent in which polysilazane is dispersed onto the low refractive layer ARL by the inkjet printing process and then curing the applied solvent.

The second light blocking pattern LBP2 may be provided and/or formed on the capping layer CPL.

The second light blocking pattern LBP2 may be provided on the capping layer CPL of the non-emission area NEMA to correspond to the first light blocking pattern LBP1. The second light blocking pattern LBP2 may overlap the bank BNK of the display element layer DPL. The second light blocking pattern LBP2 along with the first light blocking pattern LBP1 may constitute a dam part DAM. An area surround by the dam part DAM may correspond to the first opening OP1 of the bank BNK and correspond to the emission area EMA of the pixel PXL. The dam part DAM may be a structure finally defining the emission area EMA of the pixel PXL. In an embodiment, the dam part DAM may be a structure finally defining the emission area EMA in which the color conversion layer CCL including color conversion particles QD is to be supplied in a process of supplying the color conversion layer CCL. In an example, the emission area EMA of the pixel PXL is finally partitioned by the dam part DAM, so that a desired amount and/or a desired kind of color conversion layer CCL may be supplied (or input) to the emission area EMA.

The second light blocking pattern LBP2 may include a light blocking material, and the second light blocking pattern LBP2 and the first light blocking pattern LBP1 may be made of the same material. In an example, the second light blocking pattern LBP2 may be a black matrix pattern.

The color conversion layer CCL may be supplied in the emission area EMA of the pixel PXL, which is defined by the dam part DAM. In an embodiment, the color conversion layer CCL may be provided on the capping layer CPL located in the emission area EMA to correspond to (overlap) the color filter CF and the light emitting element LD of the display element layer DPL. The color conversion layer CCL may be supplied (or input) in a form in which the color conversion layer CCL fills the emission area EMA surrounded by the dam part DAM by the inkjet printing process. The color conversion layer CCL may include color conversion particles QD.

The barrier layer BRL may be provided and/or formed on the color conversion layer CCL and the second light blocking pattern LBP2. In an embodiment, the barrier layer BRL and the barrier layer FL described with reference to FIGS. 8 to 10 may be the same component.

The barrier layer BRL may include silicon oxide ($SiO_x$). In an example, the barrier layer BRL made of the silicon oxide may be formed by applying (or coating) a solvent in which polysilazane is dispersed onto the color conversion layer CCL and then curing the applied solvent.

As described above, the barrier layer BRL formed by curing the polysilazane is directly located on the color conversion layer CCL, so that the color conversion layer CCL may be protected from external moisture humidity, and the like, thereby further improving the reliability of the color conversion layer CCL.

Figure 26:
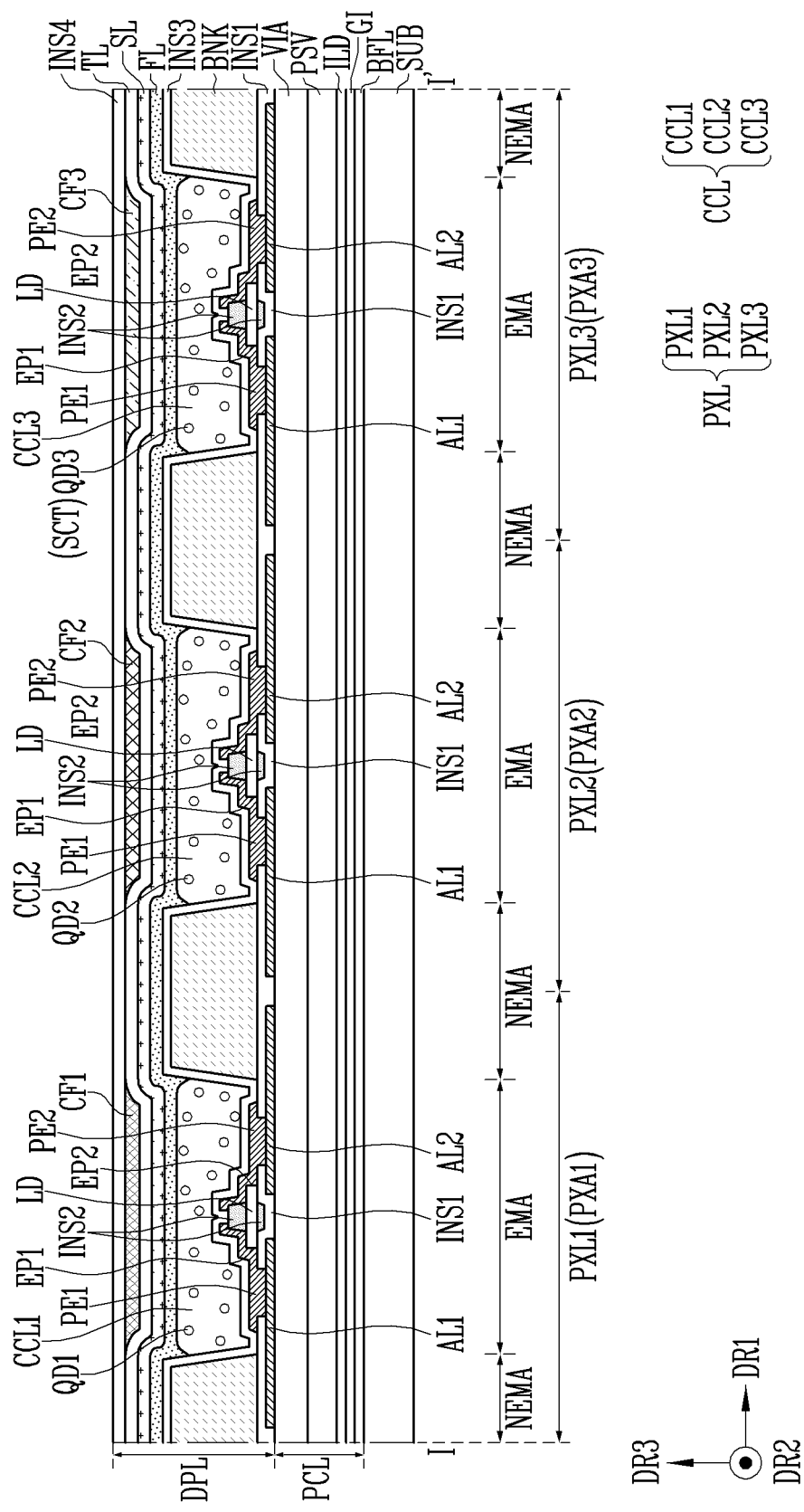
FIGS. 26 and 27 are schematic cross-sectional views taken along line I-I' shown in FIG. 4.
Figure 27:
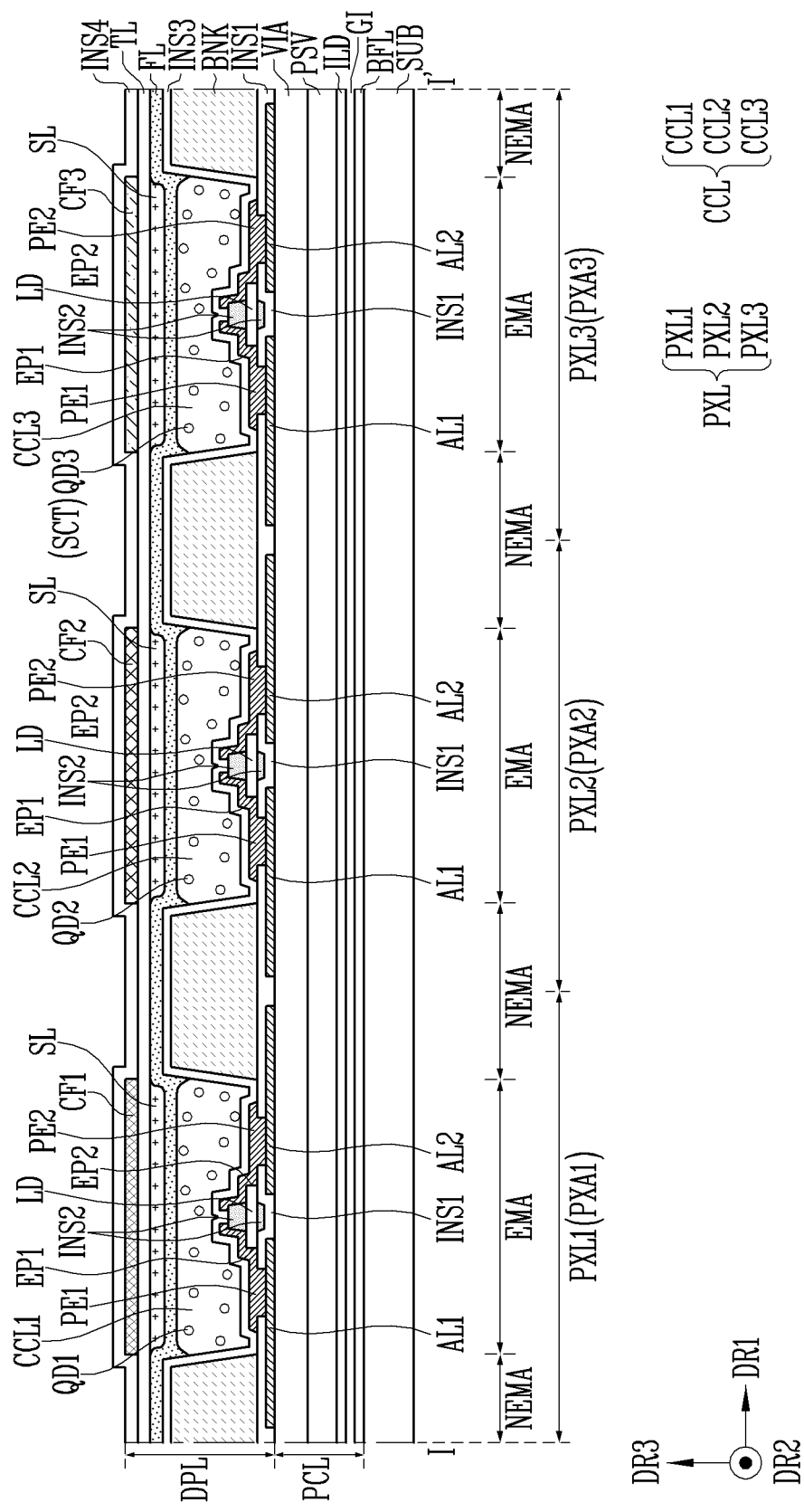

FIGS. 26 and 27 are schematic cross-sectional views taken along line I-I' shown in FIG. 4.

In relation to first to third pixels PXL1 to PXL3 shown in FIGS. 26 and 27, differences from the above-described embodiment will be described to avoid redundancy. Components not particularly described in the disclosure follow those of the above-described embodiment. Identical reference numerals refer to identical components, and similar reference numerals refer to similar components.

For convenience, only a partial configuration of each of the first to third pixels PXL1 to PXL3 is illustrated in FIGS. 26 and 27.

Referring to FIGS. 4, 26, and 27, the first pixel PXL1 (or first sub-pixel), the second pixel PXL2 (or second sub-pixel), and the third pixel PXL3 (or third sub-pixel) may be arranged in the first direction DR1. Each of the first to third pixels PXL1, PXL2, and PXL3 may be the same component as the pixel PXL described with reference to FIGS. 7 and 8.

The display area DA of the substrate SUB may include a first pixel area PXA1 in which the first pixel PXL1 is provided (or arranged), a second pixel area PXA2 in which the second pixel PXL2 is provided (or arranged), and a third pixel area PXA3 in which the third pixel PXL3 is provided (or arranged). In an embodiment, the first pixel PXL1 may be a red pixel, the second pixel PXL2 may be a green pixel, and the third pixel PXL3 may be a blue pixel. However, the disclosure is not limited thereto. In some embodiments, the second pixel PXL2 may be a red pixel, the first pixel PXL1 may be a green pixel, and the third pixel PXL3 may be a blue pixel. In other embodiments, the third pixel PXL3 may be a red pixel, the first pixel PXL1 may be a green pixel, and the second pixel PXL2 may be a blue pixel.

Each of the first, second, and third pixels PXL1, PXL2, and PXL3 may include an emission area EMA. Each of the first, second, and third pixels PXL1, PXL2, and PXL3 may include a non-emission area NEMA adjacent to the emission area EMA of the corresponding pixel PXL. A bank BNK may be located in the non-emission area NEMA.

Each of the first, second, and third pixels PXL1, PXL2, and PXL3 may include the substrate SUB, a pixel circuit layer PCL, and a display element layer DPL.

A display element layer DPL of the first pixel PXL1 may include first and second alignment electrodes AL1 and AL2, a bank BNK, a light emitting element LD, first and second pixel electrodes PE1 and PE2, and first, second, third, and fourth insulating layers INS1, INS2, INS3, and INS4. The display element layer DPL of the first pixel PXL1 may include a first color conversion layer CCL1, a barrier layer FL, a low refractive layer SL, a capping layer TL, and a first color filter CF1.

In an embodiment, the first color conversion layer CCL1 may be supplied (or input) to the emission area EMA of the first pixel PXL1, which is defined by the bank BNK, by an inkjet printing process. The first color conversion layer CCL1 may include first color conversion particles QD1 for converting light emitted from the light emitting element LD into light of red. In an example, the first color conversion particles QD1 may be red quantum dots.

The first color filter CF1 may be a red color filter.

A display element layer DPL of the second pixel PXL2 may include first and second alignment electrodes AL1 and AL2, a bank BNK, a light emitting element LD, first and second pixel electrodes PE1 and PE2, and first, second, third, and fourth insulating layers INS1, INS2, INS3, and INS4. The display element layer DPL of the second pixel PXL2 may include a second color conversion layer CCL2, a barrier layer FL, a low refractive layer SL, a capping layer TL, and a second color filter CF2.

In an embodiment, the second color conversion layer CCL2 may be supplied (or input) to the emission area EMA of the second pixel PXL2, which is defined by the bank BNK, by the inkjet printing process. The second color conversion layer CCL2 may include second color conversion particles QD2 for converting light emitted from the light emitting element LD into light of green. In an example, the second color conversion particles QD2 may be green quantum dots.

The second color filter CF2 may be a green color filter.

A display element layer DPL of the third pixel PXL3 may include first and second alignment electrodes AL1 and AL2, a bank BNK, a light emitting element LD, first and second pixel electrodes PE1 and PE2, and first, second, third, and fourth insulating layers INS1, INS2, INS3, and INS4. The display element layer DPL of the third pixel PXL3 may include a third color conversion layer CCL3, a barrier layer FL, a low refractive layer SL, a capping layer TL, and a third color filter CF3.

In an embodiment, the third color conversion layer CCL3 may be supplied (or input) to the emission area EMA of the third pixel PXL3, which is defined by the bank BNK, by the inkjet printing process. The third color conversion layer CCL3 may include third color conversion particles QD3 for converting light emitted from the light emitting element LD into light of blue. In an example, the third color conversion particles QD3 may be blue quantum dots. In some embodiments, the third pixel PXL3 may include a light scattering layer including light scattering particles SCT, in replacement of the third color conversion layer CCL3 including the third color conversion particles QD3.

The third color filter CF3 may be a blue color filter.

A barrier layer FL of each of the first, second, and third pixels PXL1, PXL2, and PXL3 may be located on a color conversion layer CCL and a bank BNK of the corresponding pixel PXL. In an embodiment, the barrier layer FL may be commonly provided in the first, second, and third pixels PXL1, PXL2, and PXL3. For example, the barrier layer FL may be a common layer (film) provided in adjacent pixels PXL. In an embodiment, the barrier layer FL may include silicon oxide. In an example, the barrier layer FL made of the silicon oxide may be formed by applying a solvent in which polysilazane is dispersed onto the first to third color conversion layers CCL1, CCL2, and CCL3 and the bank BNK by an inkjet printing process and then curing the applied solvent. As the barrier layer FL formed by curing polysilazane is directly disposed on a color conversion layer CCL of each of the first, second, and third pixels PXL1, PXL2, and PXL3, the barrier layer FL protects the color conversion layer CCL of the corresponding pixel PXL from external moisture, humidity, and the like, thereby improving the reliability of the color conversion layer CCL.

A low refractive layer SL of each of the first, second, and third pixels PXL1, PXL2, and PXL3 may be provided entirely on the barrier layer FL. In an embodiment, the low refractive layer SL may be commonly provided in the first, second, and third pixels PXL1, PXL2, and PXL3. For example, the low refractive layer SL may be a common layer (film) provided in adjacent pixels PXL. The low refractive layer SL may change a path of lost light among lights emitted from each of the first, second, and third color conversion layers CCL1, CCL2, and CCL3 in the front direction (or the image display direction of the display direction), using a refractive index difference, thereby improving the luminance of light emitting in the front direction. The low refractive layer SL may be coated on the barrier layer FL by the inkjet printing process.

The refractive layer SL may be located in only a partial area of each of the first, second, and third pixel areas PXA1, PXA2, and PXA3. In an example, as shown in FIG. 27, the low refractive layer SL may be located on only each of the barrier layer FL located in the emission area EMA of the first pixel PXL1, the barrier layer FL located in the emission area EMA of the second pixel PXL2, and the barrier layer FL located in the emission area EMA of the third pixel PXL3. The low refractive layer SL of the first pixel PXL1 may be used as a step difference compensation part for compensating for a step difference (or height difference) between the first color conversion layer CCL1 and the bank BNK, the low refractive layer SL of the second pixel PXL2 may be used as a step difference compensation part for compensating for a step difference (or height difference) between the second color conversion layer CCL2 and the bank BNK, and the low refractive layer SL of the third pixel PXL3 may be used as a step difference compensation part for compensating for a step difference (or height difference) between the third color conversion layer CCL3 and the bank BNK. As described above, in case that the low refractive layer SL is disposed in only the emission area EMA of each of the first, second, and third pixels PXL1, PXL2, and PXL3, an amount of the low refractive layer SL used is reduced, and thus the manufacturing cost of the display device may be reduced.

A capping layer TL of each of the first, second, and third pixels PXL1, PXL2, and PXL3 may be provided entirely on the low refractive layer SL. In an embodiment, the capping layer TL may be commonly provided in the first, second, and third pixels PXL1, PXL2, and PXL3. For example, the capping layer TL may be a common layer (film) provided in adjacent pixels PXL. The capping layer TL may include at least one of silicon nitride ($SiN_x$), silicon oxide ($SiO_x$), silicon oxynitride ($SiO_xN_y$), and metal oxide such as aluminum oxide ($AlO_x$).

In the above-described embodiment, each of the first, second, and third color conversion layers CCL1, CCL2, and CCL3 is formed above the light emitting element LD in the emission area EMA of a corresponding pixel PXL by the inkjet printing process, the barrier layer FL is formed on the color conversion layer CCL and the bank BNK of a corresponding pixel PXL by the inkjet printing process, and the low refractive layer SL is formed on the barrier layer FL by the inkjet printing process. Accordingly, the color conversion layer CCL, the barrier layer FL, and the low refractive layer SL of a corresponding pixel PXL are formed in the same apparatus by the continuous inkjet printing process, so that product production time may be reduced, thereby improving product production efficiency.

Further, in the above-described embodiment, the barrier layer FL including the silicon oxide formed by curing polysilazane is directly disposed on the color conversion layer CCL of each of the first, second, and third pixels PXL1, PXL2, and PXL3, so that the color conversion layer CCL may be protected from external moisture, humidity or the like, thereby improving the reliability of the color conversion layer CCL.

In accordance with the disclosure, a barrier layer including silicon oxide formed by curing polysilazane is directly disposed on a color conversion layer, thereby blocking external moisture, humidity and the like from being introduced into a color conversion layer. Accordingly, the reliability of the color conversion layer may be improved.

In accordance with the disclosure, there may be provided a display device and a manufacturing method thereof, in which a color conversion layer, a barrier layer, and a low refractive layer are formed by a continuous inkjet printing process, thereby improving product production efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the scope of the disclosure.

What is claimed is:

1. A display device comprising:
   a substrate including a display area and a non-display area; and
   a plurality of pixels disposed in the display area, the plurality of pixels each including an emission area and a non-emission area, wherein
   each of the plurality of pixels includes:
   at least one light emitting element located in the emission area;
   a first pixel electrode and a second pixel electrode located in at least the emission area, the first pixel electrode and the second pixel electrode being electrically connected to the at least one light emitting element;
   a bank disposed in the non-emission area, the bank including a first opening corresponding to the emission area;
   a color conversion layer located above the at least one light emitting element, the color conversion layer being disposed in the emission area to correspond to the at least one light emitting element, the color conversion layer including color conversion particles;

a barrier layer disposed on the bank and the color conversion layer; and a low refractive layer disposed on the barrier layer, and the barrier layer includes silicon oxide ($SiO_x$) having cured polysilazane.

2. The display device of claim 1, wherein the barrier layer is disposed directly on the color conversion layer in the emission area, the low refractive layer is disposed directly on the barrier layer on the color conversion layer in the emission area, and the color conversion layer, the barrier layer, and the low refractive layer are sequentially disposed in the emission area.

3. The display device of claim 2, wherein the low refractive layer is disposed on an entire side of the barrier layer in the emission area and the non-emission area.

4. The display device of claim 2, wherein the low refractive layer is disposed on the barrier layer of the emission area to correspond to the color conversion layer.

5. The display device of claim 4, wherein the low refractive layer compensates for a height difference between the bank and the color conversion layer.

6. The display device of claim 2, wherein each of the plurality of pixels further includes:
a capping layer disposed on an entire side of the low refractive layer, and
the capping layer and the barrier layer include a same material.

7. The display device of claim 6, wherein the capping layer overlaps the low refractive layer and protects the low refractive layer.

8. The display device of claim 6, further comprising:
a color filter disposed on the capping layer in the emission area to correspond to the color conversion layer.

9. The display device of claim 6, wherein each of the barrier layer, the low refractive layer, and the capping layer is a common layer disposed in the plurality of pixels.

10. The display device of claim 2, wherein each of the plurality of pixels further includes:
a pixel circuit layer located between the substrate and the at least one light emitting element, the pixel circuit layer including:
at least one transistor; and
at least one power line, wherein the at least one transistor and the at least one power line are electrically connected to the at least one light emitting element;
a first electrode disposed on the pixel circuit layer, the first electrode being electrically connected to the at least one transistor;
a second electrode disposed on the pixel circuit layer and spaced from the first electrode, the second electrode being electrically connected to the at least one power line; and
an insulating layer disposed on the first and second electrodes, the insulating layer including at least one opened portion.

11. The display device of claim 10, wherein the first electrode is electrically connected to the first pixel electrode through an opened portion of the insulating layer, and the second electrode is electrically connected to the second pixel electrode through another opened portion of the insulating layer.

12. The display device of claim 11, wherein the bank includes a second opening spaced from the first opening, and at least one of the first and second electrodes includes an opened portion in the second opening.

13. The display device of claim 12, wherein the opened portion of the insulating layer and the another opened portion of the insulating layer are located in the second opening.

14. A display device comprising:
a substrate including a display area and a non-display area; and
a plurality of pixels disposed in the display area, the plurality of pixels each including an emission area and a non-emission area,
each of the plurality of pixels includes:
at least one light emitting element located in the emission area;
a first pixel electrode and a second pixel electrode located in at least the emission area, the first pixel electrode and the second pixel electrode being electrically connected to the at least one light emitting element;
a bank disposed in the non-emission area, the bank including an opening corresponding to the emission area;
a base layer located above the bank and the at least one light emitting element such that a surface of the base layer faces the substrate;
a color filter disposed on the surface of the base layer to correspond to the emission area;
a first light blocking pattern disposed on the surface of the base layer to correspond to the non-emission area;
a low refractive layer entirely disposed on the first light blocking pattern and the color filter;
a capping layer disposed on the low refractive layer;
a second light blocking pattern disposed on the capping layer to correspond to the first light blocking pattern;
a color conversion layer surrounded by the second light blocking pattern, the color conversion layer being disposed on the capping layer to correspond to the at least one light emitting element; and
a barrier layer entirely disposed on the color conversion layer and the second light blocking pattern, and
wherein the barrier layer includes silicon oxide ($SiO_x$) formed having cured polysilazane.

15. The display device of claim 14, wherein the first and second light blocking patterns correspond to the bank.

16. A method of manufacturing a display device, the method comprising:
providing a substrate having at least one light emitting element disposed in an emission area and a bank including an opening corresponding to the emission area, the bank being disposed in a non-emission area;
forming a color conversion layer including color conversion particles above the at least one light emitting element;
forming a polysilazane layer on the color conversion layer and the bank;
forming a barrier layer by curing the polysilazane layer;
forming a low refractive layer on the barrier layer; and
forming a capping layer on the low refractive layer.

17. The method of claim 16, wherein the color conversion layer, the barrier layer, and the low refractive layer are formed by continuous inkjet printing.

18. The method of claim 17, wherein the barrier layer includes silicon oxide ($SiO_x$).

19. The method of claim 17, further comprising forming a color filter on the capping layer to correspond to the color conversion layer.

20. The method of claim 17, wherein the curing of the polysilazane layer is performed by heat-curing.

* * * * *